(12) United States Patent
Takizawa

(10) Patent No.: US 8,101,999 B2
(45) Date of Patent: Jan. 24, 2012

(54) SOI SUBSTRATE AND METHOD FOR PRODUCING THE SAME, SOLID-STATE IMAGE PICKUP DEVICE AND METHOD FOR PRODUCING THE SAME, AND IMAGE PICKUP APPARATUS

(75) Inventor: Ritsuo Takizawa, Tokyo (JP)

(73) Assignee: Sony Corporation, Tokyo (JP)

( * ) Notice: Subject to any disclaimer, the term of this patent is extended or adjusted under 35 U.S.C. 154(b) by 128 days.

(21) Appl. No.: 12/574,016

(22) Filed: Oct. 6, 2009

(65) Prior Publication Data

US 2010/0090303 A1    Apr. 15, 2010

(30) Foreign Application Priority Data

Oct. 10, 2008  (JP) .................................. 2008-263559
Mar. 16, 2009  (JP) .................................. 2009-062397

(51) Int. Cl.
 *H01L 27/12* (2006.01)
(52) U.S. Cl. ................ 257/347; 257/432; 257/E21.318; 257/E29.106; 438/70; 438/458; 438/471
(58) Field of Classification Search .................... 438/70, 438/458, 471; 257/347, 432, 617, E29.106, 257/E21.318, E21.568, E31.127
See application file for complete search history.

(56) References Cited

U.S. PATENT DOCUMENTS

| | | | | |
|---|---|---|---|---|
| 4,786,608 A | * | 11/1988 | Griffith | 438/766 |
| 5,066,993 A | * | 11/1991 | Miura et al. | 257/347 |
| 5,198,371 A | * | 3/1993 | Li | 438/475 |
| 5,245,203 A | * | 9/1993 | Morishita et al. | 257/113 |
| 5,466,926 A | * | 11/1995 | Sasano et al. | 250/216 |
| 5,481,124 A | * | 1/1996 | Kozuka et al. | 257/185 |
| 5,646,053 A | * | 7/1997 | Schepis et al. | 438/402 |
| 5,767,548 A | * | 6/1998 | Wondrak et al. | 257/347 |
| 5,773,152 A | * | 6/1998 | Okonogi | 428/446 |
| 5,854,123 A | * | 12/1998 | Sato et al. | 438/507 |
| 5,882,987 A | * | 3/1999 | Srikrishnan | 438/458 |
| 6,046,095 A | * | 4/2000 | Horikawa | 438/471 |
| 6,057,036 A | * | 5/2000 | Okonogi | 428/426 |
| 6,120,597 A | * | 9/2000 | Levy et al. | 117/3 |
| 6,191,007 B1 | * | 2/2001 | Matsui et al. | 438/459 |
| 6,300,680 B1 | * | 10/2001 | Horikawa et al. | 257/751 |
| 6,310,376 B1 | * | 10/2001 | Ueda et al. | 257/315 |
| 6,376,336 B1 | * | 4/2002 | Buynoski | 438/476 |
| 6,391,799 B1 | * | 5/2002 | Di Cioccio | 438/781 |
| 6,500,732 B1 | * | 12/2002 | Henley et al. | 438/459 |
| 6,509,613 B1 | * | 1/2003 | En et al. | 257/349 |
| 6,534,380 B1 | * | 3/2003 | Yamauchi et al. | 438/455 |
| 6,596,570 B2 | * | 7/2003 | Furukawa | 438/162 |
| 6,597,039 B2 | * | 7/2003 | Ohmi et al. | 257/347 |
| 6,602,761 B2 | * | 8/2003 | Fukunaga | 438/459 |
| 6,686,259 B2 | * | 2/2004 | Park et al. | 438/471 |

(Continued)

FOREIGN PATENT DOCUMENTS

JP      2002124667    *  4/2002

(Continued)

*Primary Examiner* — N Drew Richards
*Assistant Examiner* — Ankush Singal
(74) *Attorney, Agent, or Firm* — SNR Denton US LLP

(57) ABSTRACT

A SOI substrate includes a silicon substrate, a silicon oxide layer arranged on the silicon substrate, a silicon layer arranged on the silicon oxide layer, a gettering layer arranged in the silicon substrate, and a damaged layer formed of an impurity-doped region arranged in the silicon oxide layer.

12 Claims, 30 Drawing Sheets

U.S. PATENT DOCUMENTS

| | | | |
|---|---|---|---|
| 6,872,640 B1* | 3/2005 | Mouli | 438/514 |
| 6,890,838 B2* | 5/2005 | Henley et al. | 438/475 |
| 6,930,394 B2* | 8/2005 | Yuasa et al. | 257/760 |
| 6,958,282 B1* | 10/2005 | Huttner et al. | 438/407 |
| 6,998,353 B2* | 2/2006 | Erokhin et al. | 438/766 |
| 7,056,808 B2* | 6/2006 | Henley et al. | 438/458 |
| 7,105,830 B2* | 9/2006 | Nagano et al. | 250/370.11 |
| 7,105,895 B2* | 9/2006 | Wang et al. | 257/347 |
| 7,202,124 B2* | 4/2007 | Fitzgerald et al. | 438/200 |
| 7,294,561 B2* | 11/2007 | Erokhin et al. | 438/473 |
| 7,494,901 B2* | 2/2009 | Mouli | 438/479 |
| 7,521,335 B2* | 4/2009 | Yamanaka | 438/458 |
| 7,537,989 B2* | 5/2009 | Nakai et al. | 438/218 |
| 7,566,600 B2* | 7/2009 | Mouli | 438/154 |
| 7,718,231 B2* | 5/2010 | Choe et al. | 427/526 |
| 7,763,502 B2* | 7/2010 | Kakehata et al. | 438/149 |
| 7,859,073 B2* | 12/2010 | Matsuo et al. | 257/434 |
| 7,879,638 B2* | 2/2011 | Brady | 438/66 |
| 7,884,000 B2* | 2/2011 | Aoki et al. | 438/528 |
| 7,898,051 B2* | 3/2011 | Uya | 257/438 |
| 7,902,041 B2* | 3/2011 | Yamazaki et al. | 438/455 |
| 2002/0177260 A1* | 11/2002 | Matsumoto | 438/154 |
| 2002/0187619 A1* | 12/2002 | Kleinhenz et al. | 438/471 |
| 2003/0109114 A1* | 6/2003 | Niwa | 438/431 |
| 2003/0139022 A1* | 7/2003 | Malone | 438/476 |
| 2003/0173566 A1* | 9/2003 | Nakazawa et al. | 257/66 |
| 2003/0207545 A1* | 11/2003 | Yasukawa | 438/459 |
| 2004/0212000 A1* | 10/2004 | Matsui et al. | 257/296 |
| 2004/0224477 A1* | 11/2004 | Erokhin et al. | 438/407 |
| 2004/0229443 A1* | 11/2004 | Bower | 438/455 |
| 2004/0259327 A1* | 12/2004 | Mitani | 438/458 |
| 2005/0037596 A1* | 2/2005 | Erokhin et al. | 438/471 |
| 2005/0287723 A1* | 12/2005 | Mouli | 438/149 |
| 2006/0003562 A1* | 1/2006 | Mouli | 438/528 |
| 2006/0049476 A1* | 3/2006 | Koizumi et al. | 257/432 |
| 2006/0118868 A1* | 6/2006 | Yoshimura et al. | 257/347 |
| 2006/0197007 A1* | 9/2006 | Iwabuchi et al. | 250/208.1 |
| 2007/0026637 A1* | 2/2007 | Endo et al. | 438/459 |
| 2007/0066035 A1* | 3/2007 | Droes et al. | 438/473 |
| 2007/0184611 A1* | 8/2007 | Oh et al. | 438/244 |
| 2008/0200010 A1* | 8/2008 | Endo et al. | 438/458 |
| 2008/0203452 A1* | 8/2008 | Moon et al. | 257/292 |
| 2008/0206963 A1* | 8/2008 | Henley et al. | 438/460 |
| 2008/0296724 A1* | 12/2008 | Yamazaki et al. | 257/506 |
| 2008/0303108 A1* | 12/2008 | Kasano et al. | 257/432 |
| 2008/0303112 A1* | 12/2008 | Uya | 257/438 |
| 2008/0315351 A1* | 12/2008 | Kakehata | 257/507 |
| 2009/0020690 A1* | 1/2009 | Toda | 250/227.2 |
| 2009/0057803 A1* | 3/2009 | Kanbe | 257/443 |
| 2009/0102026 A1* | 4/2009 | Lee et al. | 257/635 |
| 2010/0038686 A1* | 2/2010 | Maitra et al. | 257/288 |
| 2011/0053305 A1* | 3/2011 | Kanbe | 438/58 |

FOREIGN PATENT DOCUMENTS

| | | |
|---|---|---|
| JP | 2004-134672 | 4/2004 |
| JP | 2007-318102 | 12/2007 |

* cited by examiner

HYDROGEN-ION IMPLANTATION

CARBON-ION IMPLANTATION

CARBON-ION IMPLANTATION

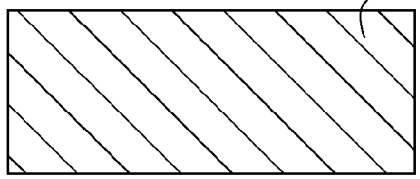
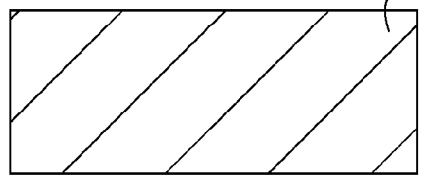
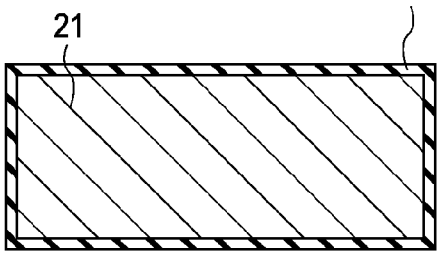
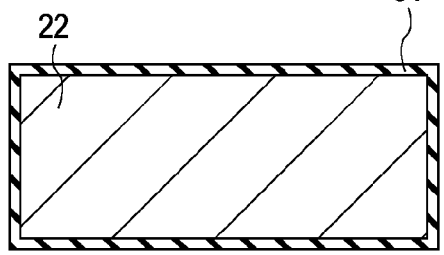
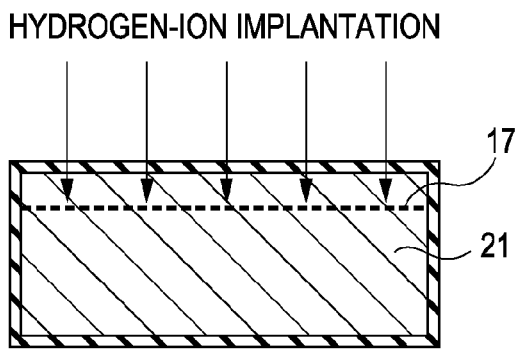
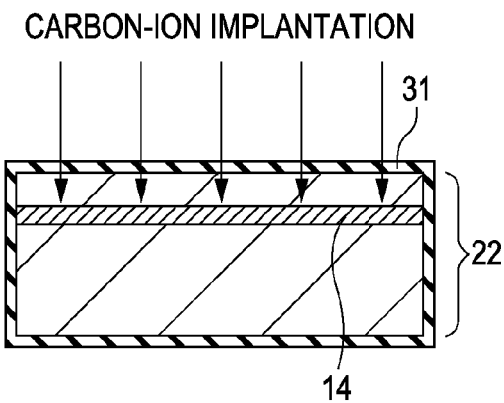
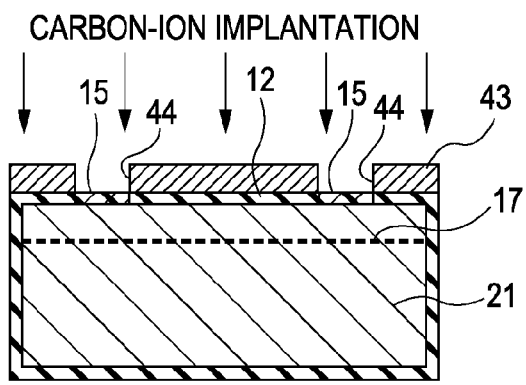
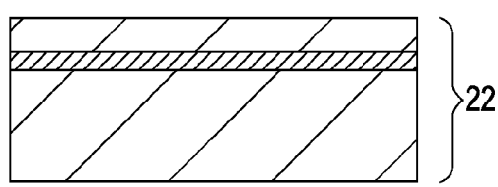

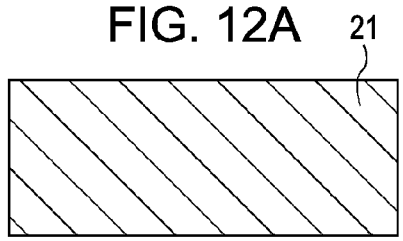
FIG. 12A
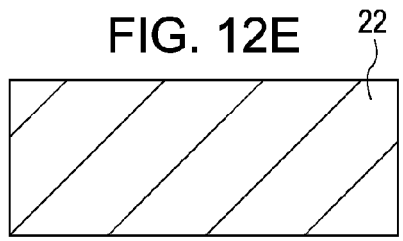
FIG. 12E
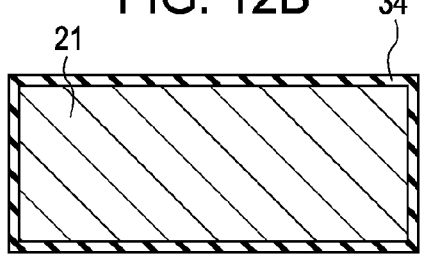
FIG. 12B
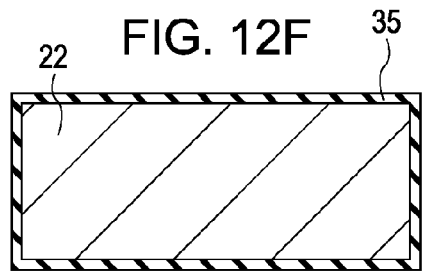
FIG. 12F
FIG. 12C
HYDROGEN-ION IMPLANTATION
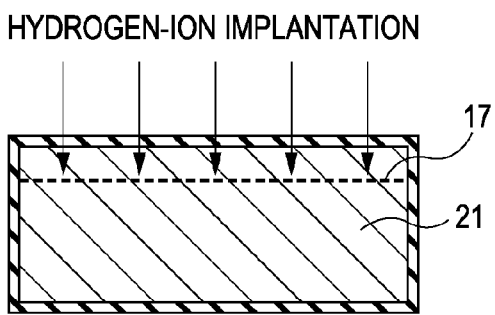
FIG. 12G
CARBON-ION IMPLANTATION
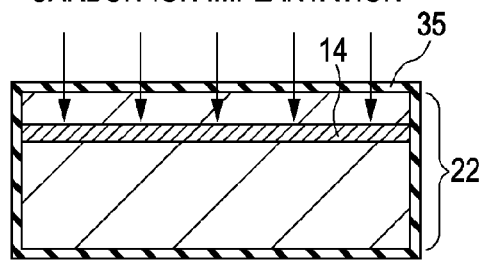
FIG. 12D
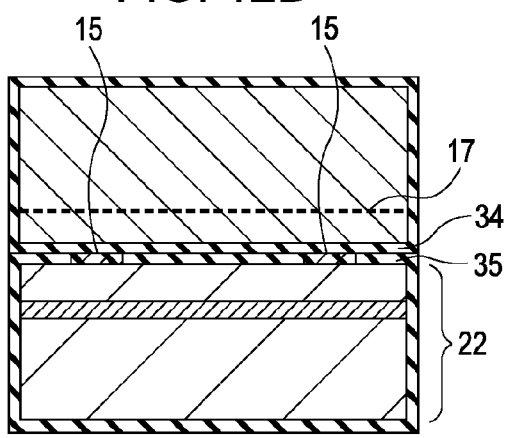
FIG. 12H
CARBON-ION IMPLANTATION
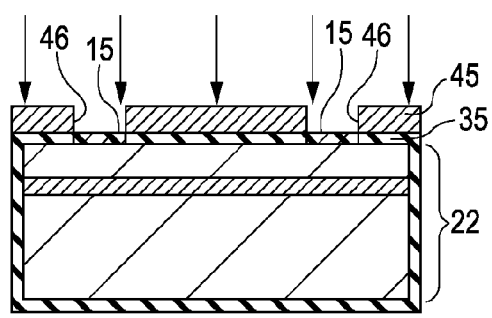
FIG. 12I
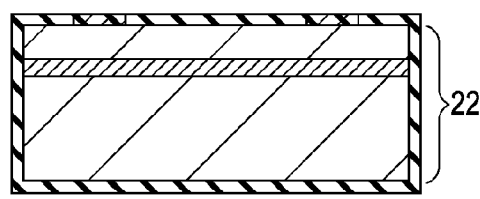

OXYGEN-ION IMPLANTATION

CARBON-ION IMPLANTATION

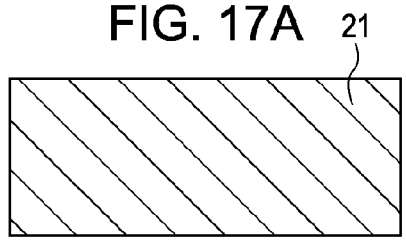
FIG. 17A
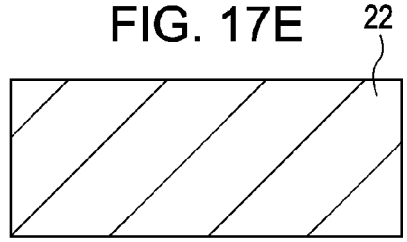
FIG. 17E
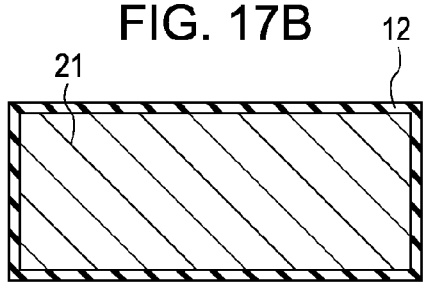
FIG. 17B
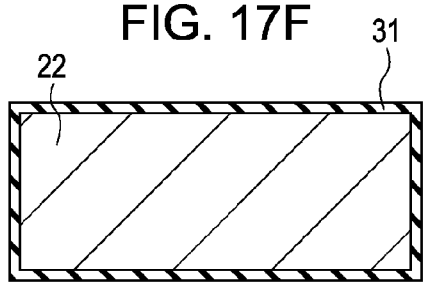
FIG. 17F
FIG. 17C
HYDROGEN-ION IMPLANTATION
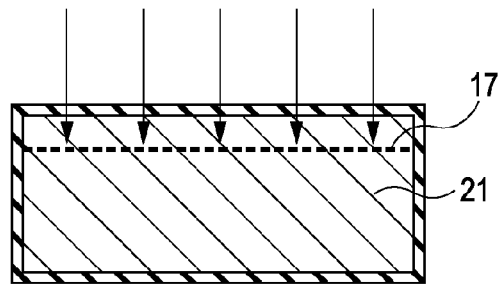
FIG. 17G
CARBON-ION IMPLANTATION
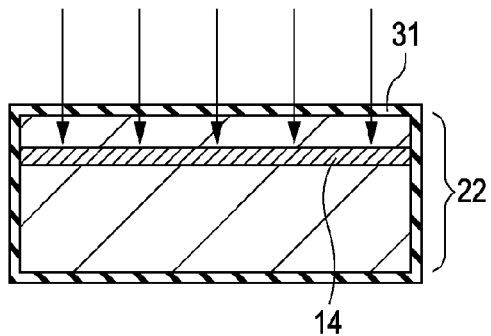
FIG. 17D
CARBON-ION IMPLANTATION
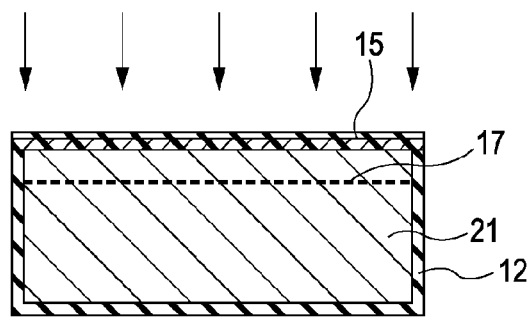
FIG. 17H
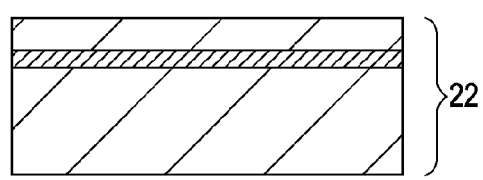

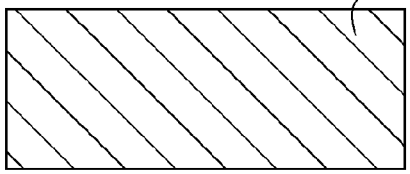
FIG. 19A
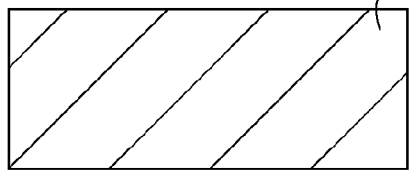
FIG. 19E
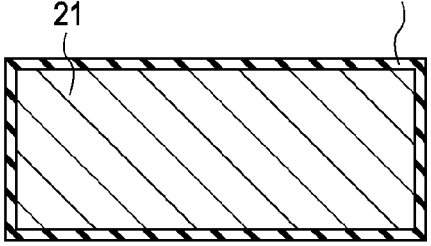
FIG. 19B
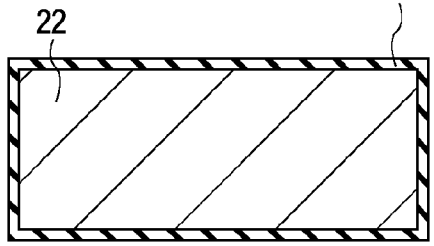
FIG. 19F
FIG. 19C
HYDROGEN-ION IMPLANTATION
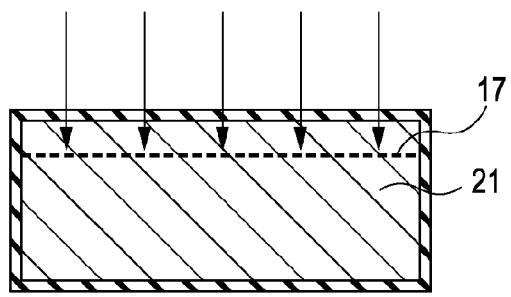
FIG. 19G
CARBON-ION IMPLANTATION
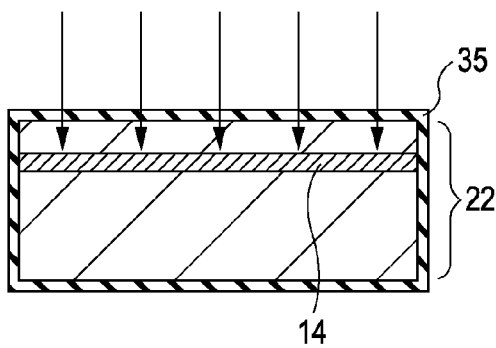
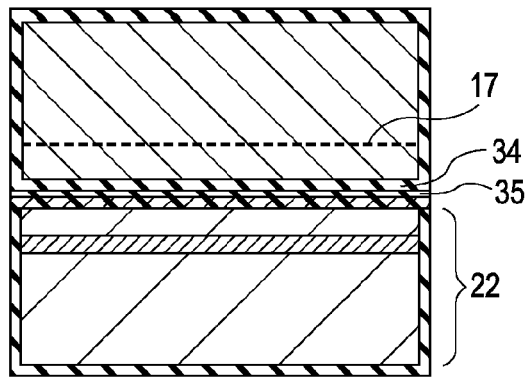
FIG. 19D
FIG. 19H
CARBON-ION IMPLANTATION
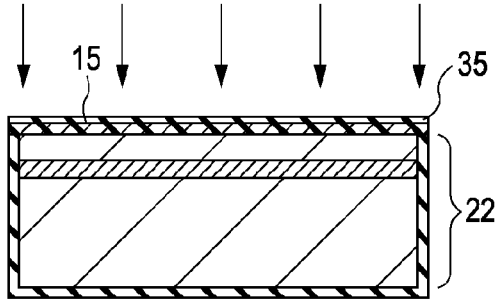

SOI SUBSTRATE AND METHOD FOR PRODUCING THE SAME, SOLID-STATE IMAGE PICKUP DEVICE AND METHOD FOR PRODUCING THE SAME, AND IMAGE PICKUP APPARATUS

BACKGROUND OF THE INVENTION

1. Field of the Invention

The present invention relates to a silicon-on-insulator (SOI) substrate, a method for producing the substrate, a solid-state image pickup device, a method for producing the device, and an image pickup apparatus.

2. Description of the Related Art

Silicon on insulator (SOI) substrates have recently been receiving attention in the field of image sensors as well as high-density CMOS elements and high-withstand-voltage elements because a significant increase in sensitivity should be obtained. For example, SOI substrates are used in whole-area-open-type CMOS image sensors. It is desired to have a higher gettering ability.

Specifically, a SOI substrate has a three-layer structure in which a single-crystal silicon layer used as a device formation region is arranged on a support substrate with a buried insulating film such as a silicon oxide ($SiO_2$) film. In some cases, an epitaxial grown layer is arranged on the single-crystal silicon layer.

SOI substrates have characteristics such as low parasitic capacitance and high radiation hardness and thus should have advantages, such as a higher speed, lower power consumption, latch-up prevention. Hence, SOI substrates are widely used as substrates for high-performance semiconductor elements.

Recently, also in the field of image sensors, SOI substrates have recently been widely used in whole-area-open-type CMOS image sensor structures, in which a significant increase in sensitivity should be obtained, because a photodiode layer can be formed while its thickness is accurately controlled.

Various production processes of SOI substrates are developed. SOI substrates formed by SIMOX in which oxygen is highly doped by ion implantation and SOI substrates formed by bonding are widely commercially used.

In particular, SOI substrates formed by bonding are often used.

The production process is as follows: Two mirror-polished single-crystal silicon substrates are prepared. One is a single-crystal silicon substrate (Substrate A) to be formed into a SOI layer. The other is a single-crystal silicon substrate (Substrate B) that will serve as a support substrate. An oxide film is formed on a surface of at least one of the single-crystal silicon substrates. These single-crystal silicon substrates are bonded to each other in such a manner that the oxide film is sandwiched therebetween. Heat treatment is then performed to increase bonding strength. The thickness of Substrate A is reduced from its backside, affording a SOI substrate.

Processes for reducing the thickness of Substrate A include (a) a process in which Substrate A is subjected to grinding or polishing to a target thickness, (b) a process in which a difference in etching rate due to different impurity concentrations is utilized, (c) a process (an ion-implantation exfoliation process, e.g., the Smart Cut process) including the steps of ion-implanting hydrogen or helium to form a split layer before bonding Substrate A and Substrate B and subjecting the bonded substrates to heat treatment for exfoliation at a temperature lower than a bonding temperature to separate Substrate A at the split layer.

SOI substrates have advantages that good electrical characteristics are achieved and that a uniform silicon layer can be formed. However, structures of SOI substrates are disadvantageous for metal contamination. That is, with respect to most of metal impurities, their diffusion coefficients in silicon oxide film are smaller than those in silicon. Furthermore, metal oxides are stable. In the case where a metal contaminant enters a single-crystal silicon layer from the side of its surface, thus, the metal contaminant does not readily pass through the silicon oxide layer, so that the metal impurity is accumulated in the thin single-crystal silicon layer. Hence, in many cases, SOI substrates are susceptible to metal contamination compared with silicon substrates that do not have SOI structures. This is a severe problem for, in particular, image sensors that are susceptible to luminous-dot defects and dark current due to metal impurities.

SOI substrates, therefore, preferably have a high ability to trap metal impurities and remove them from a single-crystal silicon layer to be formed into an active layer of a semiconductor element, i.e., gettering ability.

Examples of a gettering technique for a SOI substrate include a technique in which a gettering layer 214 is formed (by, for example, ion implantation of a neutral element) on a side of a SOI layer 211 adjacent to a silicon oxide layer 212 in a SOI substrate 210 as shown in FIG. 31A; and a technique in which the gettering layer 214 is formed on a side of the silicon oxide layer 212 adjacent to a support substrate 213 in the SOI substrate 210 as shown in FIG. 31B (for example, see Japanese Unexamined Patent Application Publication No. 2007-318102).

The structure shown in FIG. 31A has a problem in which it is difficult to form an active device region at a deeper position in the SOI layer 211. The structure also has another problem of, for example, the influence of the gettering layer 214 (strain and a dark component due to re-emission of electrons). The structure shown in FIG. 31B has a problem in which the gettering layer 214 is not effective against contamination from the SOI layer 211 side because the gettering layer 214 is located below the silicon oxide layer 212.

In recent years, there have been advances in the reduction in the cell size of image sensors as trends toward miniaturization and an increase in the number of pixels. For example, CCD imagers having a cell size of 1.65 µm have been commercialized. CMOS sensors having a cell size of the order of 1.4 µm have been developed.

The amount of light per pixel is naturally reduced with decreasing pixel size, so that the sensitivity of imagers tends to decrease. A reduction in sensitivity has been prevented by improvements, such as higher light collection efficiency, reductions in reflection and absorption in the upper layer, an increase in the size of a photoelectric conversion region of a bulk (in the depth direction and transverse direction).

However, a cell size of 2 µm or less limits the improvement in light collection efficiency.

A back-illuminated CMOS image sensor as a whole-area-open-type CMOS image sensor has thus been developed (for example, see Japanese Unexamined Patent Application Publication No. 2004-134672). A photoelectric conversion unit is arranged in a single-crystal silicon layer; hence, afterglow and dark characteristics are not impaired. The back-illuminated CMOS image sensor is thus promising.

Methods for producing it include a method in which a SOI substrate (formed by SIMOX, bonding, or the like) is utilized; and a method in which the use of an epitaxially grown substrate having an epitaxially grown layer results in a thin silicon (Si) layer which is a light-incident portion. In particular, a SOI substrate formed by bonding is promising from the viewpoint of achieving good productivity and a good quality of a SOI layer.

SUMMARY OF THE INVENTION

A problem to be solved is that in the case where a contaminant such as a metal impurity enters a single-crystal silicon layer of a SOI substrate from the side of its surface, the contaminant is accumulated in the single-crystal silicon layer because the metal impurity does not readily pass through the silicon oxide layer.

According to an embodiment of the present invention, the contaminant such as the metal impurity that enters the single-crystal silicon layer of the SOI substrate from the side of its surface is readily trapped in a portion of a support substrate of the SOI substrate.

According to an embodiment of the present invention, a SOI substrate includes a silicon substrate, a silicon oxide layer arranged on the silicon substrate, a silicon layer arranged on the silicon oxide layer, a gettering layer arranged in the silicon substrate, and a damaged layer formed of an impurity-doped region arranged in the silicon oxide layer.

In the SOI substrate according to an embodiment of the present invention, the formation of the damaged layer of an impurity-doped region arranged in the silicon oxide layer results in cleavage of bonds between oxygen (O) atoms and silicon (Si) atoms in the silicon oxide layer. A metal contaminant in the silicon layer diffuses into the silicon substrate through a portion of the damaged layer where the bonds are cleaved and thus is readily trapped in the gettering layer.

In the SOI substrate according to an embodiment of the present invention, the metal contaminant present in the silicon layer is efficiently trapped in the gettering layer through the damaged layer. Thus, the SOI substrate with a high gettering ability can be advantageously provided.

According to an embodiment of the present invention, a method for producing a SOI substrate (first production method) includes the steps of preparing a SOI substrate including a silicon substrate, a silicon oxide layer arranged on the silicon substrate, a silicon layer arranged on the silicon oxide layer, and a gettering layer arranged in the silicon substrate, forming an oxide film on a surface of the SOI substrate, implanting an impurity from a surface of the SOI substrate adjacent to the silicon layer to form a damaged layer of an impurity-doped region which is located in the silicon oxide layer or which extends from the silicon oxide layer to a portion of the silicon substrate adjacent to the silicon oxide layer, and removing the oxide film.

In the method for producing a SOI substrate (first production method) according to an embodiment of the present invention, the formation of the damaged layer of an impurity-doped region arranged in the silicon oxide layer results in cleavage of bonds between oxygen (O) atoms and silicon (Si) atoms in the silicon oxide layer. A metal contaminant in the silicon layer diffuses into the silicon substrate through a portion of the damaged layer where the bonds are cleaved and thus is readily trapped in the gettering layer.

According to an embodiment of the present invention, a method for producing a SOI substrate (second production method) includes the steps of forming a silicon oxide layer on a surface of a first substrate composed of silicon, ion-implanting hydrogen or a rare-gas element into the first substrate to form a split layer, implanting an impurity into the silicon oxide layer to form a damaged layer of an impurity-doped region, preparing a second substrate including a gettering layer arranged inside the second substrate, bonding the second substrate to a surface of the silicon oxide layer adjacent to the damaged layer, separating the first substrate at the split layer, and polishing a surface of the silicon layer of a portion of the first substrate left on the second substrate.

In the method for producing a SOI substrate (second production method) according to an embodiment of the present invention, the formation of the damaged layer of an impurity-doped region arranged in the silicon oxide layer results in cleavage of bonds between oxygen (O) atoms and silicon (Si) atoms in the silicon oxide layer. A metal contaminant in the silicon layer diffuses into the silicon substrate through a portion of the damaged layer where the bonds are cleaved and thus is readily trapped in the gettering layer.

According to an embodiment of the present invention, a method for producing a SOI substrate (third production method) includes the steps of forming a first silicon oxide layer on a first substrate composed of silicon, ion-implanting hydrogen or a rare-earth element into the first substrate to form a split layer, forming a second silicon oxide layer on a surface of a second substrate, forming a gettering layer inside the second substrate, implanting an impurity into the second silicon oxide layer or the second silicon oxide layer and a portion of the second substrate adjacent to the second silicon oxide layer to form a damaged layer of an impurity-doped region, bonding a surface of the second silicon oxide layer adjacent to the damaged layer to a surface of the first silicon oxide layer, separating the first substrate at the split layer, removing the exposed first silicon oxide layer and the exposed second silicon oxide layer, and polishing a surface of the silicon layer of the first substrate left on the second substrate.

In the method for producing a SOI substrate (third production method) according to an embodiment of the present invention, the formation of the damaged layer of an impurity-doped region arranged in the silicon oxide layer results in cleavage of bonds between oxygen (O) atoms and silicon (Si) atoms in the silicon oxide layer. A metal contaminant in the silicon layer diffuses into the silicon substrate through a portion of the damaged layer where the bonds are cleaved and thus is readily trapped in the gettering layer.

According to an embodiment of the present invention, a method for producing a SOI substrate (fourth production method) includes the steps of forming a gettering layer inside a silicon substrate, forming a first epitaxially grown silicon layer on the silicon substrate, forming an oxide film on a surface of the silicon substrate and a surface of the first epitaxially grown silicon layer, forming a silicon oxide layer in the first epitaxially grown silicon layer, implanting an impurity into the silicon oxide layer or the silicon oxide layer and a portion of the first epitaxially grown silicon layer, the portion being adjacent to the silicon substrate and adjacent to the silicon substrate, to form a damaged layer of an impurity-doped region, and removing the exposed oxide film.

In the method for producing a SOI substrate (fourth production method) according to an embodiment of the present invention, the formation of the damaged layer of an impurity-doped region arranged in the silicon oxide layer results in cleavage of bonds between oxygen (O) atoms and silicon (Si) atoms in the silicon oxide layer. A metal contaminant in the silicon layer diffuses into the silicon substrate through a portion of the damaged layer where the bonds are cleaved and thus is readily trapped in the gettering layer.

In each of the method for producing a SOI substrate (first to fourth production methods) according to embodiments of the present invention, the metal contaminant present in the silicon layer is efficiently trapped in the gettering layer through the damaged layer. Thus, the SOI substrate with a high gettering ability can be advantageously produced.

According to an embodiment of the present invention, a solid-state image pickup device includes a silicon layer having a photoelectric conversion unit, a pixel transistor, and a peripheral circuit, a color filter layer arranged on a portion of the silicon layer located in a path of light incident on the photoelectric conversion unit, a condenser lens arranged on the color filter layer and configured to guide incident light to the photoelectric conversion unit, a wiring layer including a plurality of sublayers of wirings and an interlayer insulating film configured to cover the wirings, the wiring layer being arranged on a surface of the silicon layer opposite the surface adjacent to an incident light side, a support substrate arranged on the wiring layer, a damaged layer formed of an impurity-doped region arranged on a portion of a surface of the silicon layer located on an incident light side and outside the path of light incident on the photoelectric conversion unit, and an opening configured to reach the wirings in the wiring layer.

In the solid-state image pickup device according to an embodiment of the present invention, the damaged layer formed of the impurity-doped region is arranged on the portion of the surface of the silicon layer located outside the path of light incident on the photoelectric conversion unit. The damaged layer has a gettering effect on metal contaminants during the step of forming the color filter layer, the step of forming the condensing lens, the step of forming an electrode connection portion, and the like. For example, in the step of forming the opening for connection of electrodes, processing is performed so as to expose the wirings in the wiring layer. If the wirings are formed of metal wirings, metal contamination can occur. However, the metal contamination is prevented owing to the gettering effect.

In the solid-state image pickup device according to an embodiment of the present invention, the photoelectric conversion unit is arranged in the silicon layer of the SOI substrate having a high gettering ability according to an embodiment of the present invention, thus significantly reducing the occurrence of a luminous dot and dark current. This makes it possible to advantageously provide the solid-state image pickup device that can afford a high-quality image.

According to an embodiment of the present invention, a method for producing a solid-state image pickup device includes the steps of preparing a SOI substrate having a silicon substrate, a silicon oxide layer arranged on the silicon substrate, a silicon layer arranged on the silicon oxide layer, a gettering layer arranged in the silicon substrate, and a damaged layer formed of an impurity-doped region arranged in the silicon oxide layer, forming a photoelectric conversion unit, a pixel transistor, and a peripheral circuit in the silicon layer, forming a wiring layer on the silicon layer, laminating the wiring layer and a support substrate, removing the silicon substrate and the silicon oxide layer to expose a surface of the silicon layer, forming a color filter layer on a portion of the silicon layer located in a path of light incident on the photoelectric conversion unit, and forming a condenser lens on the color filter, the condenser lens being configured to guide incident light to the photoelectric conversion unit.

In the method for producing a solid-state image pickup device according to an embodiment of the present invention, the SOI substrate, in which a metal contaminant in the silicon layer is trapped in the gettering layer through the damaged layer, according to an embodiment of the present invention is used, so that the photoelectric conversion unit is formed in the silicon layer having a reduced metal contaminant content.

In the method for producing a solid-state image pickup device according to an embodiment of the present invention, the photoelectric conversion unit is arranged in the silicon layer of the SOI substrate having a high gettering ability according to an embodiment of the present invention, thus significantly reducing the occurrence of a luminous dot and dark current. This makes it possible to advantageously produce the solid-state image pickup device that can afford a high-quality image.

According to an embodiment of the present invention, an image pickup apparatus includes a light collector configured to collect incident light, an image pickup unit including a solid-state image pickup device configured to receive light collected through the light collector and photoelectrically convert the light into a signal, and a signal processing unit configured to process the signal, in which the solid-state image pickup device includes a silicon layer having a photoelectric conversion unit, a pixel transistor, and a peripheral circuit, a color filter layer arranged on a portion of the silicon layer located in a path of light incident on the photoelectric conversion unit, a condenser lens arranged on the color filter layer and configured to guide incident light to the photoelectric conversion unit, a wiring layer arranged on a surface of the silicon layer opposite the surface adjacent to an incident light side, a support substrate arranged on the wiring layer, a damaged layer formed of an impurity-doped region arranged on a portion of the surface of the silicon layer located on an incident light side and outside the path of light incident on the photoelectric conversion unit, and an opening configured to reach the wirings in the wiring layer and be used for connection of electrodes.

In the image pickup apparatus according to an embodiment of the present invention, the use of the solid-state image pickup device according to an embodiment of the present invention reduces the degree of metal contamination in the silicon layer where the photoelectric conversion unit is formed.

In the image pickup apparatus according to an embodiment of the present invention, the solid-state image pickup device, which is capable of significantly reducing the occurrence of a luminous dot and dark current, according to an embodiment of the present invention is used, thus advantageously improving the image quality of the image pickup apparatus.

BRIEF DESCRIPTION OF THE DRAWINGS

FIGS. 10A to 10H are cross-sectional views illustrating the steps in a second example of the method for a SOI substrate according to the second embodiment;

FIGS. 12A to 12I are cross-sectional views illustrating the steps in a third example of the method for a SOI substrate according to the second embodiment;

FIGS. 17A to 17H are cross-sectional views illustrating the steps in a sixth example of the method for a SOI substrate according to the second embodiment;

FIGS. 19A to 19H are cross-sectional views illustrating the steps in a seventh example of the method for a SOI substrate according to the second embodiment;

DESCRIPTION OF THE PREFERRED EMBODIMENTS

Best modes (embodiments) for carrying out the invention will be described below.

1. First Embodiment

First Example of Structure of SOI Substrate

A first example of the structure of a SOI substrate according to a first embodiment of the present invention will be described with reference to FIG. 1 which is a schematic cross-sectional view.

Figure 1:
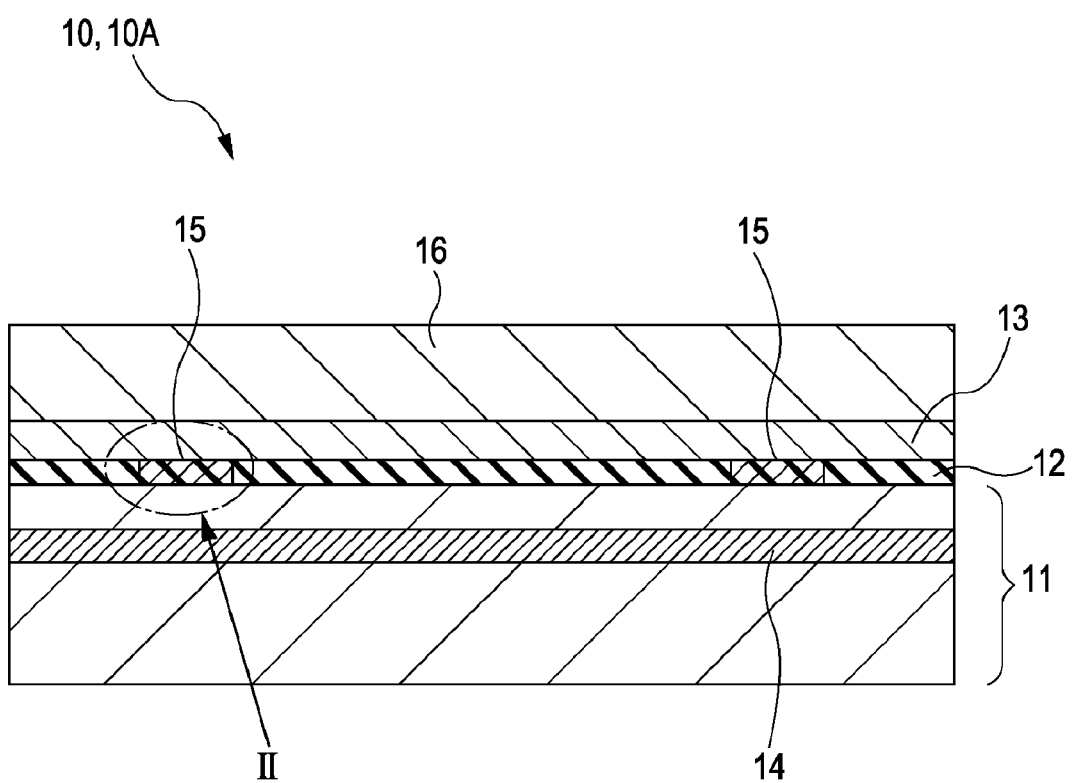
FIG. 1 is a schematic cross-sectional view illustrating a first example of a structure of a SOI substrate according to a first embodiment of the present invention.

As shown in FIG. 1, a silicon oxide layer 12 (for example, also referred to as a "box layer") is arranged on a silicon substrate 11. As the silicon substrate 11, for example, a single-crystal silicon substrate is used. The silicon oxide layer 12 is overlaid with a silicon layer 13. The silicon layer 13 is formed by bonding the silicon oxide layer 12 to the single-crystal silicon substrate and reducing the thickness of the single-crystal silicon substrate.

The silicon substrate 11 includes a gettering layer 14.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

Damaged layers 15 that are formed of an impurity-doped region are formed in the silicon oxide layer 12. Each of the damaged layers 15 is arranged on at least part of the silicon oxide layer 12 in the in-plane direction and over the entire thickness of the silicon oxide layer 12. Details of the damaged layer 15 will be described below with reference to FIGS. 2A to 2I.

The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound, a cluster, or several tens to several thousands of molecular cluster ions of one of the elements described above are implanted. Examples of the compound of the element described above include CO, $CH_3$, SiF, and $PH_2$. Examples of the cluster include $H_2$, $Ar_2$, $P_4$, and $P_3$.

An epitaxially grown silicon layer (second silicon layer) 16 is formed by epitaxial growth on the silicon layer (first silicon layer) 13. The epitaxially grown silicon layer 16 has a thickness of, for example, 3 µm to 8 µm. A thickness of the epitaxially grown silicon layer 16 of 3 μm meets the minimum thickness for the formation of a photoelectric conversion unit of a solid-state image pickup device (e.g., image sensor). A thickness of the epitaxially grown silicon layer 16 of 8 μm meets the minimum thickness for the formation of a photoelectric conversion unit, which is sensitive to longer wavelengths (e.g., near-infrared rays or infrared rays), of a solid-state image pickup device (e.g., image sensor).

A SOI substrate 10 (10A) has a structure described above.

In the SOI substrate 10A, the formation of the damaged layer 15 of an impurity-doped region arranged in the silicon oxide layer 12 results in cleavage of bonds between oxygen (O) atoms and silicon (Si) atoms in the silicon oxide layer 12. A metal in the silicon layer 13 diffuses into the silicon substrate 11 through the damaged layer 15 where the bonds are cleaved and thus is readily trapped in the gettering layer 14.

The damaged layer 15 is arranged over the entire thickness of the silicon oxide layer 12; hence, the metal (for example, a metal contaminant) in the silicon layer 13 passes readily through the silicon oxide layer 12.

The metal contaminant in the silicon layer 13 is efficiently trapped in the gettering layer 14 through the damaged layer 15. Thus, the SOI substrate 10 with a high gettering ability can be advantageously provided.

The damaged layer 15 will be described in detail below.

The damaged layer 15 is partially formed on the SOI substrate 10 when viewed from above. The damaged layer 15 is basically arranged in a portion that is not located in an element active region (e.g., a scribe portion or an inert portion).

An exemplary positional relationship between the damaged layer 15 and the silicon oxide layer 12 in the thickness direction will be described with reference to FIGS. 2A to 2I, each showing an enlarged view of Portion II shown in FIG. 1.

Figure 2A:
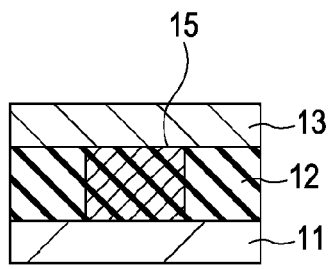
FIGS. 2A to 2I are enlarged views of Portion II in FIG. 1 and each show an exemplary relationship between a damaged layer and a silicon oxide layer in the thickness direction.

As shown in FIG. 2A, the damaged layer 15 is arranged over the entire thickness of the silicon oxide layer 12.

Figure 2B:
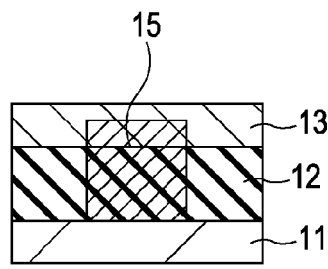

As shown in FIG. 2B, the damaged layer 15 is arranged over the entire thickness of the silicon oxide layer 12 and partially arranged in a portion of the silicon layer 13 adjacent to the silicon oxide layer 12.

Figure 2C:
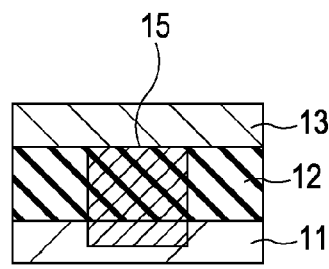

As shown in FIG. 2C, the damaged layer 15 is arranged over the entire thickness of the silicon oxide layer 12 and partially arranged in a portion of the silicon substrate 11 adjacent to the silicon oxide layer 12.

Figure 2D:
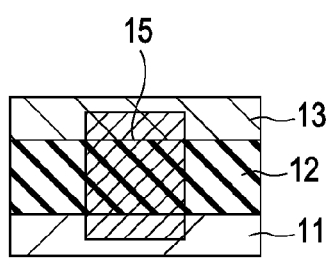

As shown in FIG. 2D, the damaged layer 15 is arranged over the entire thickness of the silicon oxide layer 12, partially arranged in a portion of the silicon layer 13 adjacent to the silicon oxide layer 12, and partially arranged in a portion of the silicon substrate 11 adjacent to the silicon oxide layer 12.

Figure 2E:
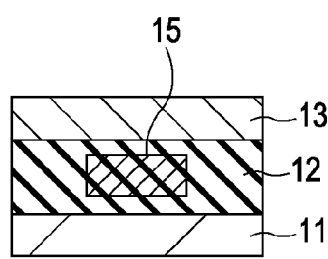

As shown in FIG. 2E, the damaged layer 15 is arranged within the silicon oxide layer 12 in the thickness direction of the silicon oxide layer 12.

Figure 2F:
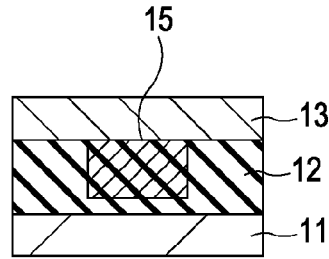

As shown in FIG. 2F, the damaged layer 15 is arranged within the silicon oxide layer 12 in the thickness direction of the silicon oxide layer 12 and extends to the interface between the silicon oxide layer 12 and the silicon layer 13.

Figure 2G:
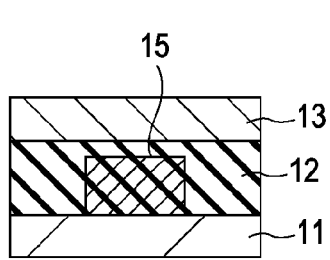

As shown in FIG. 2G, the damaged layer 15 is arranged within the silicon oxide layer 12 in the thickness direction of the silicon oxide layer 12 and extends to the interface between the silicon oxide layer 12 and the silicon substrate 11.

Figure 2H:
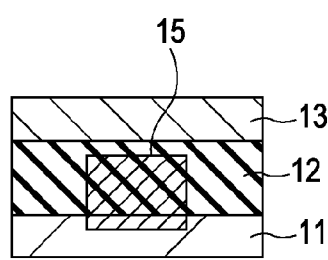

As shown in FIG. 2H, with respect to the thickness direction of the silicon oxide layer 12, an end of the damaged layer 15 adjacent to the silicon layer 13 is arranged within the silicon oxide layer 12, and the other end extends to the silicon substrate 11.

Figure 2I:
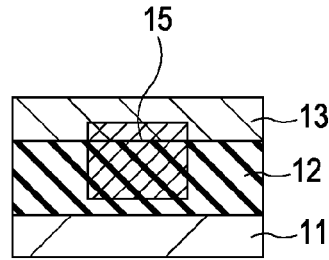

As shown in FIG. 2I, with respect to the thickness direction of the silicon oxide layer 12, an end of the damaged layer 15 adjacent to the silicon substrate 11 is arranged within the silicon oxide layer 12, and the other end extends to the silicon layer 13.

The damaged layer 15 is formed by ion implantation and thus exhibits a concentration distribution with a steep profile. However, the concentration is gradually decreased on the upper side (silicon layer 13 side) and the lower side (silicon substrate 11 side). In any structure, thus, impurity atoms constituting the damaged layer 15 are distributed in the silicon oxide layer 12 where the damaged layer 15 is formed in the thickness direction.

The damaged layer 15 described above serves as a portion (main portion) having an impurity concentration such that a metal contaminant in the silicon layer 13 can travel through the damaged layer 15 faster than it travels through the silicon oxide layer 12.

For example, in the case of using carbon (C), the damaged layer 15 is a region into which carbon is implanted at a dose of $1\times10^{13}$ cm$^{-2}$ to $1\times10^{16}$ cm$^{-2}$ and preferably $1\times10^{14}$ cm$^{-2}$ to $5\times10^{15}$ cm$^{-2}$.

A carbon dose of less than $1\times10^{13}$ cm$^{-2}$ causes difficulty in the passage of the metal contaminant through the damaged layer 15. A carbon dose exceeding $1\times10^{16}$ cm$^{-2}$ results in a fragile silicon oxide layer 12.

The positional relationship between the damaged layer 15 and the silicon oxide layer 12 is selected in accordance with an object and may be adjusted by an energy level or a dosage level during ion implantation.

As described above, various structures of the damaged layer 15 can be used relative to the silicon oxide layer 12. Among these, structures in which the damaged layer 15 is arranged over the entire thickness of the silicon oxide layer 12 (FIGS. 2A to 2D) are preferred from the viewpoint of guiding the metal contaminant in the silicon layer 13 to the gettering layer 14.

In the case where the damaged layer 15 extends to the silicon layer 13 to a large extent, properties of a device formed on the silicon layer 13 can be adversely affected. In these structures (for example, structures shown in FIGS. 2B, 2D, and 2I), thus, the damaged layer 15 may be formed in a region where a photoelectric conversion unit is not formed.

In the case where the silicon oxide layer 12 is used to bond to a support substrate, the exposure of the damaged layer 15 can reduce the adhesion to the support substrate. Thus, preferably, the damaged layer 15 is not exposed to a surface of the silicon oxide layer 12 adjacent to the support substrate.

The damaged layer 15 is formed by ion-implantation of, for example, carbon (C), oxygen (O), argon (Ar), silicon (Si), helium (He), phosphorus (P), arsenic (As), antimony (Sb), or boron (B). Thus, the damaged layer 15 can function not only as a layer configured to accelerate the diffusion of the metal contaminant but also as a gettering layer.

In this case, the gettering layer in the silicon substrate may not be formed.

Second Example of Structure of SOI Substrate

A second example of the structure of a SOI substrate according to the first embodiment will be described with reference to FIG. 3 which is a schematic cross-sectional view.

Figure 3:
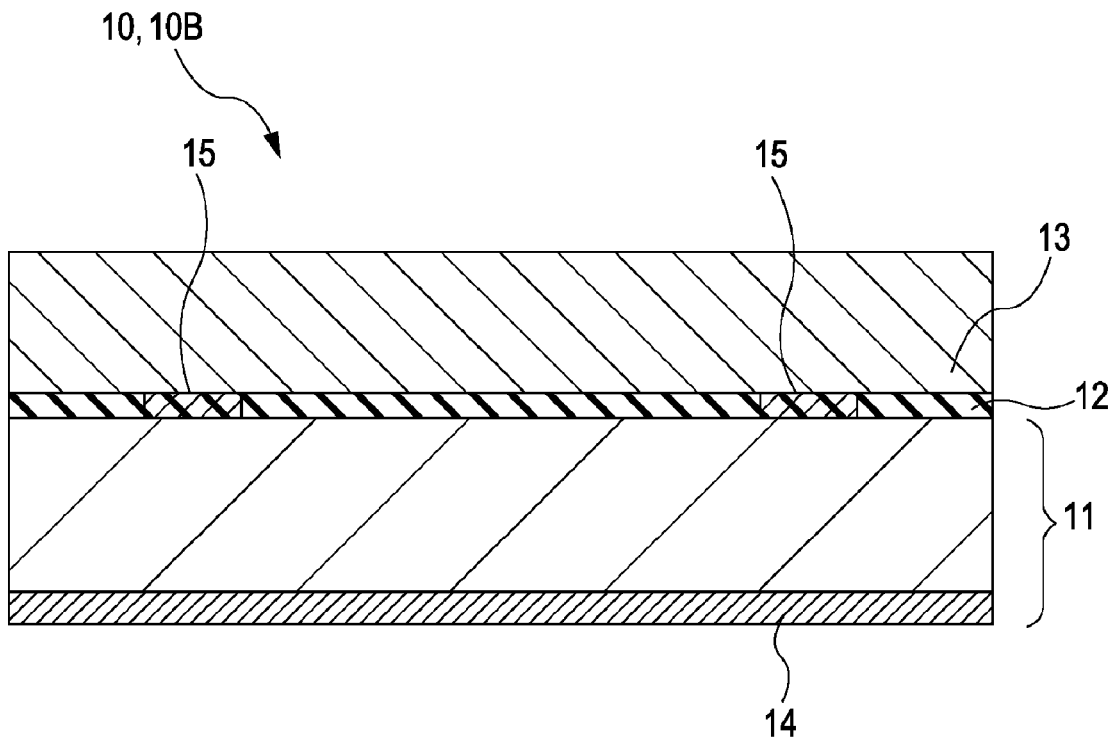
FIG. 3 is a schematic cross-sectional view illustrating a second example of a structure of a SOI substrate according to the first embodiment of the present invention.

As shown in FIG. 3, the silicon oxide layer 12 (for example, also referred to as a "box layer") is arranged on the silicon substrate 11. As the silicon substrate 11, for example, a single-crystal silicon substrate is used. The silicon oxide layer 12 is overlaid with the silicon layer 13. For example, the silicon layer 13 is formed by bonding the silicon oxide layer 12 to the single-crystal silicon substrate and reducing the thickness of the single-crystal silicon substrate.

An epitaxially grown silicon layer (not shown) may be formed by epitaxial growth on the silicon layer 13. In this case, the same structure as in FIG. 1 is obtained.

The gettering layer 14 is formed on the silicon substrate 11. In the figure, the gettering layer 14 is arranged on an under surface of the silicon substrate 11 opposite the surface adjacent to the silicon oxide layer 12. The gettering layer 14 may be formed in the silicon substrate 11. Alternatively, the gettering layer 14 may be formed through the entirety of the silicon substrate 11.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

The damaged layers 15 that are formed of an impurity-doped region are formed in the silicon oxide layer 12. Each of the damaged layer 15 is arranged on at least part of a surface of the silicon oxide layer 12 and over the entire thickness of the silicon oxide layer 12. The positional relationship between each damaged layer 15 and the silicon oxide layer 12 is the same as that described in FIGS. 2A to 2I.

The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound including one of the elements described above, a cluster including one of the elements, or several tens to several thousands of molecular cluster ions of one of the elements are implanted. Examples of the compound of the element described above include CO, $CH_3$, SiF, and $PH_2$. Examples of the cluster include $H_2$, $Ar_2$, $P_4$, and $P_3$.

The gettering layer 14 may be formed by ion-implantation of an impurity constituting the gettering layer 14 into the underside of the silicon substrate 11 or by vapor-phase doping with an impurity constituting the gettering layer 14 from the underside of the silicon substrate 11. Alternatively, the gettering layer 14 may be formed by forming a polysilicon layer, doped with an impurity constituting the gettering layer 14, on the underside of the silicon substrate 11.

In the SOI substrate 10 (10B), the formation of the damaged layer 15 of an impurity-doped region arranged in the silicon oxide layer 12 results in cleavage of bonds between oxygen (O) atoms and silicon (Si) atoms in the silicon oxide layer 12. A metal in the silicon layer 13 diffuses into the silicon substrate 11 through the damaged layer 15 where the bonds are cleaved and thus is readily trapped in the gettering layer 14.

The damaged layer 15 is arranged over the entire thickness of the silicon oxide layer 12; hence, a metal contaminant in the silicon layer 13 passes readily through the silicon oxide layer 12.

The metal contaminant in the silicon layer 13 is efficiently trapped in the gettering layer 14 through the damaged layer 15. Thus, the SOI substrate 10 with a high gettering ability can be advantageously provided.

A portion of the damaged layer 15 formed in the silicon oxide layer 12 sometimes serves as a gettering sink. For example, the damaged layer 15 formed by implantation of phosphorus (P) has a structure like phosphorus-silicate glass (PSG) in the silicon oxide layer 12. Ionized impurities are trapped by its polarization action.

The silicon oxide layer 12 is amorphous. Implantation of, for example, carbon (C), oxygen (O), argon (Ar), silicon (Si), helium (He), phosphorus (P), arsenic (As), antimony (Sb), or boron (B) into the silicon oxide layer 12 increases the number of dangling bonds due to implantation damage, increasing the number of trap sites for impurities. Thus, an implanted region serves as a gettering sink.

Furthermore, a portion of the damaged layer 15 extending to the silicon substrate 11 and a portion of the damaged layer 15 extending to the silicon layer 13 also serve as gettering sinks. For example, regions where an element, e.g., carbon (C), oxygen (O), argon (Ar), silicon (Si), helium (He), phosphorus (P), arsenic (As), antimony (Sb), or boron (B), which is used as an dopant constituting the damaged layer 15, is implanted into the silicon substrate 11 and the silicon layer 13 serve as gettering layers.

In the SOI substrate 10 (10A or 10B), the damaged layer 15 is preferably formed in a portion of the silicon oxide layer 12 located below an inactive region, such as a region where a pad of an image sensor is formed, a scribe is formed, or an element isolation portion is formed, of the silicon layer 13. For example, the damaged layer 15 is formed in a portion of the silicon oxide layer 12 located below an element active region, such as a region where a light-incident portion of an image sensor is formed or a transistor is formed, of the silicon layer 13. In this case, defects in the damaged layer 15 and trapped metal contaminants can adversely affect properties of a device formed in the element active region.

In an LSI or image sensor with a large element active region at least several millimeters to several tens of millimeters square, however, even if the damaged layer 15 is formed in the silicon oxide layer 12 located below an inactive region around an element active region, a sufficient gettering effect may not be provided. That is, in the case of a larger area of the element active region, impurities in the element active region may not sufficiently diffuse into the gettering layer 14 through the damaged layer 15.

Third Example of Structure of SOI Substrate

A third example of the structure of a SOI substrate according to the first embodiment will be described with reference to FIG. 4 which is a schematic cross-sectional view, the SOI substrate having an enhanced ability to diffuse impurities in an element active region into the gettering layer 14 through the damaged layer 15.

Figure 4:
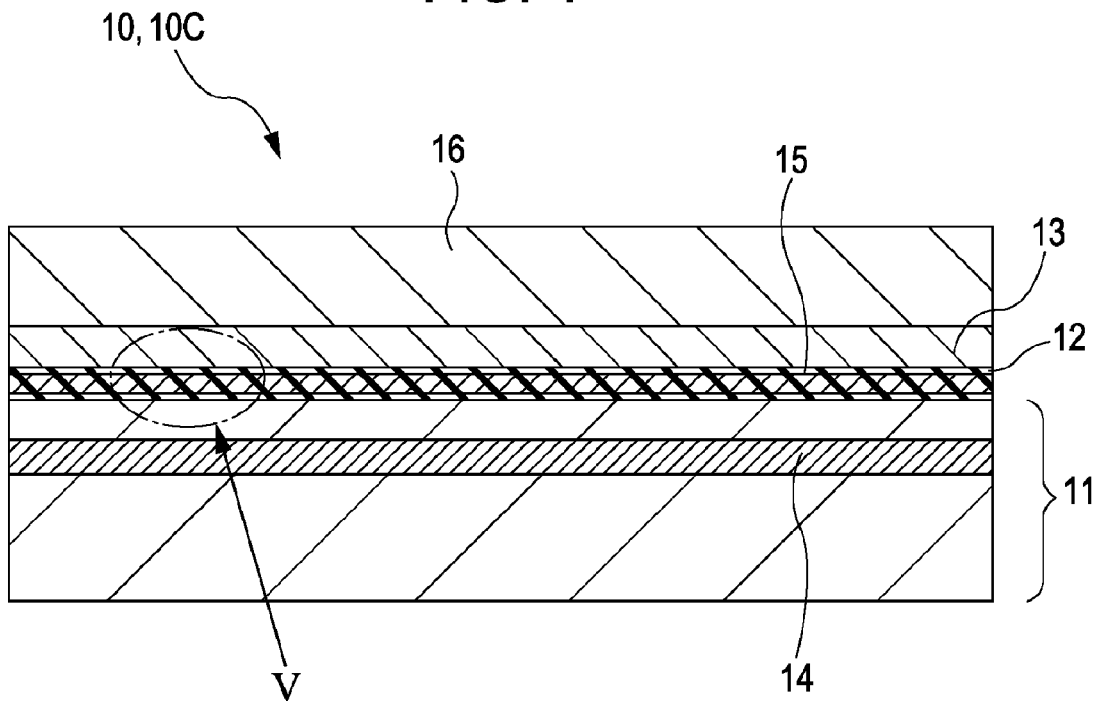
FIG. 4 is a schematic cross-sectional view illustrating a third example of a structure of a SOI substrate according to the first embodiment of the present invention.

As shown in FIG. 4, the silicon oxide layer 12 (for example, also referred to as a "box layer") is arranged on the silicon substrate 11. As the silicon substrate 11, for example, a single-crystal silicon substrate is used. The silicon oxide layer 12 is overlaid with the silicon layer 13. For example, the silicon layer 13 is formed by bonding the silicon oxide layer 12 to the single-crystal silicon substrate and reducing the thickness of the single-crystal silicon substrate.

The gettering layer 14 is formed in the silicon substrate 11.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

The damaged layer 15 that is formed of an impurity-doped region is formed through the entirety of the silicon oxide layer 12 in the in-plane direction. The damaged layer 15 is entirely or partially formed in the silicon oxide layer 12 in the thickness direction. That is, the damaged layer 15 is formed in the silicon oxide layer 12 and does not extend to the silicon layer 13. For example, the damaged layer 15 is formed in such a manner that the silicon oxide layer 12 having a thickness of 1 µm or less is left on the side of the silicon layer 13. The damaged layer 15 may extend from the inside of the silicon oxide layer 12 to the interface between the silicon oxide layer 12 and the silicon layer 13. Details of the structure will be described below with reference to FIGS. 5A to 5F.

The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound, a cluster, or several tens to several thousands of molecular cluster ions of one of the elements described above are implanted. Examples of the compound of the element described above include CO, $CH_3$, SiF, and $PH_2$. Examples of the cluster include $H_2$, $Ar_2$, $P_4$, and $P_3$.

An epitaxially grown silicon layer (second silicon layer) 16 is formed by epitaxial growth on the silicon layer (first silicon layer) 13. The epitaxially grown silicon layer 16 has a thickness of, for example, 3 µm to 8 µm. A thickness of the epitaxially grown silicon layer 16 of 3 µm meets the minimum thickness for the formation of a photoelectric conversion unit of a solid-state image pickup device (e.g., image sensor). A thickness of the epitaxially grown silicon layer 16 of 8 µm meets the minimum thickness for the formation of a photoelectric conversion unit, which is sensitive to longer wavelengths (e.g., near-infrared rays or infrared rays), of a solid-state image pickup device (e.g., an image sensor).

A SOI substrate 10 (10C) has a structure as described above.

In the SOI substrate 10C, the formation of the damaged layer 15 of an impurity-doped region arranged in the silicon oxide layer 12 results in cleavage of bonds between oxygen (O) atoms and silicon (Si) atoms in the silicon oxide layer 12. Even when a metal is present through the entirety of the silicon layer 13, the metal diffuses into the silicon substrate 11 through the damaged layer 15 where the bonds are cleaved and thus is readily trapped in the gettering layer 14.

The damaged layer 15 is entirely or substantially entirely formed through the entirety of the silicon oxide layer 12 in the thickness direction; hence, the metal (for example, a metal contaminant) in the silicon layer 13 passes readily through the silicon oxide layer 12.

In the SOI substrate 10 (10C), the metal contaminant present through the entirety of the silicon layer 13 is efficiently trapped in the gettering layer 14 through the damaged layer 15. Thus, the SOI substrate 10 with a high gettering ability can be advantageously provided.

The damaged layer 15 does not extend to the silicon layer 13. The damaged layer 15 is preferably formed inside the silicon oxide layer 12. Meanwhile, the damaged layer 15 may extend to the silicon substrate 11.

The damaged layer 15 does not extend to the silicon layer 13; hence, the silicon layer 13 is not damaged by the damaged layer 15. Thus, even when a photodetector of an image sensor, a transistor element, a transistor element of an LSI, and the like are formed on the silicon layer 13, a luminous dot in the photodetector and dark current in the transistor elements are not observed.

The damaged layer 15 according to the third example will be described in detail below.

The damaged layer 15 is formed through the entirety of the SOI substrate 10 in the in-plane direction and is basically formed in the silicon oxide layer 12 and the silicon substrate 11.

The positional relationship between the damaged layer 15 and the silicon oxide layer 12 in the thickness direction will be described with reference to FIGS. 5A to 5F, each showing an enlarged view of Portion V shown in FIG. 4.

Figure 5A:
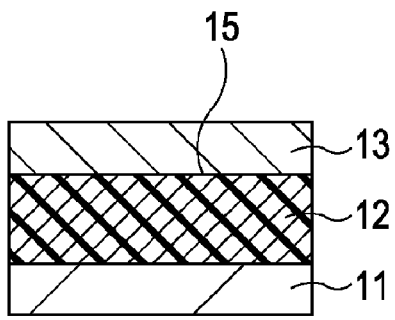
FIGS. 5A to 5F are enlarged views of Portion V in FIG. 4 and each show an exemplary relationship between a damaged layer and a silicon oxide layer in the thickness direction.

As shown in FIG. 5A, the damaged layer 15 is arranged over the entire thickness of the silicon oxide layer 12. That is, the damaged layer 15 is located from the interface between the silicon substrate 11 to the interface between the silicon oxide layer 12 and the silicon layer 13.

Figure 5B:
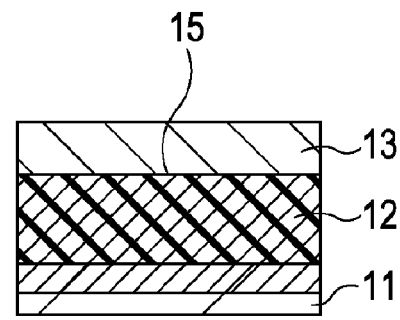

As shown in FIG. 5B, the damaged layer 15 is arranged over the entire thickness of the silicon oxide layer 12 and partially arranged in a portion of the silicon substrate 11 adjacent to the silicon oxide layer 12.

Figure 5C:
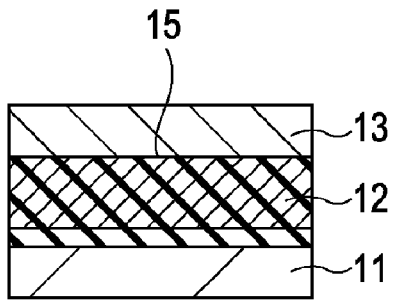

As shown in FIG. 5C, the damaged layer 15 is located within the silicon oxide layer 12 in the thickness direction and located apart from the interface between the silicon oxide layer 12 and the silicon substrate 11. That is, a portion of the silicon oxide layer 12 where the damaged layer 15 is not formed is located adjacent to the silicon substrate 11.

Figure 5D:
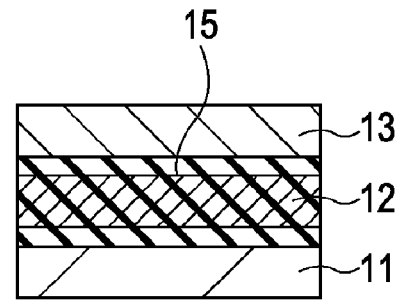

As shown in FIG. 5D, the damaged layer 15 is located within the silicon oxide layer 12 in the thickness direction. That is, portions of the silicon oxide layer 12 where the damaged layer 15 is not formed are located adjacent to the silicon substrate 11 and adjacent to the silicon layer 13.

Figure 5E:
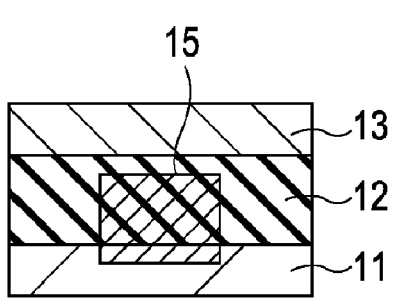

As shown in FIG. 5E, an end of the damaged layer 15 adjacent to the silicon layer 13 in the thickness direction is located within the silicon oxide layer 12, and the damaged layer 15 extends to the silicon substrate 11. That is, a portion of the silicon oxide layer 12 where the damaged layer 15 is not formed is located adjacent to the silicon layer 13.

Figure 5F:
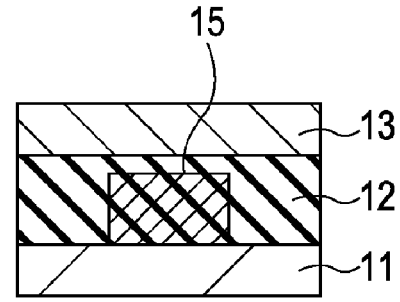

As shown in FIG. 5F, the damaged layer 15 is located within the silicon oxide layer 12 in the thickness direction and extends to the interface between the silicon oxide layer 12 and the silicon substrate 11. That is, a portion of the silicon oxide layer 12 where the damaged layer 15 is not formed is located adjacent to the silicon layer 13.

As described above, the damaged layer 15 is arranged so as not to extend to the silicon layer 13. This makes it possible to suppress the influence of defects of the damaged layer 15 and trapped metal impurities on an element active region to be formed in the silicon layer 13.

The damaged layer 15 is formed by ion implantation and thus exhibits a concentration distribution with a steep profile. However, the concentration is gradually decreased on the upper side (silicon layer 13 side) and the lower side (silicon substrate 11 side). In any structure, thus, impurity atoms constituting the damaged layer 15 are distributed in the silicon oxide layer 12 where the damaged layer 15 is formed in the thickness direction.

Thus, in the case where the damaged layer 15 is formed in the silicon oxide layer 12 so as to extend to the vicinity of the interface between the silicon oxide layer 12 and the silicon layer 13, strictly, an impurity constituting the damaged layer 15 is also implanted into the silicon layer 13. However, the impurity implantation does not adversely affect the silicon layer 13 because the implanted impurity content is low.

The damaged layer 15 described above serves as a portion (main portion) having an impurity concentration such that a metal contaminant in the silicon layer 13 can travel through the damaged layer 15 faster than it travels through the silicon oxide layer 12.

For example, in the case of using carbon (C), the damaged layer 15 is a region into which carbon is implanted at a dose of $1\times10^{13}$ cm$^{-2}$ to $1\times10^{16}$ cm$^{-2}$ and preferably $1\times10^{14}$ cm$^{-2}$ to $5\times10^{15}$ cm$^{-2}$.

A carbon dose of less than $1\times10^{13}$ cm$^{-2}$ causes difficulty in the passage of the metal contaminant through the damaged layer 15. A carbon dose exceeding $1\times10^{16}$ cm$^{-2}$ results in a fragile silicon oxide layer 12.

The positional relationship between the damaged layer 15 and the silicon oxide layer 12 is selected in accordance with an object and may be adjusted by an energy level or a dosage level during ion implantation.

In the case where the silicon oxide layer 12 is used to bond to a support substrate, the exposure of the damaged layer 15 can reduce the adhesion to the support substrate. Thus, preferably, the damaged layer 15 is not exposed to a surface of the silicon oxide layer 12 adjacent to the support substrate.

The damaged layer 15 is formed by ion-implantation of, for example, carbon (C), oxygen (O), argon (Ar), silicon (Si), helium (He), phosphorus (P), arsenic (As), antimony (Sb), or boron (B). Thus, the damaged layer 15 can function not only as a layer configured to accelerate the diffusion of the metal contaminant but also as a gettering layer.

For example, the damaged layer 15 formed by implantation of phosphorus (P) has a structure like phosphorus-silicate glass (PSG) in the silicon oxide layer 12. Ionized impurities are trapped by its polarization action.

The silicon oxide layer 12 is amorphous. Implantation of, for example, carbon (C), oxygen (O), argon (Ar), silicon (Si), helium (He), phosphorus (P), arsenic (As), antimony (Sb), or boron (B) into the silicon oxide layer 12 increases the number of dangling bonds due to implantation damage, increasing the number of trap sites for impurities. Thus, an implanted region serves as a gettering sink.

Furthermore, a portion of the damaged layer 15 extending to the silicon substrate 11 also serves as a gettering sink. For example, a region where an element, e.g., carbon (C), oxygen (O), argon (Ar), silicon (Si), helium (He), phosphorus (P), arsenic (As), antimony (Sb), or boron (B), which is used as an dopant constituting the damaged layer 15, is implanted into the silicon substrate 11 serves as a gettering layer.

In this case, the gettering layer in the silicon substrate may not be formed.

Figure 6A:
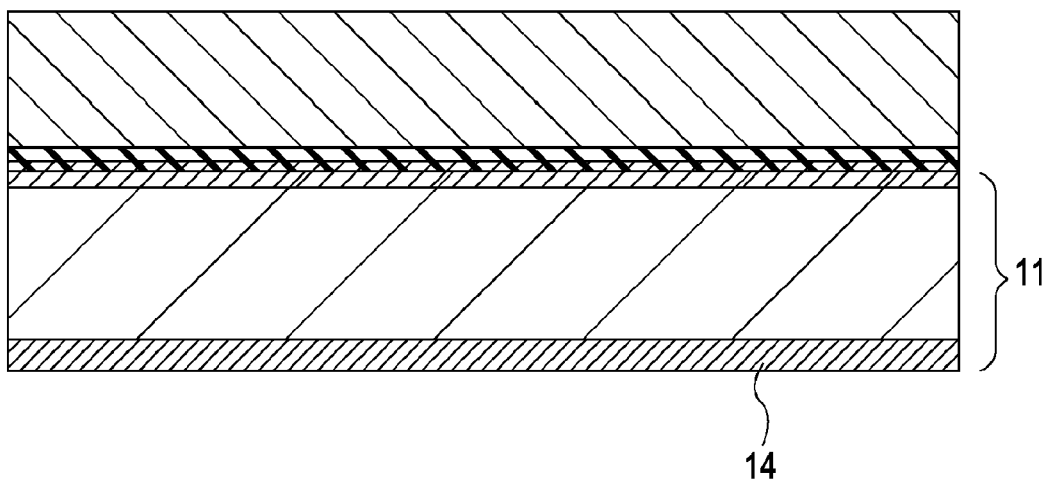
FIGS. 6A and 6B are schematic cross-sectional views each illustrating an exemplary position of a gettering layer in a SOI substrate according to an embodiment of the present invention.

The SOI substrate 10C according to the third example described with reference to FIGS. 4 to 5F can also be applied to a structure in which the gettering layer 14 is arranged on an underside of the silicon substrate 11 as shown in FIG. 6A. The gettering layer 14 may be formed by ion-implantation of an impurity constituting the gettering layer 14 into the underside of the silicon substrate 11 or by vapor-phase doping with an impurity constituting the gettering layer 14 from the underside of the silicon substrate 11. Alternatively, the gettering layer 14 may be formed by forming a polysilicon layer, doped with an impurity constituting the gettering layer 14, on the underside of the silicon substrate 11.

Figure 6B:
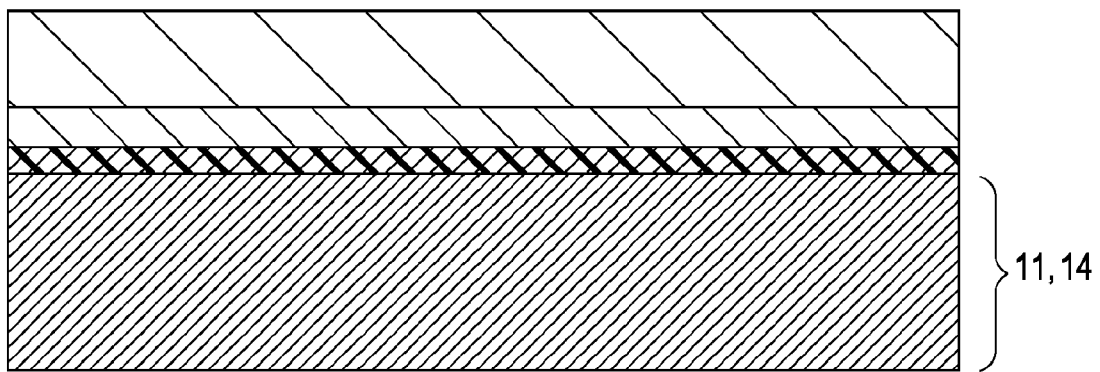

As shown in FIG. 6B, the SOI substrate 10C can also be applied to a structure, intrinsic gettering (IG), in which the gettering layer 14 is formed over the entire silicon substrate 11. Furthermore, the SOI substrate 10C can also be applied to a carbon-doped crystal, a crystal highly doped with boron, and the like.

Moreover, the SOI substrate 10C can also be applied to a structure, not shown, in which the epitaxially grown silicon layer 16 is not formed on the silicon layer 13.

2. Second Embodiment

First Example of Method for Producing SOI Substrate

A first example of a method for producing a SOI substrate according to a second embodiment of the present invention will be described below with reference to figures showing cross-sectional views illustrating the steps in the method.

First, a method for producing a SOI substrate with a gettering layer by the Smart Cut process will be described below with reference to figures showing cross-sectional views illustrating the steps in the method.

Figure 7A:
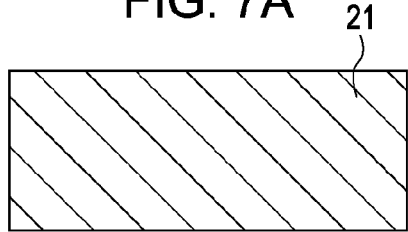
FIGS. 7A to 7H are cross-sectional views illustrating the steps in a first example of a method for a SOI substrate according to a second embodiment of the present invention.

As shown in FIG. 7A, a first substrate 21 is prepared. As the first substrate 21, for example, a silicon substrate is used.

Figure 7B:
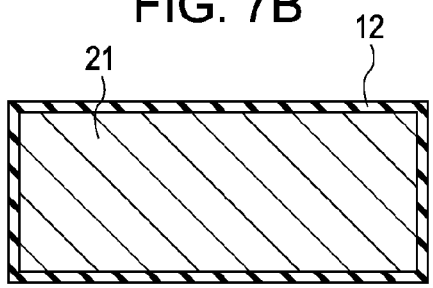

As shown in FIG. 7B, the silicon oxide layer 12 is formed on surfaces of the first substrate 21 by thermal oxidation so as to have a thickness of, for example, 500 nm.

Figure 7C:
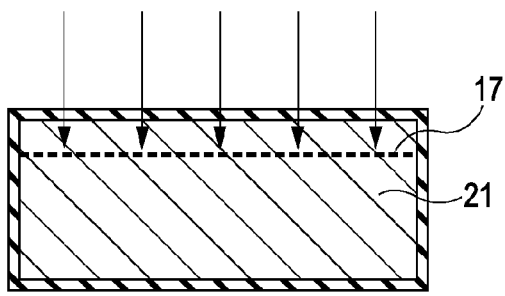

As shown in FIG. 7C, a split layer 17 is formed in the first substrate 21 by ion implantation. For example, the split layer 17 is formed in such a manner that a portion of the first substrate 21 can be separated in a subsequent step, the portion having a thickness of, for example, about 0.1 μm to about 1 μm.

In the ion implantation described above, the implantation of hydrogen ions results in the fragile split layer 17 to be formed into split surfaces.

For example, conditions of the ion implantation are determined in such a manner that hydrogen is implanted at a several hundreds of kiloelectron volts corresponding to a projected range (Rp) of about 1 μm.

In the ion implantation, an impurity other than hydrogen can be used. For example, an inert element such as helium (He) can be used.

Figure 7D:
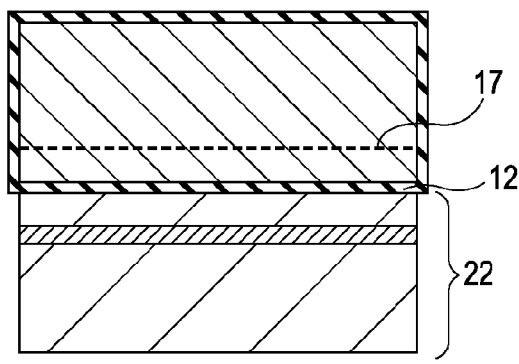

As shown in FIG. 7D, a second substrate 22 is bonded to a surface of the silicon oxide layer 12 adjacent to the split layer 17.

The second substrate 22 is formed as follows.

Figure 7E:
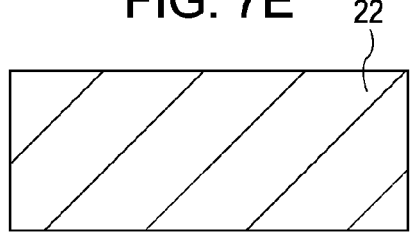

As shown in FIG. 7E, the second substrate 22 is prepared. As the second substrate 22, a single-crystal silicon substrate is used.

Figure 7F:
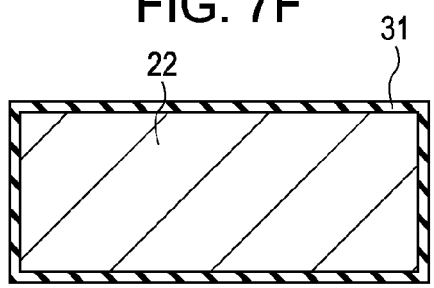

As shown in FIG. 7F, an oxide film 31 is formed on surfaces of the second substrate 22 by thermal oxidation so as to have a thickness of, for example, 20 nm to 100 nm.

Figure 7G:
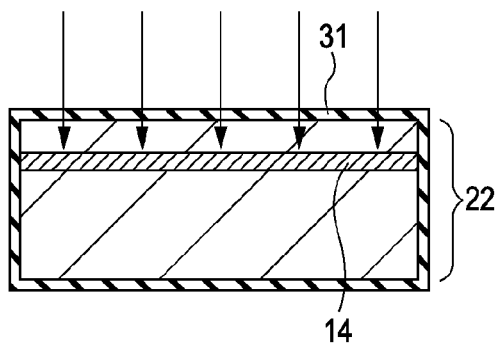

As shown in FIG. 7G, the gettering layer 14 is formed in the second substrate 22 by ion implantation. For example, the gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5\times10^{13}$ cm$^{-2}$ or more and desirably $5\times10^{14}$ cm$^{-2}$ or more. For example, in the case of performing ion implantation through the oxide film 31 having a thickness of about 20 nm, ion implantation is performed at an implantation energy of 150 keV and a dose of $1\times10^{15}$ cm$^{-2}$.

Then heat treatment is performed to recover damage. For example, heat treatment is performed at 1,000° C. for 10 minutes.

Figure 7H:
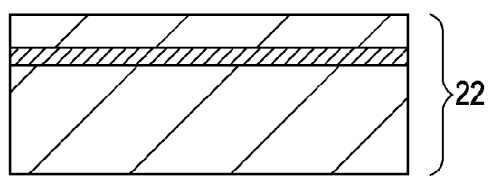

As shown in FIG. 7H, the oxide film 31 (see FIG. 7G) formed on the surface of the second substrate 22 is removed.

Thereby, the second substrate 22 is completed.

As described in FIG. 7D, the second substrate 22 is bonded to the surface of the silicon oxide layer 12.

For example, the bonding is performed by heat treatment at about 1,100° C. for about 2 hours.

Figure 8I:
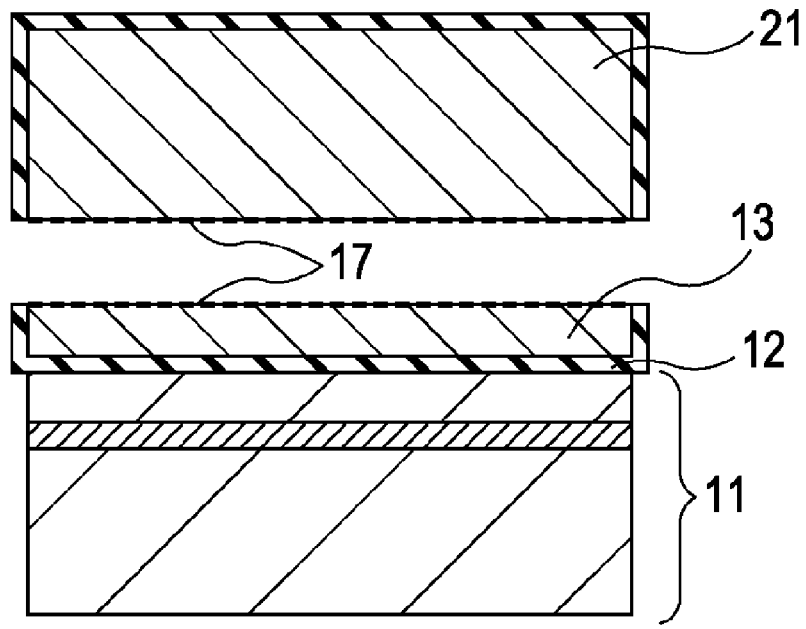
FIGS. 8I and 8J are cross-sectional views illustrating the steps in the first example of the method for a SOI substrate according to the second embodiment.

As shown in FIG. 8I, the first substrate 21 is separated at the split layer 17.

As a result, the second substrate 22 serves as the silicon substrate 11. The silicon layer 13 formed of a portion of the first substrate 21 left on the silicon substrate 11 is arranged on the silicon oxide layer 12.

Figure 8J:
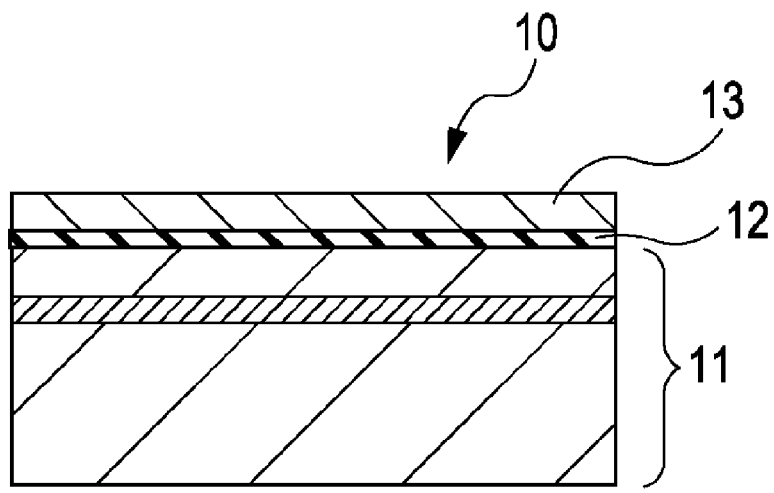

As shown in FIG. 8J, a surface (split surface) of the silicon layer 13 on the silicon substrate 11 with the silicon oxide layer 12 is subjected to planarization treatment. The planarization treatment is performed by, for example, hydrogen annealing and polishing. The polishing is performed by, for example, chemical mechanical polishing (CMP).

Furthermore, etching for removing a natural oxide film on the surface of the silicon layer 13 may be performed. In this case, the oxide film 31 (see FIG. 7G and other figures) formed on side surfaces of the silicon layer 13 is also removed. Moreover, bevel treatment is performed, if necessary.

Thereby, the SOI substrate 10 is completed.

The SOI substrate 10 is then subjected to steps described below.

Figure 9A:
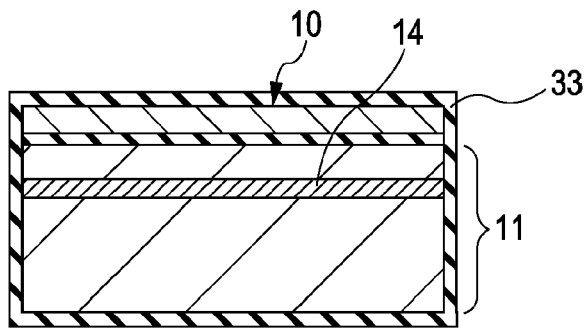
FIGS. 9A to 9E are cross-sectional views illustrating the steps in the first example of the method for a SOI substrate according to the second embodiment.

As shown in FIG. 9A, the SOI substrate 10 is prepared. An oxide film 33 is formed on surfaces of the SOI substrate 10.

The gettering layer 14 is arranged in the silicon substrate 11 of the SOI substrate 10.

Figure 9D:
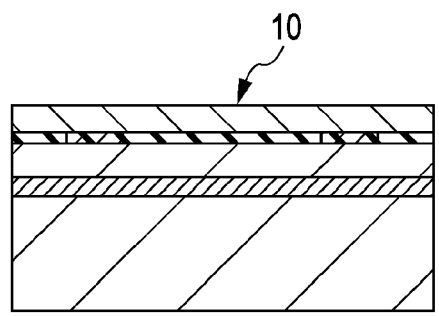
Figure 9B:
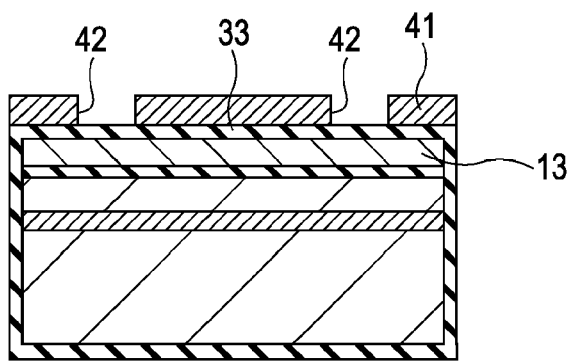

As shown in FIG. 9B, after a resist film 41 is formed on the oxide film 33 adjacent to the silicon layer 13, openings 42 are formed by lithography on regions to be formed into damaged layers through which a metal contaminant in the silicon layer 13 passes.

Figure 9E:
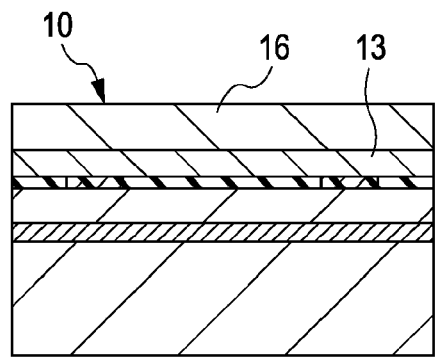
Figure 9C:
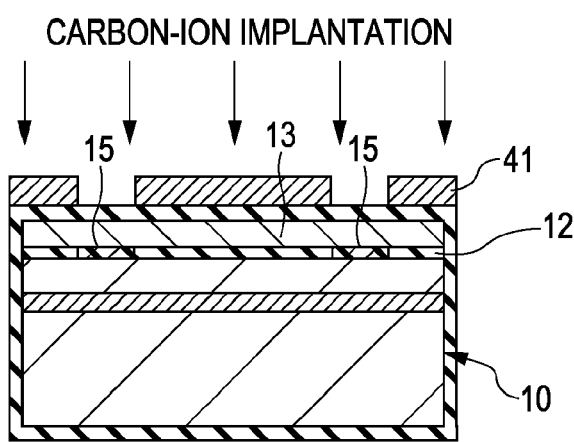

As shown in FIG. 9C, an impurity is implanted from a surface of the SOI substrate 10 adjacent to the silicon layer 13 with the resist film 41 as a mask for ion implantation to form the damaged layers 15 of impurity-doped regions in the silicon oxide layer 12.

In the ion implantation, for example, carbon is used as the impurity (element implanted). In the case of the silicon layer 13 having a thickness of about 0.3 µm and the silicon oxide layer 12 having a thickness of about 0.3 µm, the implantation energy is set to 200 keV, and the dose level is set to $1 \times 10^{14}$ $cm^{-2}$. Conditions of the ion implantation of carbon are determined in response to the thicknesses of the silicon layer 13, the silicon oxide layer 12, and the like, and the positional relationship between the silicon oxide layer 12 and the damaged layer 15 shown in FIGS. 2A to 2I. The conditions are not limited to the foregoing conditions.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

As shown in FIG. 9D, the resist film 41 (see FIG. 9C) is removed. Removal of the oxide film 33 (see FIG. 9A) exposes the SOI substrate 10. The figure shows a state in which the resist film 41 and the oxide film 33 are removed.

As shown in FIG. 9E, the epitaxially grown silicon layer 16 is formed on the silicon layer 13 by epitaxial growth.

In the epitaxial growth, the epitaxially grown silicon layer 16 having a thickness of, for example, about 3 µm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 µm or more. Usually, the silicon layer 13 has a thickness of 1 µm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 µm. Thus, the formation of the epitaxially grown silicon layer 16 having a thickness of about 6 µm to about 8 µm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 is completed.

In the first example of the production method, the epitaxially grown silicon layer 16 is formed on the silicon layer 13. The split layer 17 may be formed at a deeper position, thus increasing the thickness of the silicon layer 13 of a portion of the first substrate 21 left on the second substrate 22 serving as the silicon substrate 11 without forming the epitaxially grown silicon layer 16. In this case, the projected range is increased in the ion implantation for the formation of the damaged layer 15; hence, the implantation energy is determined in response to the projected range.

In the first example of the method for producing the SOI substrate 10, the formation of the damaged layers 15 of the impurity-doped regions arranged in the silicon oxide layer 12 results in cleavage of bonds between oxygen (O) atoms and silicon (Si) atoms in the silicon oxide layer 12. The metal contaminant in the silicon layer 13 passes readily through the damaged layers 15 and thus diffuses into the silicon substrate 11. The metal contaminant diffused in the silicon substrate 11 is trapped in the gettering layer 14.

The metal contaminant in the silicon layer 13 is efficiently trapped in the gettering layer 14 through the damaged layers 15. Thus, the SOI substrate 10 with a high gettering ability can be advantageously provided.

Second Example of Method for Producing SOI Substrate

A second example of a method for producing a SOI substrate according to the second embodiment will be described with reference to FIGS. 10A to 11L which are schematic cross-sectional views.

As shown in FIG. 10A, the first substrate 21 is prepared. As the first substrate 21, for example, a silicon substrate is used.

As shown in FIG. 10B, the silicon oxide layer 12 is formed on surfaces of the first substrate 21 by thermal oxidation so as to have a thickness of, for example, 500 nm.

As shown in FIG. 10C, a split layer 17 is formed in the first substrate 21 by ion implantation. For example, the split layer 17 is formed in such a manner that a portion of the first substrate 21 can be separated in a subsequent step, the portion having a thickness of, for example, about 0.1 μm to about 1 μm.

In the ion implantation described above, the implantation of hydrogen ions results in the fragile split layer 17 to be formed into split surfaces.

For example, conditions of the ion implantation are determined in such a manner that hydrogen is implanted at a several hundreds of kiloelectron volts corresponding to a projected range (Rp) of about 1 μm.

In the ion implantation, an impurity other than hydrogen can be used. For example, an inert element such as helium (He) can be used.

As shown in FIG. 10D, after a resist film 43 is formed on the silicon oxide layer 12 arranged on a surface of the first substrate 21 adjacent to the split layer 17, openings 44 are formed by lithography on regions to be formed into damaged layers through which a metal contaminant in the silicon layer 13 passes.

An impurity is implanted into the silicon oxide layer 12 with the resist film 43 as a mask for ion implantation to form the damaged layers 15 of impurity-doped regions.

In the ion implantation, for example, carbon is used as the impurity (element implanted).

In this case, a surface of the silicon oxide layer 12 serves as a bonding surface in the subsequent step of bonding substrates to each other; hence, the damaged layers 15 are preferably formed within the silicon oxide layer 12 so as not to protrude from the silicon oxide layer 12.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, $SiF$, and $PH_2$. Examples of the cluster include $H_2$, $Ar_2$, $P_4$, and $P_3$.

Here, the second substrate 22 to be bonded to the silicon oxide layer 12 will be described.

As shown in FIG. 10E, the second substrate 22 is prepared. As the second substrate 22, for example, a single-crystal silicon substrate is used.

As shown in FIG. 10F, the oxide film 31 is formed on surfaces of the second substrate 22 by thermal oxidation or the like so as to have a thickness of, for example, 20 nm to 100 nm.

As shown in FIG. 10G, the gettering layer 14 is formed in the second substrate 22 by ion implantation. For example, the gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5 \times 10^{13}$ $cm^{-2}$ or more and desirably $5 \times 10^{14}$ $cm^{-2}$ or more. For example, in the case of performing ion implantation through the oxide film 31 having a thickness of about 20 nm, ion implantation is performed at an implantation energy of 150 keV and a dose of $1 \times 10^{15}$ $cm^{-2}$.

Then heat treatment is performed to recover damage. For example, heat treatment is performed at 1,000° C. for 10 minutes.

As shown in FIG. 10H, the oxide film 31 (see FIG. 10G) formed on the surface of the second substrate 22 is removed.

Thereby, the second substrate 22 is completed.

Figure 11I:
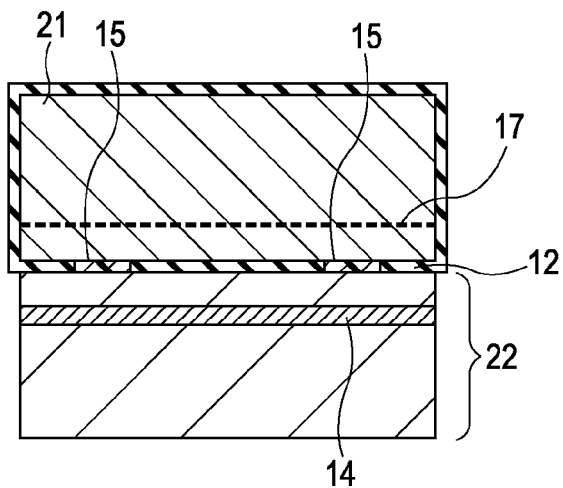
FIGS. 11I to 11L are cross-sectional views illustrating the steps in the second example of the method for a SOI substrate according to the second embodiment.

The resist film 43 (see FIG. 10D) is removed. As shown in FIG. 11I, the first substrate 21 is turned upside down. The second substrate 22 is bonded to a surface of the silicon oxide layer 12 adjacent to the damaged layers 15. In this case, a surface of the second substrate 22 adjacent to the gettering layer 14 is bonded.

For example, the bonding is performed by heat treatment at about 1,100° C. for about 2 hours.

Figure 11L:
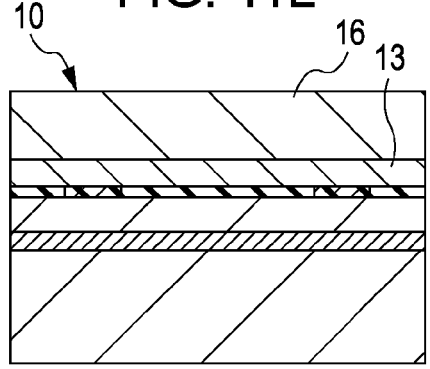
Figure 11J:
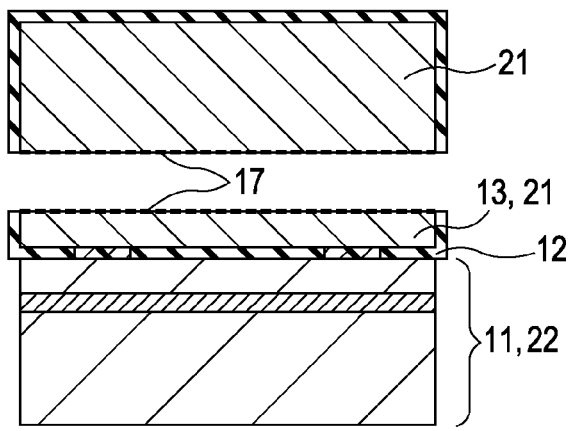
Figure 11K:
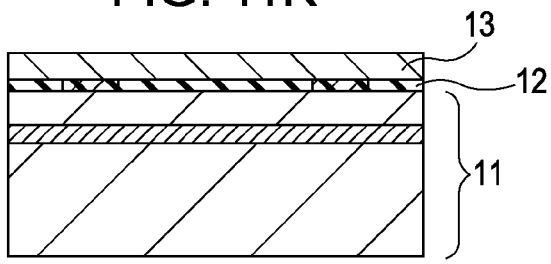

As shown in FIG. 11J, the first substrate 21 is separated at the split layer 17.

As a result, the second substrate 22 serves as the silicon substrate 11. The silicon layer 13 formed of a portion of the first substrate 21 left on the silicon substrate 11 is arranged on the silicon oxide layer 12.

As shown in FIG. 8K, a surface (split surface) of the silicon layer 13 on the silicon substrate 11 with the silicon oxide layer 12 is subjected to planarization treatment. The planarization treatment is performed by, for example, hydrogen annealing and polishing. The polishing is performed by, for example, chemical mechanical polishing (CMP).

Furthermore, etching for removing a natural oxide film on the surface of the silicon layer 13 may be performed. In this case, the silicon oxide layer 12 (see FIG. 11J and other figures) formed on side surfaces of the silicon layer 13 is also removed. Moreover, bevel treatment is performed, if necessary.

Thereby, the SOI substrate 10 is completed.

As shown in FIG. 11L, the epitaxially grown silicon layer 16 may be formed on the silicon layer 13 by epitaxial growth.

In the epitaxial growth, the epitaxially grown silicon layer 16 having a thickness of, for example, 3 μm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 μm or more. The silicon layer 13 has a thickness of 1 μm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 μm. Thus, the formation of the epitaxially grown silicon layer 16 having a thickness of about 6 μm to about 8 μm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 is completed.

In the foregoing production method, The split layer 17 may be formed at a deeper position, thus increasing the thickness of the silicon layer 13 of a portion of the first substrate 21 left on the second substrate 22 serving as the silicon substrate 11 without forming the epitaxially grown silicon layer 16.

In the second example of the method for producing the SOI substrate 10, the formation of the damaged layers 15 of impurity-doped regions arranged in the silicon oxide layer 12 results in cleavage of bonds between oxygen (O) atoms and silicon (Si) atoms in the silicon oxide layer 12. The metal contaminant in the silicon layer 13 passes readily through the damaged layers 15 and thus diffuses into the silicon substrate 11. The metal contaminant diffused in the silicon substrate 11 is trapped in the gettering layer 14.

The metal contaminant in the silicon layer 13 is efficiently trapped in the gettering layer 14 through the damaged layers 15. Thus, the SOI substrate 10 with a high gettering ability can be advantageously provided.

Third Example of Method for Producing SOI Substrate

A third example of a method for producing a SOI substrate according to the second embodiment will be described with reference to FIGS. 12A to 13L which are schematic cross-sectional views.

As shown in FIG. 12A, the first substrate 21 is prepared. As the first substrate 21, for example, a single-crystal silicon substrate is used.

As shown in FIG. 12B, a first silicon oxide layer 34 is formed on surfaces of the first substrate 21 by thermal oxidation so as to have a thickness of, for example, 500 nm.

As shown in FIG. 12C, a split layer 17 is formed in the first substrate 21 by ion implantation. For example, the split layer 17 is formed in such a manner that a portion of the first substrate 21 can be separated in a subsequent step, the portion having a thickness of, for example, about 0.1 µm to about 1 µm.

In the ion implantation described above, the implantation of hydrogen ions results in the fragile split layer 17 to be formed into split surfaces.

For example, conditions of the ion implantation are determined in such a manner that hydrogen is implanted at a several hundreds of kiloelectron volts corresponding to a projected range (Rp) of about 1 µm.

In the ion implantation, an impurity other than hydrogen can be used. For example, an inert element such as helium (He) can be used.

As shown in FIG. 12D, the second substrate 22 is bonded to a surface of the first silicon oxide layer 34 adjacent to the split layer 17.

The second substrate 22 is formed as follows.

As shown in FIG. 12E, the second substrate 22 is prepared. As the second substrate 22, a single-crystal silicon substrate is used.

As shown in FIG. 12F, a second silicon oxide layer 35 is formed on surfaces of the second substrate 22 by thermal oxidation so as to have a thickness of, for example, 100 nm.

As shown in FIG. 12G, the gettering layer 14 is formed in the second substrate 22 by ion implantation. For example, the gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5\times10^{13}$ cm$^{-2}$ or more and desirably $5\times10^{14}$ cm$^{-2}$ or more. For example, in the case of performing ion implantation through the second silicon oxide layer 35 having a thickness of about 100 nm, ion implantation is performed at an implantation energy of 150 keV and a dose of $1\times10^{15}$ cm$^{-2}$.

Heat treatment is then performed to recover damage. For example, the heat treatment is performed at 1,000° C. for 10 minutes.

As shown in FIG. 12H, after a resist film 45 is formed on the second silicon oxide layer 35 arranged on a surface of the second substrate 22, openings 46 are formed by lithography on regions to be formed into damaged layers through which a metal contaminant in the second silicon oxide layer 35 passes.

An impurity is implanted into the second silicon oxide layer 35 with the resist film 45 as a mask for ion implantation to form the damaged layers 15 of impurity-doped regions.

In the ion implantation, for example, carbon is used as the impurity (element implanted).

In this case, a surface of the second silicon oxide layer 35 serves as a bonding surface in the subsequent step of bonding substrates to each other; hence, the damaged layers 15 are preferably formed within the second silicon oxide layer 35 so as not to be exposed to the outside.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

As shown in FIG. 12I, the resist film 45 (see FIG. 12H) is removed. The figure shows a state in which the resist film 45 is removed.

Thereby, the second substrate 22 is completed.

As described in FIG. 12D, the surface of the first silicon oxide layer 34 adjacent to the split layer 17 is bonded to a surface of the second silicon oxide layer 35 including the damaged layers 15 of the second substrate 22.

For example, the bonding is performed by heat treatment at about 1,100° C. for about 2 hours.

Figure 13J:
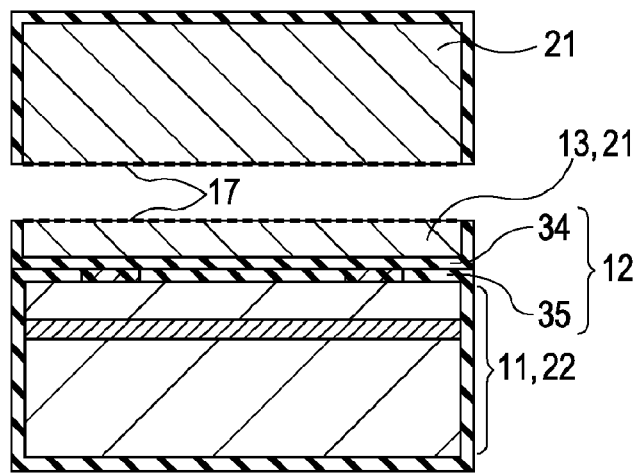
FIGS. 13J to 13L are cross-sectional views illustrating the steps in the third example of the method for a SOI substrate according to the second embodiment.

As shown in FIG. 13J, the first substrate 21 is separated at the split layer 17.

As a result, the second substrate 22 serves as the silicon substrate 11. The silicon layer 13 formed of a portion of the first substrate 21 left on the silicon substrate 11 is arranged on the silicon oxide layer 12. The silicon oxide layer 12 includes the first silicon oxide layer 34 and the second silicon oxide layer 35 bonded thereto.

Figure 13K:
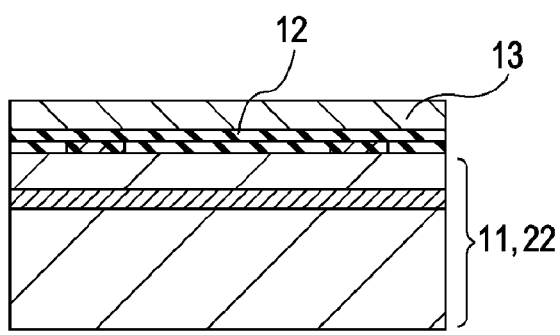

As shown in FIG. 13K, a surface (split surface) of the silicon layer 13 on the silicon substrate 11 with the silicon oxide layer 12 is subjected to planarization treatment. The planarization treatment is performed by, for example, hydrogen annealing and polishing. The polishing is performed by, for example, chemical mechanical polishing (CMP).

Furthermore, etching for removing a natural oxide film on the surface of the silicon layer 13 may be performed. In this case, the silicon oxide layer 12 (see FIG. 13J and other figures) formed on side surfaces of the silicon layer 13 and the surfaces of the second substrate 22 is also removed. Moreover, bevel treatment is performed, if necessary.

Figure 13L:
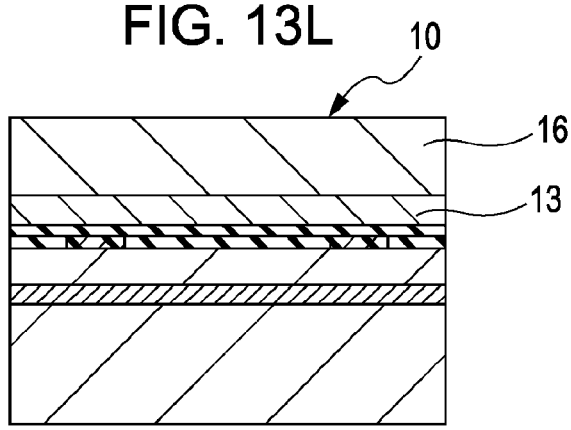

As shown in FIG. 13L, the epitaxially grown silicon layer 16 may be formed on the silicon layer 13 by epitaxial growth.

In the epitaxial growth, the epitaxially grown silicon layer 16 having a thickness of, for example, 3 µm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 µm or more. The silicon layer 13 has a thickness of 1 µm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 µm. Thus, the formation of the epitaxially grown silicon layer 16 having a thickness of about 6 µm to about 8 µm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 is completed.

Figure 14A:
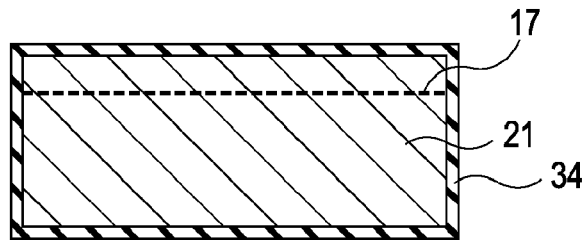
FIGS. 14A to 14D are cross-sectional views illustrating the steps in the third example of the method for a SOI substrate according to the second embodiment.
Figure 14B:
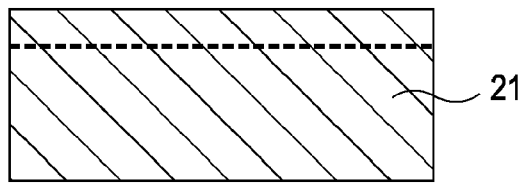

In the third example of the method for producing the SOI substrate 10, as shown in FIG. 14A, after the split layer 17 is formed in the first substrate 21, the first silicon oxide layer 34 formed on the surfaces of the first substrate 21 is removed to expose the first substrate 21 as shown in FIG. 14B.

Figure 14C:
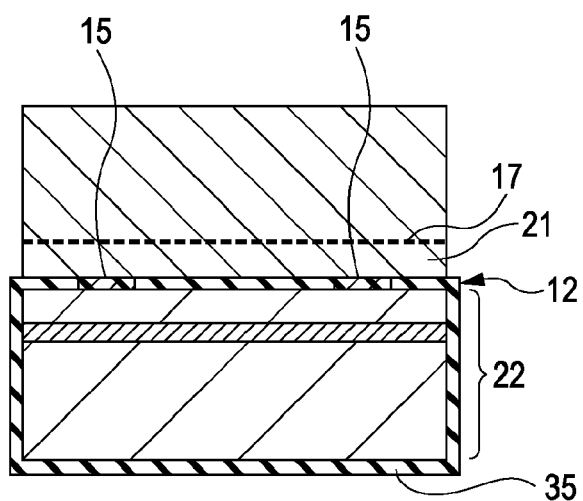

As shown in FIG. 14C, a surface of the first substrate 21 adjacent to the split layer 17 is bonded to a surface of the second silicon oxide layer 35 including the damaged layers 15 of the second substrate 22. Hereinafter, the second silicon oxide layer 35 is referred to as the silicon oxide layer 12.

For example, the bonding is performed by heat treatment at about 1,100° C. for about 2 hours.

Figure 14D:
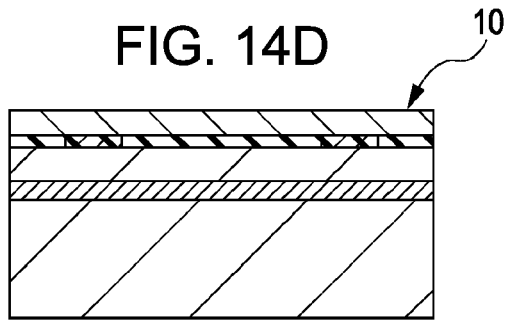

The same steps as described above are then performed to afford the SOI substrate 10 as shown in FIG. 14D.

In the foregoing production method, The split layer 17 may be formed at a deeper position, thus increasing the thickness of the silicon layer 13 of a portion of the first substrate 21 left on the second substrate 22 serving as the silicon substrate 11 without forming the epitaxially grown silicon layer 16.

In the third example of the method for producing the SOI substrate 10, the formation of the damaged layers 15 of impurity-doped regions arranged in the silicon oxide layer 12 results in cleavage of bonds between oxygen (O) atoms and silicon (Si) atoms in the silicon oxide layer 12. The metal contaminant in the silicon layer 13 passes readily through the damaged layers 15 and thus diffuses into the silicon substrate 11. The metal contaminant diffused in the silicon substrate 11 is trapped in the gettering layer 14.

The metal contaminant in the silicon layer 13 is efficiently trapped in the gettering layer 14 through the damaged layers 15. Thus, the SOI substrate 10 with a high gettering ability can be advantageously provided.

Fourth Example of Method for Producing SOI Substrate

A fourth example of a method for producing a SOI substrate according to the second embodiment will be described with reference to FIGS. 15A to 15F which are schematic cross-sectional views.

Figure 15A:
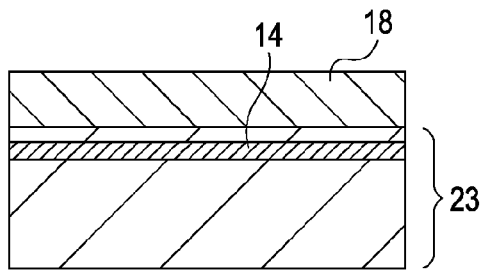
FIGS. 15A to 15F are cross-sectional views illustrating the steps in a fourth example of the method for a SOI substrate according to the second embodiment.

As shown in FIG. 15A, the gettering layer 14 is formed in a silicon substrate 23. The gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5 \times 10^{13}$ cm$^{-2}$ or more and desirably $5 \times 10^{14}$ cm$^{-2}$ or more.

Heat treatment is then performed to recover damage. For example, the heat treatment is performed at 1,000° C. for 10 minutes.

A first epitaxially grown silicon layer 18 composed of silicon is formed on the silicon substrate 23 by epitaxial growth.

In the epitaxial growth, the epitaxially grown silicon layer having a thickness of, for example, about 2 µm is formed at a substrate temperature of, for example, 1,100° C. The thickness of the first epitaxially grown silicon layer 18 is appropriately determined.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

Figure 15B:
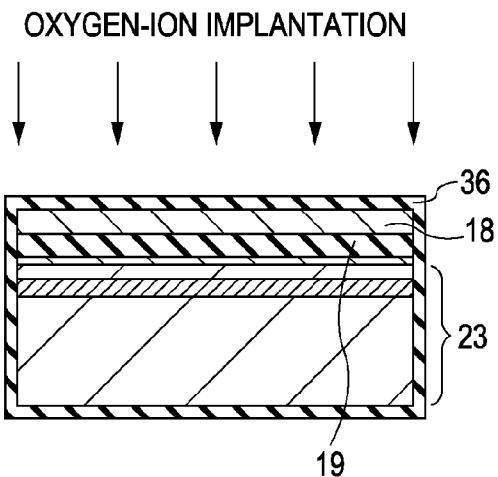

As shown in FIG. 15B, an oxide film 36 is formed on surfaces of the silicon substrate 23 and the first epitaxially grown silicon layer 18.

Then oxygen is ion-implanted to form a silicon oxide layer 19 in the first epitaxially grown silicon layer 18. That is, after oxygen ions are ion-implanted at a dose of about $1 \times 10^{17}$ cm$^{-2}$, high-temperature heat treatment is performed at 1,200° C. or higher to form a SIMOX structure.

Figure 15C:
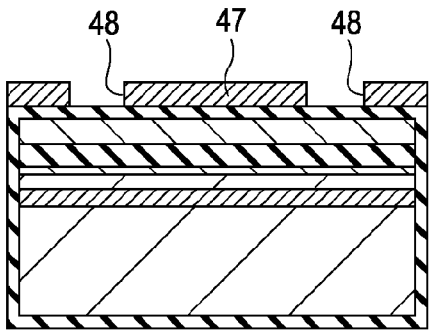

As shown in FIG. 15C, a resist film 47 is formed on the oxide film 36 arranged on the first epitaxially grown silicon layer 18. Then openings 48 are formed by lithography on regions to be formed into damaged layers through which a metal contaminant in the silicon oxide layer 19.

Figure 15D:
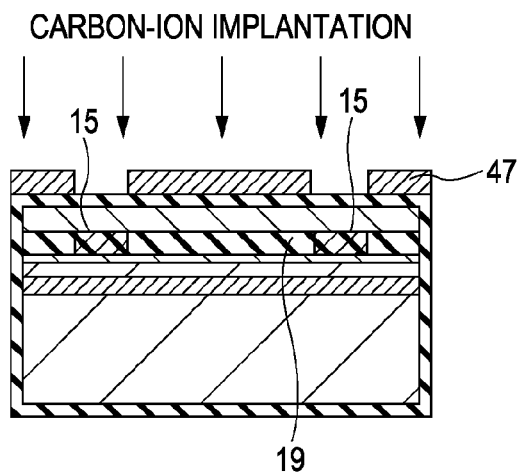

As shown in FIG. 15D, an impurity is implanted into the silicon oxide layer 19 with the resist film 47 as a mask for ion implantation to form the damaged layers 15 of impurity-doped regions.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

Figure 15E:
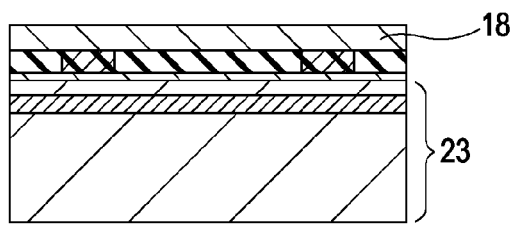

As shown in FIG. 15E, the exposed oxide film 36 (see FIG. 15B) is removed to expose the first epitaxially grown silicon layer 18, the silicon substrate 23, and the like.

Figure 15F:
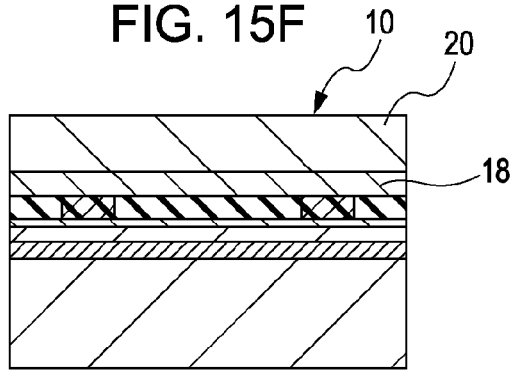

As shown in FIG. 15F, an epitaxially grown silicon layer 20 is formed on the first epitaxially grown silicon layer 18 by epitaxial growth.

In the epitaxial growth, the epitaxially grown silicon layer having a thickness of, for example, 3 µm is formed at a substrate temperature of, for example, 1,100° C. The thickness of the epitaxially grown silicon layer is appropriately determined.

For example, to form a photoelectric conversion unit in the first epitaxially grown silicon layer 18 and the epitaxially grown silicon layer 20, the total thickness of the first epitaxially grown silicon layer 18 and the epitaxially grown silicon layer 20 is preferably 3 µm or more. In particular, for the formation of a photoelectric conversion unit sensitive to longer wavelengths, the total thickness of the first epitaxially grown silicon layer 18 and the epitaxially grown silicon layer 20 is preferably about 6 μm. Thus, the first epitaxially grown silicon layer 18 and the epitaxially grown silicon layer 20 are formed in such a manner that the total thickness is in the range of about 6 μm to about 8 μm. This allows the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

In the production method described above, the first epitaxially grown silicon layer 18 is formed after the formation of the gettering layer 14. The first epitaxially grown silicon layer 18 is formed in order that the gettering layer 14 is located deeper than the silicon oxide layer 19 (oxygen-implanted region). In the case where adjustment can be made by the implantation depth of carbon ions or oxygen ions, the first epitaxially grown silicon layer 18 is not necessarily formed. However, the formation of the first epitaxially grown silicon layer 18 is often preferred because of improvement in the flexibility of depth and a reduction in the number of as-grown defects contained in a CZ crystal of the silicon substrate 23 composed of a single-crystal silicon.

In the fourth example of the method for producing the SOI substrate 10, the formation of the damaged layers 15 of impurity-doped regions arranged in the silicon oxide layer 19 results in cleavage of bonds between oxygen (O) atoms and silicon (Si) atoms in the silicon oxide layer 19. A metal contaminant in the first epitaxially grown silicon layer 18 and the epitaxially grown silicon layer 20 passes readily through the damaged layers 15 and thus diffuses into the silicon substrate 23. The metal contaminant diffused in the silicon substrate 23 is trapped in the gettering layer 14.

The metal contaminant in the first epitaxially grown silicon layer 18 and the epitaxially grown silicon layer 20 is efficiently trapped in the gettering layer 14 through the damaged layers 15. Thus, the SOI substrate 10 with a high gettering ability can be advantageously provided.

Fifth Example of Method for Producing SOI Substrate

A fifth example of a method for producing a SOI substrate according to the second embodiment will be described with reference to FIGS. 16A to 16D showing cross-sectional views illustrating the steps in the method.

First, the SOI substrate 10 is formed through the steps described in FIGS. 7A to 8J.

The resulting SOI substrate 10 is then subjected to the following steps.

Figure 16A:
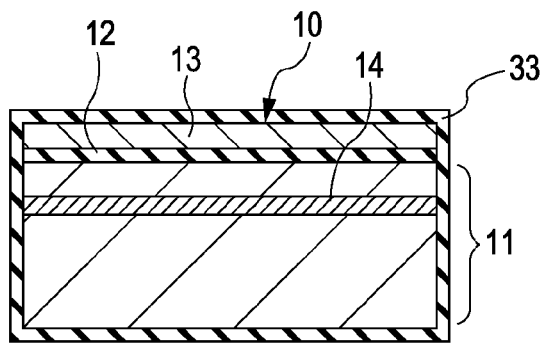
FIGS. 16A to 16D are cross-sectional views illustrating the steps in a fifth example of the method for a SOI substrate according to the second embodiment.

As shown in FIG. 16A, the SOI substrate 10 including the gettering layer 14 in the silicon substrate 11 and the silicon layer 13 arranged on the silicon substrate 11 with the silicon oxide layer 12 is prepared. The oxide film 33 is formed on surfaces of the SOI substrate 10.

Figure 16C:
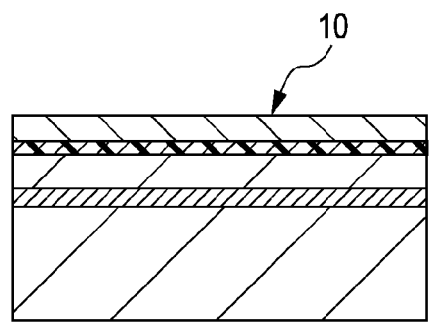
Figure 16B:
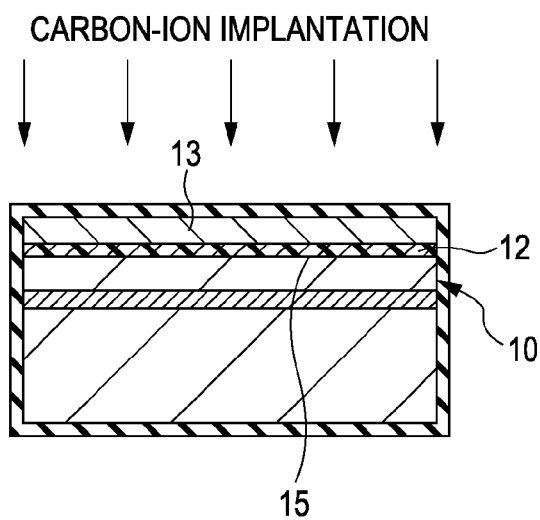

As shown in FIG. 16B, an impurity is entirely implanted from a surface adjacent to the silicon layer 13 to form the damaged layer 15 of an impurity-doped region in the silicon oxide layer 12. The damaged layer 15 is arranged through the entirety of the silicon oxide layer 12 in the in-plan direction and is entirely or partially arranged in the silicon oxide layer 12 in the thickness direction. That is, the damaged layer 15 is arranged within the silicon oxide layer 12 and does not extend to the silicon layer 13. For example, the damaged layer 15 is formed in such a manner that the silicon oxide layer 12 having a thickness of 1 μm or less is left on the side of the silicon layer 13. The damaged layer 15 may extend from the inside of the silicon oxide layer 12 to the interface between the silicon oxide layer 12 and the silicon layer 13. Details have been described above with reference to FIGS. 5A to 5F.

In the ion implantation, for example, carbon is used as the impurity (element implanted). In the case of the silicon layer 13 having a thickness of about 0.3 μm and the silicon oxide layer 12 having a thickness of about 0.3 μm, the implantation energy is set to 200 keV, and the dose level is set to $1\times10^{14}$ $cm^{-2}$. Conditions of the ion implantation of carbon are determined in response to the thicknesses of the silicon layer 13, the silicon oxide layer 12, and the like, and the positional relationship between the silicon oxide layer 12 and the damaged layer 15 shown in FIGS. 5A to 5F. The conditions are not limited to the foregoing conditions.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

As shown in FIG. 16C, the oxide film 33 (see FIG. 16A) is removed to expose the SOI substrate 10. The figure shows a state in which the oxide film 33 is removed.

Figure 16D:
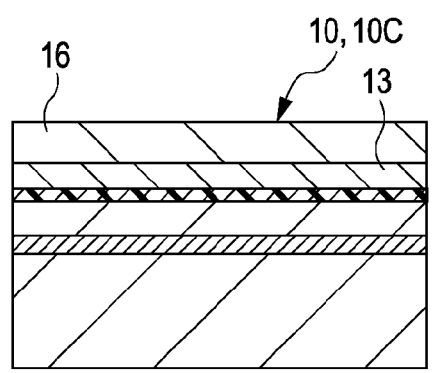

As shown in FIG. 16D, the epitaxially grown silicon layer 16 is formed on the silicon layer 13 by epitaxial growth.

In the epitaxial growth, the epitaxially grown silicon layer 16 having a thickness of, for example, about 3 μm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 μm or more. Usually, the silicon layer 13 has a thickness of 1 μm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 μm. Thus, the formation of the epitaxially grown silicon layer 16 having a thickness of about 6 μm to about 8 μm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 (10C) is completed.

In the fifth example of the production method, the epitaxially grown silicon layer 16 is formed on the silicon layer 13. The silicon layer 13 with an increased thickness may be formed without forming the epitaxially grown silicon layer 16. In this case, the projected range is increased in the ion implantation for the formation of the damaged layer 15; hence, the implantation energy is determined in response to the projected range.

In the fifth example of the method for producing the SOI substrate 10, the formation of the damaged layer 15 of the impurity-doped region arranged in the silicon oxide layer 12 results in cleavage of bonds between oxygen (O) atoms and silicon (Si) atoms in the silicon oxide layer 12. The metal contaminant entirely present in the silicon layer 13 passes readily through the damaged layer 15 entirely arranged. Thus, the metal contaminant diffuses more readily into the silicon substrate 11. The metal contaminant diffused in the silicon substrate 11 is trapped in the gettering layer 14.

The metal contaminant entirely present in the silicon layer 13 is more efficiently trapped in the gettering layer 14 through the damaged layer 15. Thus, the SOI substrate 10 with a high gettering ability can be advantageously provided.

Sixth Example of Method for Producing SOI Substrate

A sixth example of a method for producing a SOI substrate according to the second embodiment will be described with reference to FIGS. 17A to 18L which are schematic cross-sectional views.

As shown in FIG. 17A, the first substrate 21 is prepared. As the first substrate 21, for example, a silicon substrate is used.

As shown in FIG. 17, the silicon oxide layer 12 is formed on surfaces of the first substrate 21 by thermal oxidation so as to have a thickness of, for example, 500 nm.

As shown in FIG. 17C, a split layer 17 is formed in the first substrate 21 by ion implantation. For example, the split layer 17 is formed in such a manner that a portion of the first substrate 21 can be separated in a subsequent step, the portion having a thickness of, for example, about 0.1 μm to about 1 μm.

In the ion implantation described above, the implantation of hydrogen ions results in the fragile split layer 17 to be formed into split surfaces.

For example, conditions of the ion implantation are determined in such a manner that hydrogen is implanted at a several hundreds of kiloelectron volts corresponding to a projected range (Rp) of about 1 μm.

In the ion implantation, an impurity other than hydrogen can be used. For example, an inert element such as helium (He) can be used.

As shown in FIG. 17D, an impurity is implanted into the entire surface of the silicon oxide layer 12 to form the damaged layer 15 of an impurity-doped region. The damaged layer 15 is arranged through the entirety of the silicon oxide layer 12 in the in-plan direction and is entirely or partially arranged in the silicon oxide layer 12 in the thickness direction. That is, the damaged layer 15 is arranged within the silicon oxide layer 12. In this case, a surface of the silicon oxide layer 12 serves as a bonding surface in the subsequent step of bonding substrates to each other; hence, the damaged layer 15 is preferably arranged within the silicon oxide layer 12 so as not to be exposed to the outside. The damaged layer 15 is preferably formed in such a manner that the silicon oxide layer 12 having a thickness of, for example, 1 μm or less is left on the surface side of the silicon oxide layer 12. Details have been described above with reference to FIGS. 5D to 5F.

Conditions of the ion implantation are determined in response to the thickness of the silicon oxide layer 12 and the positional relationship between the silicon oxide layer 12 and the damaged layer 15 shown in FIGS. 5D to 5F.

As the impurity used in the formation of the damaged layer 15 by ion implantation, carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used. Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

Here, the second substrate 22 to be bonded to the silicon oxide layer 12 will be described.

As shown in FIG. 17E, the second substrate 22 is prepared. As the second substrate 22, for example, a single-crystal silicon substrate is used.

As shown in FIG. 17F, the oxide film 31 is formed on surfaces of the second substrate 22 by thermal oxidation or the like so as to have a thickness of, for example, 20 nm to 100 nm.

As shown in FIG. 17G, the gettering layer 14 is formed in the second substrate 22 by ion implantation. For example, the gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5 \times 10^{13}$ $cm^{-2}$ or more and desirably $5 \times 10^{14}$ $cm^{-2}$ or more. For example, in the case of performing ion implantation through the oxide film 31 having a thickness of about 20 nm, ion implantation is performed at an implantation energy of 150 keV and a dose of $1 \times 10^{15}$ $cm^{-2}$.

Then heat treatment is performed to recover damage. For example, heat treatment is performed at 1,000° C. for 10 minutes.

As shown in FIG. 17H, the oxide film 31 (see FIG. 17G) formed on the surfaces of the second substrate 22 is removed.

The figure shows a state in which the oxide film 31 is removed.

Thereby, the second substrate 22 is completed.

Figure 18I:
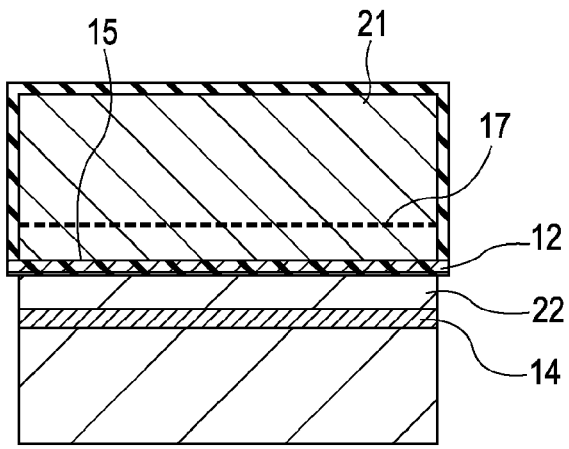
FIGS. 18I to 18L are cross-sectional views illustrating the steps in the sixth example of the method for a SOI substrate according to the second embodiment.

As shown in FIG. 18I, the first substrate 21 is turned upside down. The second substrate 22 is bonded to a surface of the silicon oxide layer 12 adjacent to the damaged layer 15. In this case, a surface of the second substrate 22 adjacent to the gettering layer 14 is bonded.

For example, the bonding is performed by heat treatment at about 1,100° C. for about 2 hours.

Figure 18L:
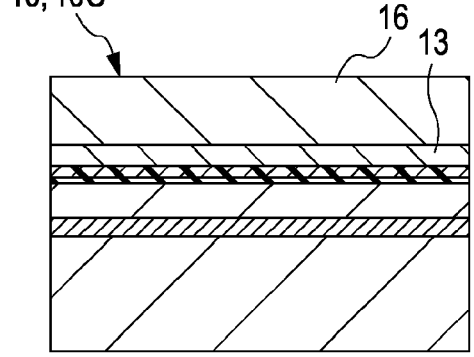
Figure 18J:
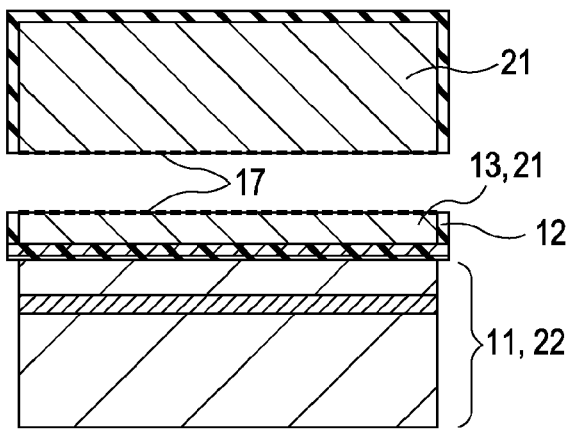

As shown in FIG. 18J, the first substrate 21 is separated at the split layer 17.

As a result, the second substrate 22 serves as the silicon substrate 11. The silicon layer 13 formed of a portion of the first substrate 21 left on the silicon substrate 11 is arranged on the silicon oxide layer 12.

Figure 18K:
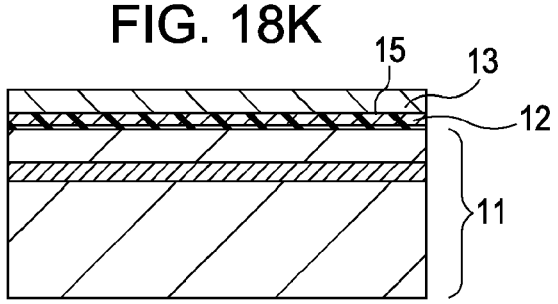

As shown in FIG. 18K, a surface (split surface) of the silicon layer 13 on the silicon substrate 11 with the silicon oxide layer 12 (including the damaged layer 15) is subjected to planarization treatment. The planarization treatment is performed by, for example, hydrogen annealing and polishing. The polishing is performed by, for example, chemical mechanical polishing (CMP).

Furthermore, etching for removing a natural oxide film on the surface of the silicon layer 13 may be performed. In this case, the silicon oxide layer 12 (see FIG. 18J and other figures) formed on side surfaces of the silicon layer 13 is also removed. Moreover, bevel treatment is performed, if necessary.

As shown in FIG. 18L, the epitaxially grown silicon layer 16 may be formed on the silicon layer 13 by epitaxial growth.

In the epitaxial growth, the epitaxially grown silicon layer 16 having a thickness of, for example, 3 μm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 μm or more. The silicon layer 13 usually has a thickness of 1 μm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 μm. Thus, the formation of the epitaxially grown silicon layer 16 having a thickness of about 6 μm to about 8 μm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 (10C) is completed.

In the foregoing production method, The split layer 17 may be formed at a deeper position, thus increasing the thickness of the silicon layer 13 of a portion of the first substrate 21 left on the second substrate 22 serving as the silicon substrate 11 without forming the epitaxially grown silicon layer 16.

In the sixth example of the method for producing the SOI substrate 10, the formation of the damaged layers 15 of impurity-doped regions arranged in the silicon oxide layer 12 results in cleavage of bonds between oxygen (O) atoms and silicon (Si) atoms in the silicon oxide layer 12. The metal contaminant entirely present in the silicon layer 13 passes readily through the damaged layer 15 and thus diffuses into the silicon substrate 11. The metal contaminant diffused in the silicon substrate 11 is trapped in the gettering layer 14.

The metal contaminant entirely present in the silicon layer 13 is efficiently trapped in the gettering layer 14 through the damaged layers 15. Thus, the SOI substrate 10 with a high gettering ability can be advantageously provided.

Seventh Example of Method for Producing SOI Substrate

As example of a method for producing a SOI substrate according to the second embodiment will be described with reference to FIGS. 19A to 20K which are schematic cross-sectional views.

As shown in FIG. 19A, the first substrate 21 is prepared. As the first substrate 21, for example, a single-crystal silicon substrate is used.

As shown in FIG. 19B, a first silicon oxide layer 34 is formed on surfaces of the first substrate 21 by thermal oxidation so as to have a thickness of, for example, 500 nm.

As shown in FIG. 19C, a split layer 17 is formed in the first substrate 21 by ion implantation. For example, the split layer 17 is formed in such a manner that a portion of the first substrate 21 can be separated in a subsequent step, the portion having a thickness of, for example, about 0.1 μm to about 1 μm.

In the ion implantation described above, the implantation of hydrogen ions results in the fragile split layer 17 to be formed into split surfaces.

For example, conditions of the ion implantation are determined in such a manner that hydrogen is implanted at a several hundreds of kiloelectron volts corresponding to a projected range (Rp) of about 1 μm.

In the ion implantation, an impurity other than hydrogen can be used. For example, an inert element such as helium (He) can be used.

As shown in FIG. 19D, the second substrate 22 is bonded to a surface of the first silicon oxide layer 34 adjacent to the split layer 17.

The second substrate 22 is formed as follows.

As shown in FIG. 19E, the second substrate 22 is prepared. As the second substrate 22, a single-crystal silicon substrate is used.

As shown in FIG. 19F, a second silicon oxide layer 35 is formed on surfaces of the second substrate 22 by thermal oxidation so as to have a thickness of, for example, 100 nm.

As shown in FIG. 19G, the gettering layer 14 is formed in the second substrate 22 by ion implantation. For example, the gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5\times10^{13}$ cm$^{-2}$ or more and desirably $5\times10^{14}$ cm$^{-2}$ or more. For example, in the case of performing ion implantation through the second silicon oxide layer 35 having a thickness of about 100 nm, ion implantation is performed at an implantation energy of 150 keV and a dose of $1\times10^{15}$ cm$^{-2}$.

Heat treatment is then performed to recover damage. For example, the heat treatment is performed at 1,000° C. for 10 minutes.

As shown in FIG. 19H, an impurity is implanted into the entire surface of the second silicon oxide layer 35 to form the damaged layer 15 of an impurity-doped region. The damaged layer 15 is arranged through the entirety of the second silicon oxide layer 35 in the in-plan direction and is entirely or partially arranged in the second silicon oxide layer 35 in the thickness direction. That is, the damaged layer 15 is arranged within the second silicon oxide layer 35. In this case, a surface of the second silicon oxide layer 35 serves as a bonding surface in the subsequent step of bonding substrates to each other; hence, the damaged layer 15 is preferably arranged within the second silicon oxide layer 35 so as not to be exposed to the outside. The damaged layer 15 is preferably formed in such a manner that the second silicon oxide layer 35 having a thickness of, for example, 1 μm or less is left on the surface side of the second silicon oxide layer 35. Details have been described above with reference to FIGS. 5D to 5F.

Conditions of the ion implantation are determined in response to the thickness of the silicon oxide layer 12 and the positional relationship between the silicon oxide layer 12 and the damaged layer 15 shown in FIGS. 5D to 5F.

In the ion implantation, for example, carbon is used as the impurity (element implanted).

In this case, a surface of the second silicon oxide layer 35 serves as a bonding surface in the subsequent step of bonding substrates to each other; hence, the damaged layer 15 is preferably formed within the second silicon oxide layer 35 so as not to be exposed to the outside.

As the impurity used in the formation of the damaged layer 15 by ion implantation, carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used. Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

Thereby, the second substrate 22 is completed.

As described in FIG. 19D, the surface of the first silicon oxide layer 34 adjacent to the split layer 17 is bonded to a surface of the second silicon oxide layer 35 of the second substrate 22.

For example, the bonding is performed by heat treatment at about 1,100° C. for about 2 hours.

Figure 20I:
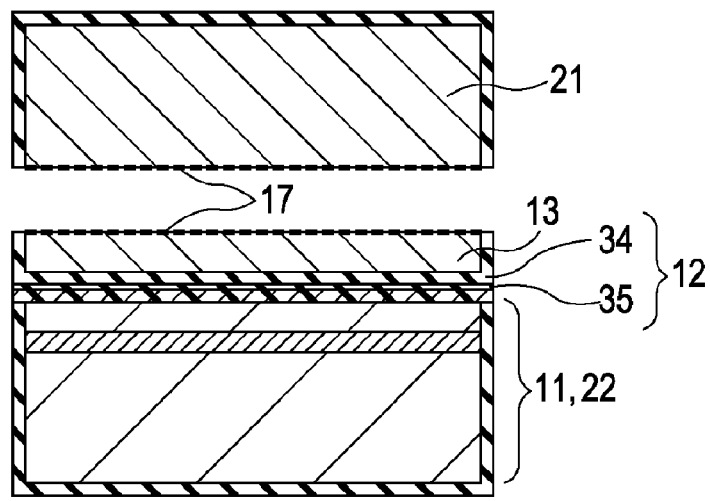
FIGS. 20I to 20K are cross-sectional views illustrating the steps in the seventh example of the method for a SOI substrate according to the second embodiment.

As shown in FIG. 20I, the first substrate 21 is separated at the split layer 17.

As a result, the second substrate 22 serves as the silicon substrate 11. The silicon layer 13 formed of a portion of the first substrate 21 left on the silicon substrate 11 is arranged on the silicon oxide layer 12. The silicon oxide layer 12 includes the first silicon oxide layer 34 and the second silicon oxide layer 35 bonded thereto.

Figure 20J:
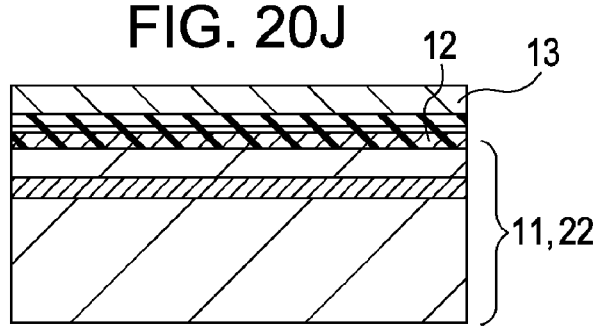

As shown in FIG. 20J, a surface (split surface) of the silicon layer 13 on the silicon substrate 11 with the silicon oxide layer 12 is subjected to planarization treatment. The planarization treatment is performed by, for example, hydrogen annealing and polishing. The polishing is performed by, for example, chemical mechanical polishing (CMP).

Furthermore, etching for removing a natural oxide film on the surface of the silicon layer 13 may be performed. In this case, the silicon oxide layer 12 (see FIG. 20I and other figures) formed on side surfaces of the silicon layer 13 and the surfaces of the second substrate 22 is also removed. Moreover, bevel treatment is performed, if necessary.

Thereby, the SOI substrate 10 (10C) is completed.

Figure 20K:
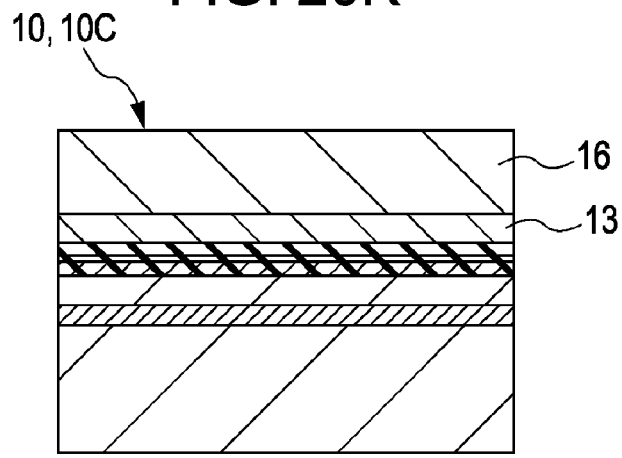

As shown in FIG. 20K, the epitaxially grown silicon layer 16 may be formed on the silicon layer 13 by epitaxial growth.

In the epitaxial growth, the epitaxially grown silicon layer 16 having a thickness of, for example, 3 μm is formed at a substrate temperature of, for example, 1,100° C. The thickness of the epitaxially grown silicon layer 16 is appropriately determined.

For example, to form a photoelectric conversion unit in the epitaxially grown silicon layer 16, the epitaxially grown silicon layer 16 preferably has a thickness of 3 μm or more. The silicon layer 13 has a thickness of 1 μm or less. Thus, the formation of the epitaxially grown silicon layer 16 ensures a thickness adequate to form the photoelectric conversion unit. In particular, for the formation of a photoelectric conversion unit sensitive to longer wavelengths, the silicon layer preferably has a thickness of about 6 μm. Thus, the formation of the epitaxially grown silicon layer 16 having a thickness of about 6 μm to about 8 μm permits the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

With respect to conditions of the epitaxial growth, any of atmospheric-pressure CVD and low-pressure CVD may be used, and the growth temperature is determined so as to strike a balance between crystallinity and productivity.

Thereby, the SOI substrate 10 (10C) is completed.

Figure 21A:
FIGS. 21A to 21D are cross-sectional views illustrating the steps in an eighth example of the method for a SOI substrate according to the second embodiment.
Figure 21B:
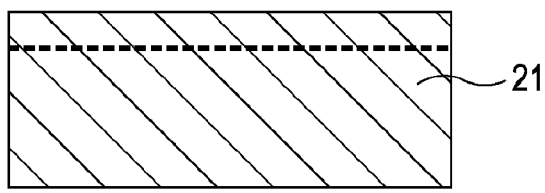

In the seventh example of the method for producing the SOI substrate 10, as shown in FIG. 21A, after the split layer 17 is formed in the first substrate 21, the first silicon oxide layer 34 formed on the surfaces of the first substrate 21 is removed to expose the first substrate 21 as shown in FIG. 21B.

Figure 21C:
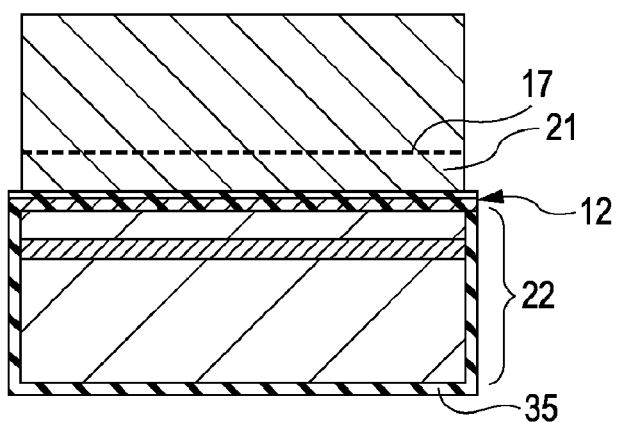

As shown in FIG. 21C, a surface of the first substrate 21 adjacent to the split layer 17 is bonded to a surface of the second silicon oxide layer 35 of the second substrate 22. Hereinafter, the second silicon oxide layer 35 is referred to as the silicon oxide layer 12.

For example, the bonding is performed by heat treatment at about 1,100° C. for about 2 hours.

Figure 21D:
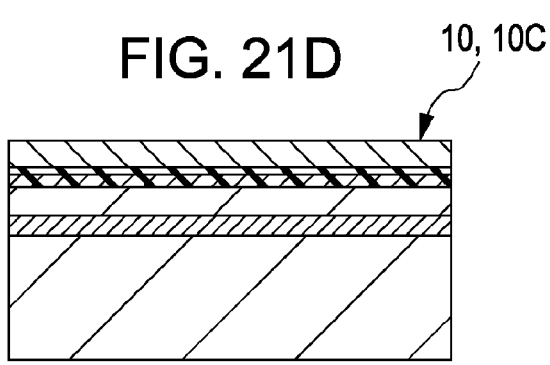

The same steps as described above are then performed to afford the SOI substrate 10 (10C) as shown in FIG. 21D.

In the foregoing production method, The split layer 17 may be formed at a deeper position, thus increasing the thickness of the silicon layer 13 of a portion of the first substrate 21 left on the second substrate 22 serving as the silicon substrate 11 without forming the epitaxially grown silicon layer 16.

In the seventh example of the method for producing the SOI substrate, the formation of the damaged layer 15 of the impurity-doped region arranged over the entire the silicon oxide layer 12 results in cleavage of bonds between oxygen (O) atoms and silicon (Si) atoms in the silicon oxide layer 12. The metal contaminant entirely present in the silicon layer 13 passes readily through the damaged layer 15. Thus, the metal contaminant diffuses more readily into the silicon substrate 11. The metal contaminant diffused in the silicon substrate 11 is trapped in the gettering layer 14.

The metal contaminant entirely present in the silicon layer 13 is efficiently trapped in the gettering layer 14 through the damaged layer 15. Thus, the SOI substrate 10 with a high gettering ability can be advantageously provided.

Eighth Example of Method for Producing SOI Substrate

An eighth example of a method for producing a SOI substrate according to the second embodiment will be described with reference to FIGS. 22A to 22E which are schematic cross-sectional views.

Figure 22A:
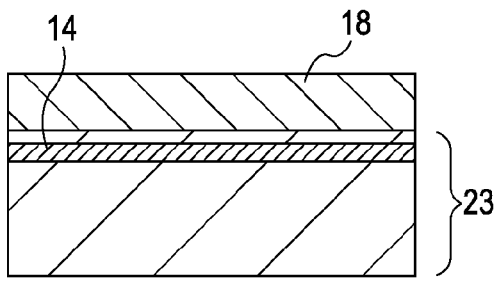
FIGS. 22A to 22E are cross-sectional views illustrating the steps in the eighth example of the method for a SOI substrate according to the second embodiment.

As shown in FIG. 22A, the gettering layer 14 is formed in a silicon substrate 23. The gettering layer 14 is formed by ion implantation of one element selected from carbon (C), oxygen (O), argon (Ar), silicon (Si), helium (He), phosphorus (P), arsenic (As), antimony (Sb), and boron (B).

In this example, the gettering layer 14 is formed by ion implantation of carbon into the second substrate 22 at a dose of, for example, $5 \times 10^{13}$ $cm^{-2}$ or more and desirably $5 \times 10^{14}$ $cm^{-2}$ or more.

Heat treatment is then performed to recover damage. For example, the heat treatment is performed at 1,000° C. for 10 minutes.

A first epitaxially grown silicon layer 18 composed of silicon is formed on the silicon substrate 23 by epitaxial growth.

In the epitaxial growth, the epitaxially grown silicon layer having a thickness of, for example, about 2 μm is formed at a substrate temperature of, for example, 1,100° C. The thickness of the first epitaxially grown silicon layer 18 is appropriately determined.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

Figure 22C:
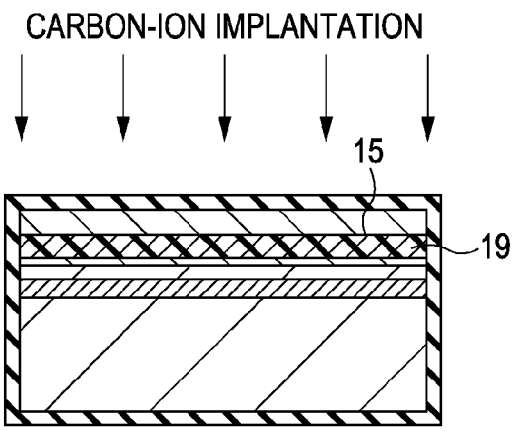
Figure 22B:
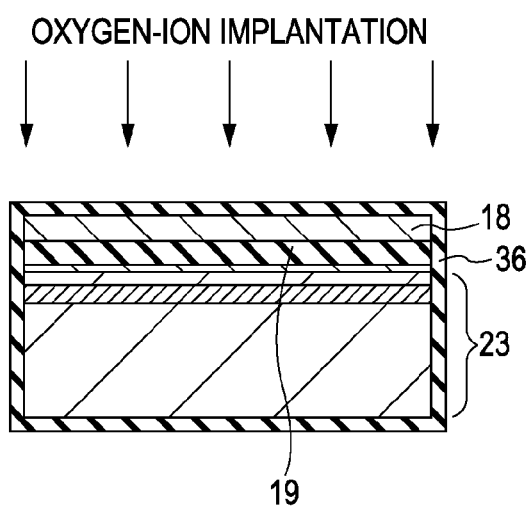

As shown in FIG. 22B, an oxide film 36 is formed on surfaces of the silicon substrate 23 and the first epitaxially grown silicon layer 18.

Then oxygen is ion-implanted to form a silicon oxide layer 19 in the first epitaxially grown silicon layer 18. That is, after oxygen ions are ion-implanted at a dose of about $1\times10^{17}$ $cm^{-2}$, high-temperature heat treatment is performed at 1,200° C. or higher to form a SIMOX structure.

As shown in FIG. 22C, an impurity is implanted into the silicon oxide layer 19 by ion implantation to form the damaged layer 15 of an impurity-doped region. The damaged layer 15 is arranged through the entirety of the silicon oxide layer 19 in the in-plane direction and is entirely or partially arranged in the silicon oxide layer 19 in the thickness direction. That is, the damaged layer 15 is arranged within the silicon oxide layer 19 and does not extend to the first epitaxially grown silicon layer 18. For example, the damaged layer 15 is formed in such a manner that the silicon oxide layer 19 having a thickness of, for example, 1 μm or less is left on the side of the first epitaxially grown silicon layer 18. Thus, The damaged layer 15 may extend from the inside of the silicon oxide layer 19 to the interface between the silicon oxide layer 19 and the first epitaxially grown silicon layer 18. Details have been described above with reference to FIGS. 5A to 5F.

In the ion implantation, for example, carbon is used as the impurity (element implanted). In this case of the first epitaxially grown silicon layer 18 having a thickness of about 0.3 μm and the silicon oxide layer 19 having a thickness of about 0.3 μm, the implantation energy is set to 200 keV, and the dose level is set to $1\times10^{14}$ $cm^{-2}$. Conditions of the ion implantation of carbon are determined in response to the thicknesses of the first epitaxially grown silicon layer 18, the silicon oxide layer 19, and the like, and the positional relationship (shown in FIGS. 5A to 5F) between the damaged layer 15 and the silicon oxide layer 12 corresponding to the silicon oxide layer 19. The conditions are not limited to the foregoing conditions.

As the impurity used in the formation of the damaged layers 15 by ion implantation, silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), or oxygen (O) can be used in addition to carbon (C). Alternatively, a compound including one of the elements described above, a cluster including one of the elements, or several tens to several thousands of molecular cluster ions of one of the elements can be used. Examples of the compound of the element described above include CO, $CH_3$, SiF, and $PH_2$. Examples of the cluster include $H_2$, $Ar_2$, $P_4$, and $P_3$.

Figure 22D:
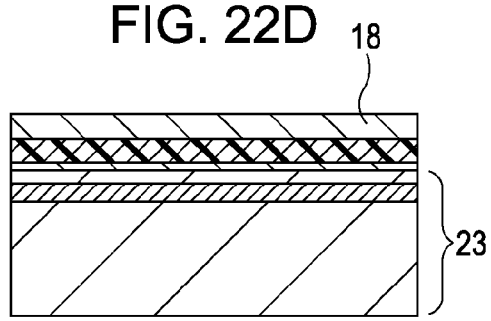

As shown in FIG. 22D, the exposed oxide film 36 (see FIG. 22B) is removed to expose the first epitaxially grown silicon layer 18 and the silicon substrate 23. The figure shows a state in which the oxide film 36 is removed.

Figure 22E:
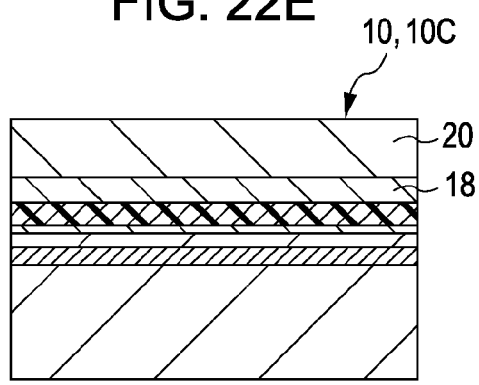

As shown in FIG. 22E, the epitaxially grown silicon layer 20 is formed on the first epitaxially grown silicon layer 18 by epitaxial growth.

Thereby, the SOI substrate 10 (10C) is completed.

In the epitaxial growth, the epitaxially grown silicon layer having a thickness of, for example, 3 μm is formed at a substrate temperature of, for example, 1,100° C. The thickness of the epitaxially grown silicon layer is appropriately determined.

For example, to form a photoelectric conversion unit in the first epitaxially grown silicon layer 18 and the epitaxially grown silicon layer 20, the total thickness of the first epitaxially grown silicon layer 18 and the epitaxially grown silicon layer 20 is preferably 3 μm or more. In particular, for the formation of a photoelectric conversion unit sensitive to longer wavelengths, the total thickness of the first epitaxially grown silicon layer 18 and the epitaxially grown silicon layer 20 is preferably about 6 μm. Thus, the first epitaxially grown silicon layer 18 and the epitaxially grown silicon layer 20 are formed in such a manner that the total thickness is in the range of about 6 μm to about 8 μm. This allows the formation of the photoelectric conversion unit sensitive to longer wavelengths.

Examples of a silicon source gas that can be used for the epitaxial growth of silicon include tetrachlorosilane ($SiCl_4$), trichlorosilane ($SiHCl_3$), dichlorosilane ($SiH_2Cl_2$), and monosilane ($SiH_4$), which are commonly used in semiconductor processes. For example, trichlorosilane ($SiHCl_3$) or dichlorosilane ($SiH_2Cl_2$) is used.

In the production method described above, the first epitaxially grown silicon layer 18 is formed after the formation of the gettering layer 14. The first epitaxially grown silicon layer 18 is formed in order that the gettering layer 14 is located deeper than the silicon oxide layer 19 (oxygen-implanted region). In the case where adjustment can be made by the implantation depth of carbon ions or oxygen ions, the first epitaxially grown silicon layer 18 is not necessarily formed. However, the formation of the first epitaxially grown silicon layer 18 is often preferred because of improvement in the flexibility of depth and a reduction in the number of as-grown defects contained in a CZ crystal of the silicon substrate 23 composed of a single-crystal silicon.

In the eighth example of the method for producing the SOI substrate 10, the formation of the damaged layer 15 of the impurity-doped region in the silicon oxide layer 19 results in cleavage of bonds between oxygen (O) atoms and silicon (Si) atoms in the silicon oxide layer 12. A metal contaminant entirely present in the first and second epitaxially grown silicon layers 18 and 20 passes readily through the damaged layer 15 and thus diffuses more readily into the silicon substrate 23. The metal contaminant diffused in the silicon substrate 23 is trapped in the gettering layer 14.

The metal contaminant entirely present in the first and second epitaxially grown silicon layers 18 and 20 is more efficiently trapped in the gettering layer 14 through the damaged layer 15. Thus, the SOI substrate 10 (10C) with a high gettering ability can be advantageously provided.

In each of the methods for producing the SOI substrates, the damaged layer 15 is formed by ion-implantation of, for example, carbon (C), oxygen (O), argon (Ar), silicon (Si), helium (He), phosphorus (P), arsenic (As), antimony (Sb), or boron (B). Thus, the damaged layer 15 can function not only as a layer configured to accelerate the diffusion of the metal contaminant but also as a gettering layer.

In this case, the gettering layer in the silicon substrate may not be formed.

In the case where the ion implantation to form the damaged layer 15 is performed from the silicon layer 13 side as in the first and fifth examples of the production method, unlike the related art, conditions of ion implantation relating to bonding strength are not limited. It is thus possible to form the damaged layer 15 having a higher gettering ability.

In the case where the epitaxially grown silicon layer 16 is formed on the silicon layer 13, preferably, the damaged layer 15 is formed in the silicon oxide layer 12 or 19 before the formation of the epitaxially grown silicon layer 16. In this case, the metal contaminant in the epitaxially grown silicon layer 16 can be effectively trapped.

3. Third Embodiment

Example of Structure of Solid-State Image Pickup Device

Figure 23:
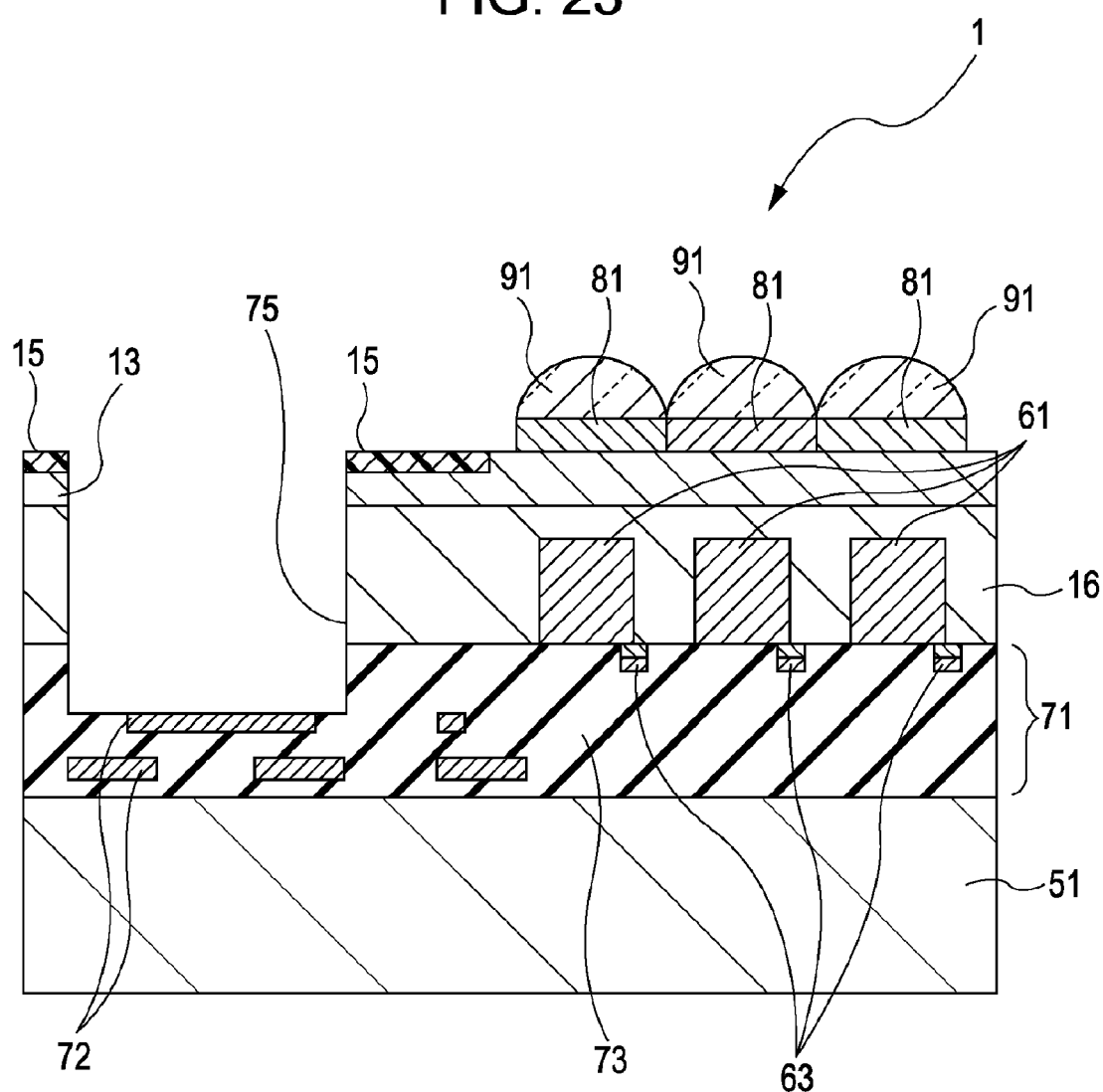
FIG. 23 is a schematic cross-sectional view illustrating an exemplary structure of a solid-state image pickup device according to a third embodiment of the present invention.

An exemplary structure of a solid-state image pickup device according to a third embodiment will be described with reference to FIG. 23 showing a schematic cross-sectional view. FIG. 23 shows an example of a solid-state image pickup device of a stacked whole-area-open-type CMOS image sensor.

As shown in FIG. 23, the silicon layer 13 and the epitaxially grown silicon layer 16 formed of a silicon layer grown on the silicon layer 13 of the SOI substrate are used as an active layer. Photoelectric conversion units 61, pixel transistors 63, and a peripheral circuit (not shown) are arranged in the epitaxially grown silicon layer 16.

In view of forming the photoelectric conversion units 61, for example, the epitaxially grown silicon layer 16 with a thickness of about 8 μm is adequate to form the photoelectric conversion units 61 sensitive to long wavelengths of near-infrared and infrared region. For example, the epitaxially grown silicon layer 16 with a thickness of 3 μm to 4 μm suffices to form the photoelectric conversion units 61 sensitive to visible light.

Color filter layers 81 are arranged on the silicon layer 13 and located in a path of light incident on the photoelectric conversion units 61.

Condensing lenses 91 configured to guide incident light to the photoelectric conversion units 61 are arranged on the color filter layers 81.

A wiring layer 71 including a plurality of sublayers of wirings 72 and an interlayer insulating film 73 configured to cover the wirings 72 is arranged on a surface of the epitaxially grown silicon layer 16 opposite the surface adjacent to an incident light side.

The wiring layer 71 is bonded to a support substrate 51. The support substrate 51 is formed of, for example, a silicon substrate. Alternatively, a glass substrate or a resin substrate can also be used.

The damaged layer 15 formed of an impurity-doped region is arranged on a portion of the silicon layer 13 located on an incident light side and outside the path of light incident on the photoelectric conversion units 61.

An opening 75 configured to reach the wirings 72 in the wiring layer 71 and to be used for connection of electrodes is formed.

A solid-state image pickup device 1 as a stacked whole-area-open-type CMOS image sensor has such a structure.

In the solid-state image pickup device 1, the damaged layer 15 formed of an impurity-doped region is arranged on a portion of the surface of the silicon layer 13 located outside the path of light incident on the photoelectric conversion units 61. The damaged layer 15 has a gettering effect on metal contaminants during a step of forming the color filter layers, a step of forming the condensing lenses, a step of forming an electrode connection portion, a step of assembling components, and the like. For example, in the step of forming the electrode connection portion, processing is performed so as to expose the wirings in the wiring layer. If the wirings are formed of metal wirings, metal contamination can occur. However, the metal contamination is prevented owing to the gettering effect.

The photoelectric conversion units 61 are arranged in the epitaxially grown silicon layer 16 of the SOI substrate 10 having a high gettering ability, thus significantly reducing the occurrence of a luminous dot and dark current. This makes it possible to advantageously provide the solid-state image pickup device 1 that can afford a high-quality image.

4. Fourth Embodiment

First Example of Method for Producing Solid-State Image Pickup Device

A first example of a method for producing a solid-state image pickup device according to a fourth embodiment of the present invention will be described with reference to FIGS. 24A to 25F showing cross-sectional views illustrating the steps in the method.

Figure 24A:
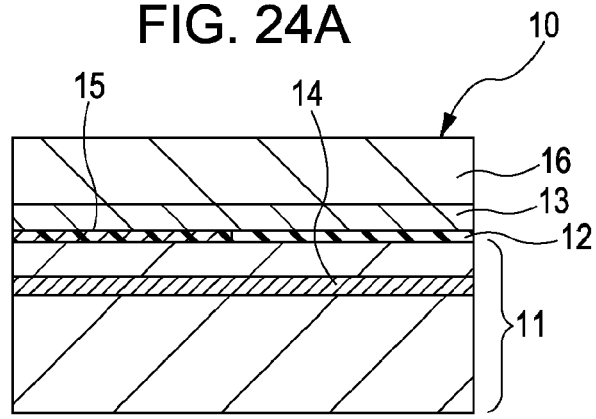
FIGS. 24A to 24C are cross-sectional views illustrating the steps in a first example of a method for producing a solid-state image pickup device according to a fourth embodiment of the present invention.

As shown in FIG. 24A, for example, the SOI substrate 10 described in FIG. 1 is used.

That is, the silicon oxide layer 12 (for example, also referred to as the "box layer") is arranged on the silicon substrate 11. As the silicon substrate 11, for example, a single-crystal silicon substrate is used. The silicon oxide layer 12 is overlaid with the silicon layer 13. The silicon layer 13 is formed by bonding the silicon oxide layer 12 to the single-crystal silicon substrate and reducing the thickness of the single-crystal silicon substrate.

The silicon substrate 11 includes the gettering layer 14.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

The damaged layer 15 formed of an impurity-doped region is arranged in the silicon oxide layer 12. The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound, a cluster, or several tens to several thousands of molecular cluster ions of one of the elements described above are implanted. Examples of the compound of the element described above include CO, $CH_3$, SiF, and $PH_2$. Examples of the cluster include $H_2$, $Ar_2$, $P_4$, and $P_3$.

The damaged layer 15 is arranged in a region except for a region (on which light is incident) where the photoelectric conversion units and transistors are formed in the epitaxially grown silicon layer 16 in the subsequent steps. For example, the damaged layer 15 is formed on an element isolation region or a scribe region.

The epitaxially grown silicon layer 16 formed of a silicon layer formed by epitaxial growth is arranged on the silicon layer 13. The epitaxially grown silicon layer 16 has a thickness of, for example, 3 μm to 8 μm. A thickness of the epitaxially grown silicon layer 16 of 3 μm meets the minimum thickness for the formation of the photoelectric conversion units of the solid-state image pickup device (e.g., image sensor). A thickness of the epitaxially grown silicon layer 16 of 8 µm meets the minimum thickness for the formation of the photoelectric conversion units, which are sensitive to longer wavelengths (e.g., near-infrared rays or infrared rays), of the solid-state image pickup device (e.g., image sensor).

The SOI substrate 10 has a structure described above.

Figure 24B:
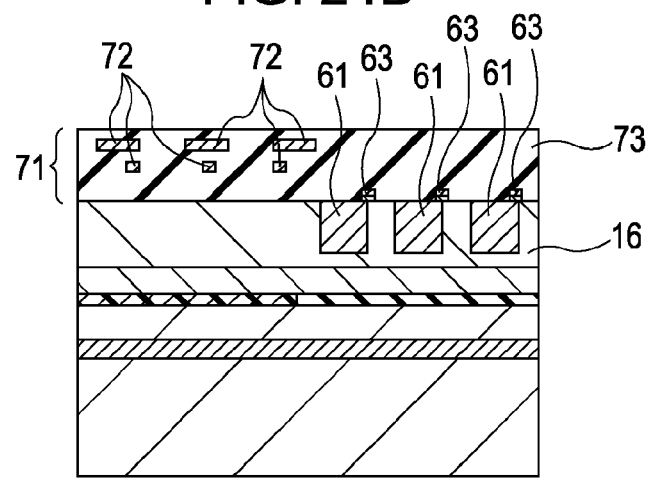

As shown in FIG. 24B, the photoelectric conversion units 61, the pixel transistors 63, and the peripheral circuit (not shown) are formed in the epitaxially grown silicon layer 16.

The wiring layer 71 is formed on the epitaxially grown silicon layer 16. The wiring layer 71 includes, for example, the wirings 72 and the interlayer insulating film 73 that covers the wirings 72.

Figure 24C:
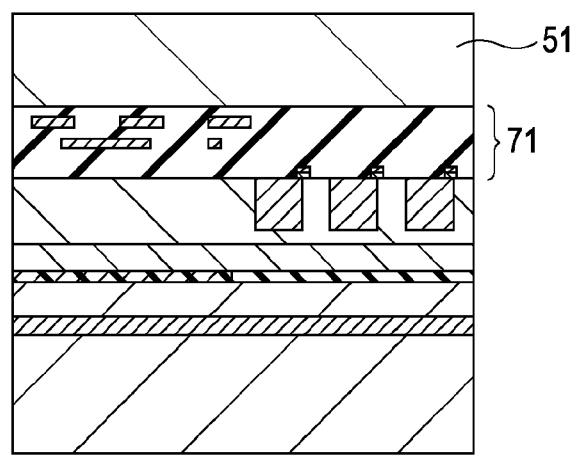

As shown in FIG. 24C, the wiring layer 71 is bonded to the support substrate 51. As the support substrate 51, a silicon substrate is used. Alternatively, a glass substrate or a resin substrate can be used. The bonding is performed with a heat-resistant resin or by plasma treatment.

Figure 25D:
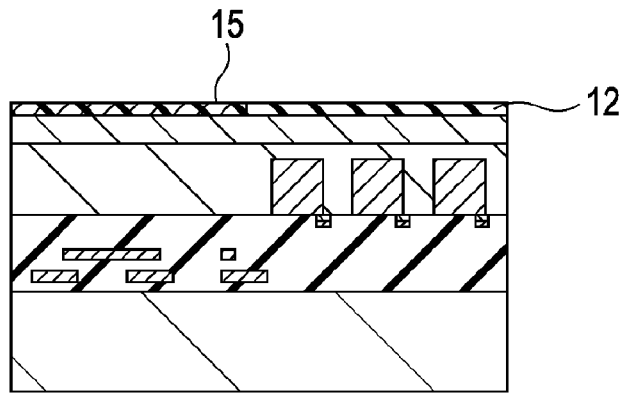
FIGS. 25D to 25F are cross-sectional views illustrating the steps in the first example of the method for producing a solid-state image pickup device according to the fourth embodiment of the present invention.

As shown in FIG. 25D, the silicon substrate 11 (see FIG. 24A) is removed to expose a surface of the silicon oxide layer 12. In the case where the damaged layer 15 extends to the interface between the silicon oxide layer 12 and the silicon substrate 11, when the surface of the silicon oxide layer 12 is exposed, a surface of the damaged layer 15 is also exposed. The silicon substrate 11 is removed by, for example, grinding, polishing, or etching.

Figure 25E:
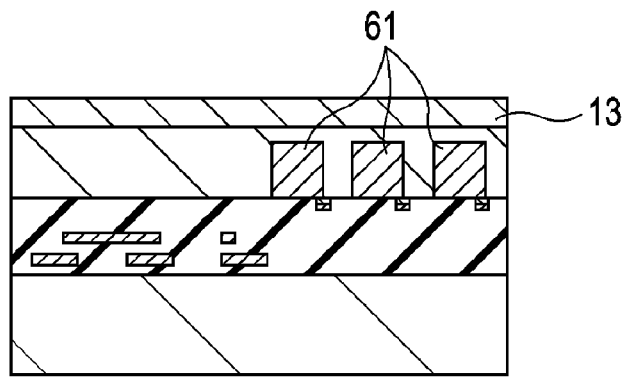

As shown in FIG. 25E, the silicon oxide layer 12 and the damaged layer 15 (see FIG. 25D) are removed to expose a surface of the silicon layer 13. The silicon oxide layer 12 and the damaged layer 15 are removed by, for example, etching.

Figure 25F:
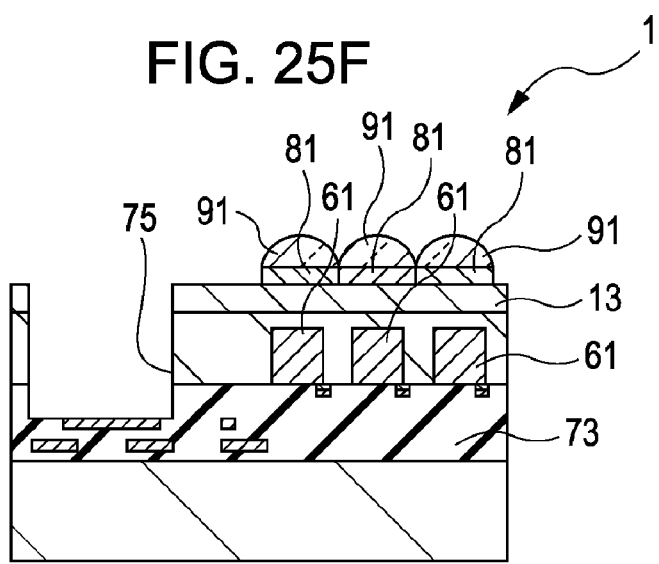

As shown in FIG. 25F, the color filter layers 81 are formed on a portion of the silicon layer 13, the portion being located in a path of light incident on the photoelectric conversion units 61. Then the condensing lenses 91 configured to guide incident light to the photoelectric conversion units 61 are formed on the color filter layers 81.

Thereby, the solid-state image pickup device 1 of a stacked whole-area-open-type CMOS image sensor is formed.

In the production method described above, the damaged layer 15 is formed in the region outside a region of the silicon oxide layer 12 on which light is incident. For example, the damaged layer 15 is formed in a portion of the silicon oxide layer 12 on an inactive region, such as a pad portion or a scribe portion.

In the first example of the method for producing a solid-state image pickup device, the formation of the damaged layer 15 of an impurity-doped region arranged in the silicon oxide layer 12 results in cleavage of bonds between oxygen (O) atoms and silicon (Si) atoms in the silicon oxide layer 12. A metal contaminant in the epitaxially grown silicon layer 16 and the silicon layer 13 passes readily through the damaged layer 15 and diffuses into the silicon substrate 11. The metal contaminant diffused in the silicon substrate 11 is trapped in the gettering layer 14, so that the photoelectric conversion units 61, the pixel transistors 63, and the peripheral circuit can be formed in the epitaxially grown silicon layer 16 free from metal contamination.

The photoelectric conversion units 61 are arranged in the epitaxially grown silicon layer 16 of the SOI substrate 10 having a high gettering ability, thus significantly reducing the occurrence of a luminous dot and dark current. This makes it possible to advantageously provide the solid-state image pickup device 1 that can afford a high-quality image.

Second Example of Method for Producing Solid-State Image Pickup Device

A second example of a method for producing a solid-state image pickup device according to the fourth embodiment will be described with reference to FIGS. 26A to 27F showing cross-sectional views illustrating the steps in the method.

Figure 26A:
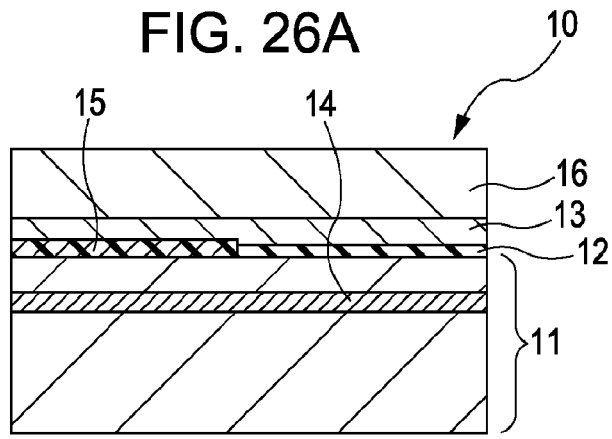
FIGS. 26A to 26C are cross-sectional views illustrating the steps in a second example of the method for producing a solid-state image pickup device according to the fourth embodiment of the present invention.

As shown in FIG. 26A, for example, the SOI substrate 10 described in FIG. 1 is used.

That is, the silicon oxide layer 12 (for example, also referred to as the "box layer") is arranged on the silicon substrate 11. As the silicon substrate 11, for example, a single-crystal silicon substrate is used. The silicon oxide layer 12 is overlaid with the silicon layer 13. The silicon layer 13 is formed by bonding the silicon oxide layer 12 to the single-crystal silicon substrate and reducing the thickness of the single-crystal silicon substrate.

The silicon substrate 11 includes the gettering layer 14.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

The damaged layer 15 formed of an impurity-doped region is arranged in the silicon oxide layer 12. The damaged layer 15 extends to the silicon layer 13.

The damaged layer 15 is arranged in a region except for a region (on which light is incident) where the photoelectric conversion units and transistors are formed in the epitaxially grown silicon layer 16 in the subsequent steps. For example, the damaged layer 15 is formed on an element isolation region or a scribe region.

The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound, a cluster, or several tens to several thousands of molecular cluster ions of one of the elements described above are implanted. Examples of the compound of the element described above include CO, $CH_3$, SiF, and $PH_2$. Examples of the cluster include $H_2$, $Ar_2$, $P_4$, and $P_3$.

The epitaxially grown silicon layer 16 formed of a silicon layer formed by epitaxial growth is arranged on the silicon layer 13. The epitaxially grown silicon layer 16 has a thickness of, for example, 3 µm to 8 µm. A thickness of the epitaxially grown silicon layer 16 of 3 µm meets the minimum thickness for the formation of the photoelectric conversion units of the solid-state image pickup device (e.g., image sensor). A thickness of the epitaxially grown silicon layer 16 of 8 µm meets the minimum thickness for the formation of the photoelectric conversion units, which are sensitive to longer wavelengths (e.g., near-infrared rays or infrared rays), of the solid-state image pickup device (e.g., image sensor).

The SOI substrate 10 has a structure described above.

Figure 26B:
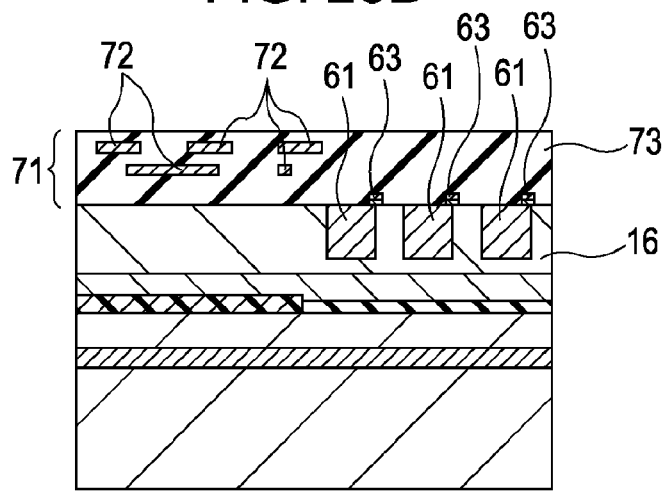

As shown in FIG. 26B, the photoelectric conversion units 61, the pixel transistors 63, and the peripheral circuit (not shown) are formed in the epitaxially grown silicon layer 16.

The wiring layer 71 is formed on the epitaxially grown silicon layer 16. The wiring layer 71 includes, for example, the wirings 72 and the interlayer insulating film 73 that covers the wirings 72.

Figure 26C:
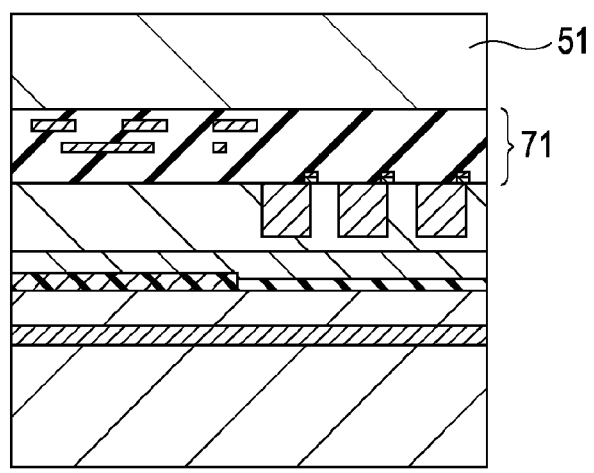

As shown in FIG. 26C, the wiring layer 71 is bonded to the support substrate 51. As the support substrate 51, a silicon substrate is used. Alternatively, a glass substrate or a resin substrate can be used.

Figure 27D:
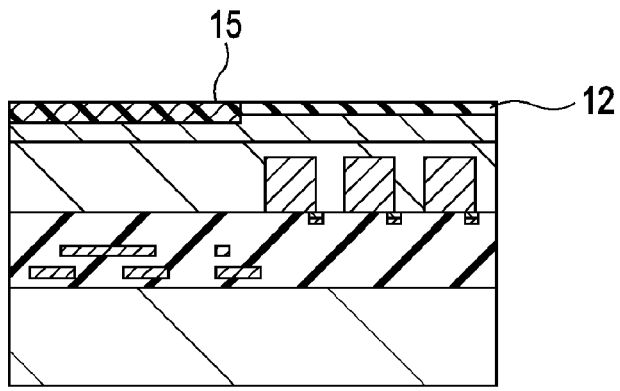
FIGS. 27D to 27F are cross-sectional views illustrating the steps in the second example of the method for producing a solid-state image pickup device according to the fourth embodiment of the present invention.

As shown in FIG. 27D, the silicon substrate 11 (see FIG. 26A) is removed to expose a surface of the silicon oxide layer 12. In the case where the damaged layer 15 extends to the interface between the silicon oxide layer 12 and the silicon substrate 11, when the surface of the silicon oxide layer 12 is exposed, a surface of the damaged layer 15 is also exposed. The silicon substrate 11 is removed by, for example, grinding, polishing, or etching.

Figure 27E:
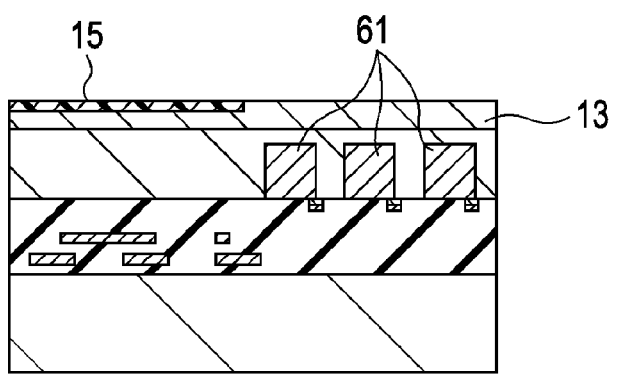

As shown in FIG. 27E, the silicon oxide layer 12 and part of the damaged layer 15 (see FIG. 27D) are removed to expose a surface of the silicon layer 13. In this case, since part of the damaged layer 15 extends to a portion of the silicon layer 13, the damaged layer 15 is partially left in a surface of the silicon layer 13. The silicon oxide layer 12 and the damaged layer 15 are removed by, for example, etching.

Figure 27F:
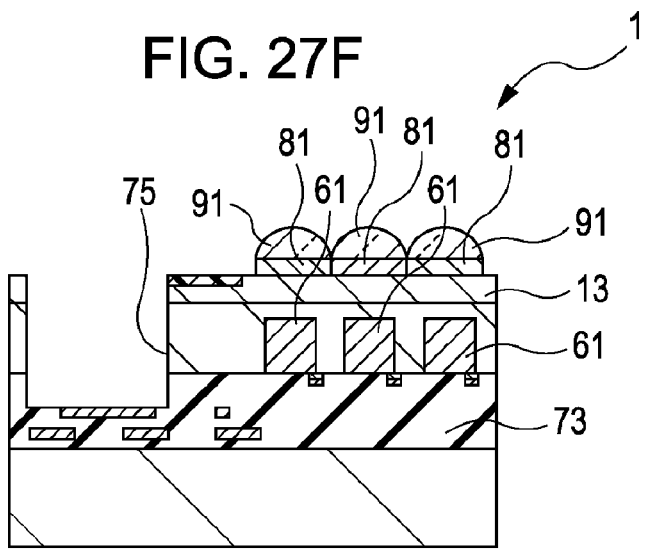

As shown in FIG. 27F, the color filter layers 81 are formed on a portion of the silicon layer 13, the portion being located in a path of light incident on the photoelectric conversion units 61. Then the condensing lenses 91 configured to guide incident light to the photoelectric conversion units 61 are formed on the color filter layers 81.

Thereby, the solid-state image pickup device 1 of a stacked whole-area-open-type CMOS image sensor is formed.

In the production method described above, the damaged layer 15 is formed in the region outside a region of the silicon oxide layer 12 on which light is incident. For example, the damaged layer 15 is formed in a portion of the silicon oxide layer 12 on an inactive region, such as a pad portion or a scribe portion.

In the second example of the method for producing a solid-state image pickup device, the formation of the damaged layer 15 of an impurity-doped region arranged in the silicon oxide layer 12 results in cleavage of bonds between oxygen (O) atoms and silicon (Si) atoms in the silicon oxide layer 12. A metal contaminant in the epitaxially grown silicon layer 16 and the silicon layer 13 passes readily through the damaged layer 15 and diffuses into the silicon substrate 11. The metal contaminant diffused in the silicon substrate 11 is trapped in the gettering layer 14, so that the photoelectric conversion units 61, the pixel transistors 63, and the peripheral circuit can be formed in the epitaxially grown silicon layer 16 free from metal contamination.

The photoelectric conversion units 61 are arranged in the epitaxially grown silicon layer 16 of the SOI substrate 10 having a high gettering ability, thus significantly reducing the occurrence of a luminous dot and dark current. This makes it possible to advantageously provide the solid-state image pickup device 1 that can afford a high-quality image.

The remaining damaged layer 15 provides a gettering effect during a step of forming the color filter layers, a step of forming the condensing lenses, a step of forming the opening 75 for connection of electrodes, a step of assembling components, and the like. For example, in the step of forming the opening 75 for connection of electrodes, processing is performed so as to expose the wirings 72 in the wiring layer 71. If the wirings 72 are formed of metal wirings, metal contamination can occur. However, the metal contamination is prevented owing to the gettering effect.

Third Example of Method for Producing Solid-State Image Pickup Device

A third example of a method for producing a solid-state image pickup device according to the fourth embodiment will be described with reference to FIGS. 28A to 29F showing cross-sectional views illustrating the steps in the method.

Figure 28A:
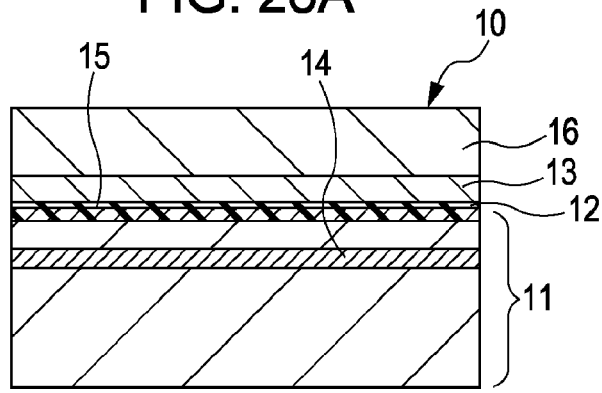
FIGS. 28A to 28C are cross-sectional views illustrating the steps in a third example of the method for producing a solid-state image pickup device according to the fourth embodiment of the present invention.
Figure 28B:
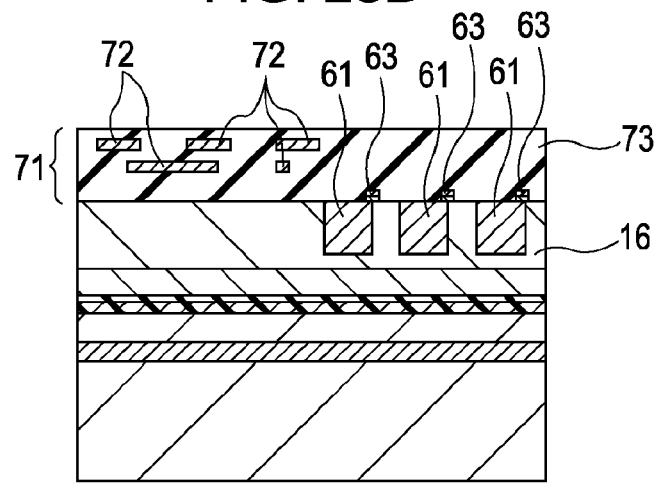

As shown in FIG. 28A, for example, the SOI substrate 10 (10C) described in FIG. 4 is used.

That is, the silicon oxide layer 12 (for example, also referred to as the "box layer") is arranged on the silicon substrate 11. As the silicon substrate 11, for example, a single-crystal silicon substrate is used. The silicon oxide layer 12 is overlaid with the silicon layer 13. The silicon layer 13 is formed by bonding the silicon oxide layer 12 to the single-crystal silicon substrate and reducing the thickness of the single-crystal silicon substrate.

The silicon substrate 11 includes the gettering layer 14.

The gettering layer 14 is formed of a region into which one element selected from carbon (C), oxygen (O), argon (Ar), silicon (Si), helium (He), phosphorus (P), arsenic (As), antimony (Sb), and boron (B) is implanted. For example, the gettering layer 14 is formed by ion-implantation of carbon into the silicon substrate 11 at a carbon dose of, for example, $5 \times 10^{13}$ cm$^{-2}$ or more and preferably $5 \times 10^{14}$ cm$^{-2}$ or more.

The damaged layer 15 that is formed of an impurity-doped region is formed through the entirety of the silicon oxide layer 12 in the in-plane direction.

The damaged layer 15 is entirely or partially formed in the silicon oxide layer 12 in the thickness direction. That is, the damaged layer 15 is formed in the silicon oxide layer 12 and does not extend to the silicon layer 13. For example, the damaged layer 15 is formed in such a manner that the silicon oxide layer 12 having a thickness of, for example, 1 μm or less is left on the side of the silicon layer 13. The damaged layer 15 may extend from the inside of the silicon oxide layer 12 to the interface between the silicon oxide layer 12 and the silicon layer 13. Details have been described above with reference to FIGS. 5A to 5F.

The damaged layer 15 is formed of a region into which one element selected from carbon (C), silicon (Si), germanium (Ge), tin (Sn), helium (He), neon (Ne), argon (Ar), krypton (Kr), xenon (Xe), boron (B), aluminum (Al), gallium (Ga), indium (In), nitrogen (N), phosphorus (P), arsenic (As), antimony (Ab), hydrogen (H), and oxygen (O) is implanted. Alternatively, the damaged layer 15 is formed of a region into which a compound, a cluster, or several tens to several thousands of molecular cluster ions of one of the elements described above are implanted. Examples of the compound of the element described above include CO, $CH_3$, SiF, and $PH_2$. Examples of the cluster include $H_2$, $Ar_2$, $P_4$, and $P_3$.

The epitaxially grown silicon layer 16 is formed by epitaxial growth on the silicon layer 13. The epitaxially grown silicon layer 16 has a thickness of, for example, 3 μm to 8 μm. A thickness of the epitaxially grown silicon layer 16 of 3 μm meets the minimum thickness for the formation of a photoelectric conversion unit of a solid-state image pickup device (e.g., image sensor). A thickness of the epitaxially grown silicon layer 16 of 8 μm meets the minimum thickness for the formation of a photoelectric conversion unit, which is sensitive to longer wavelengths (e.g., near-infrared rays or infrared rays), of a solid-state image pickup device (e.g., an image sensor).

The SOI substrate 10C has a structure as described above.

As shown in FIG. 24B, the photoelectric conversion units 61, the pixel transistors 63, and the peripheral circuit (not shown) are formed in the epitaxially grown silicon layer 16.

The wiring layer 71 is formed on the epitaxially grown silicon layer 16. The wiring layer 71 includes, for example, the wirings 72 and the interlayer insulating film 73 that covers the wirings 72.

Figure 28C:
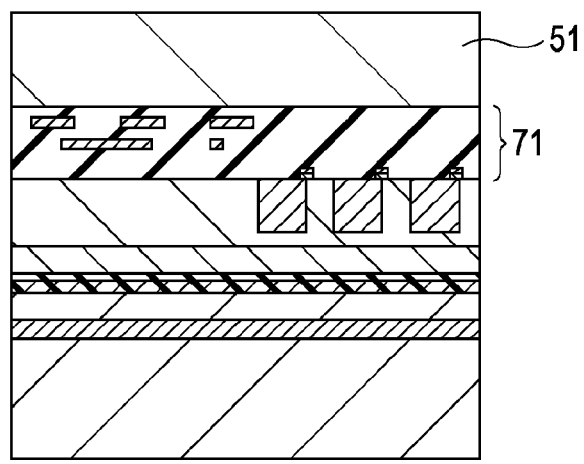

As shown in FIG. 28C, the wiring layer 71 is bonded to the support substrate 51. As the support substrate 51, a silicon substrate is used. Alternatively, a glass substrate or a resin substrate can be used. The bonding is performed with a heat-resistant resin or by plasma treatment.

Figure 29D:
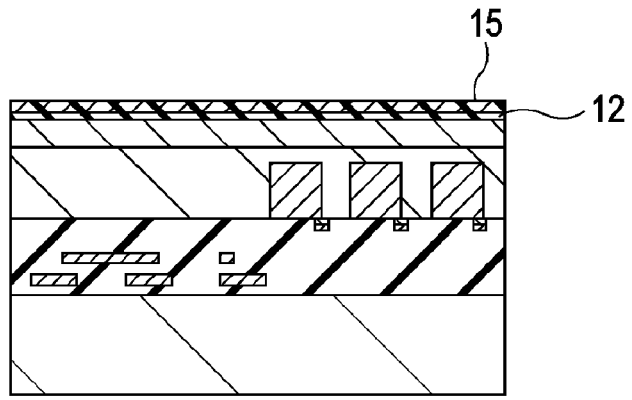
FIGS. 29D to 29F are cross-sectional views illustrating the steps in the third example of the method for producing a solid-state image pickup device according to the fourth embodiment of the present invention.

As shown in FIG. 29D, the silicon substrate 11 (see FIG. 28A) is removed to expose a surface of the silicon oxide layer 12. In the case where the damaged layer 15 extends to the interface between the silicon oxide layer 12 and the silicon substrate 11, when the surface of the silicon oxide layer 12 is exposed, a surface of the damaged layer 15 is also exposed. The silicon substrate 11 is removed by, for example, grinding, polishing, or etching.

Figure 29E:
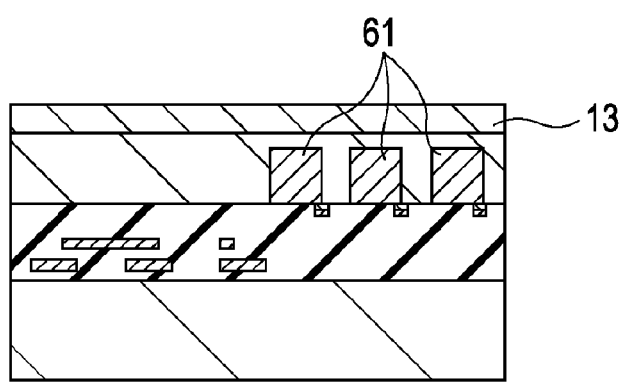

As shown in FIG. 29E, the silicon oxide layer 12 and the damaged layer 15 (see FIG. 29D) are removed to expose a surface of the silicon layer 13. The silicon oxide layer 12 and the damaged layer 15 are removed by, for example, etching.

Figure 29F:
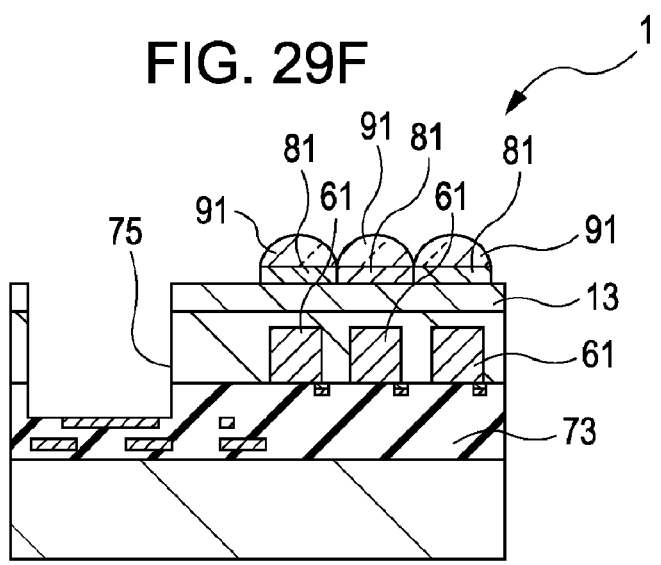

As shown in FIG. 29F, the color filter layers 81 are formed on a portion of the silicon layer 13, the portion being located in a path of light incident on the photoelectric conversion units 61. Then the condensing lenses 91 configured to guide incident light to the photoelectric conversion units 61 are formed on the color filter layers 81.

Thereby, the solid-state image pickup device 1 of a stacked whole-area-open-type CMOS image sensor is formed.

In the third example of the method for producing a solid-state image pickup device, the formation of the damaged layer 15 of an impurity-doped region arranged in the silicon oxide layer 12 results in cleavage of bonds between oxygen (O) atoms and silicon (Si) atoms in the silicon oxide layer 12. A metal contaminant entirely present in the epitaxially grown silicon layer 16 and the silicon layer 13 passes readily through the damaged layer 15 and diffuses into the silicon substrate 11. The metal contaminant diffused in the silicon substrate 11 is trapped in the gettering layer 14, so that the photoelectric conversion units 61, the pixel transistors 63, and the peripheral circuit can be formed in the epitaxially grown silicon layer 16 free from metal contamination.

The photoelectric conversion units 61 are arranged in the epitaxially grown silicon layer 16 of the SOI substrate 10 having a high gettering ability, thus significantly reducing the occurrence of a luminous dot and dark current. This makes it possible to advantageously provide the solid-state image pickup device 1 that can afford a high-quality image.

In the first, second, and third examples of the method for producing a solid-state image pickup device, the silicon oxide layer 12 is not used as a complete insulating layer but is used as a stopper film when the thickness of the silicon substrate 11 (second substrate 22) is reduced. The silicon oxide layer 12 may be bonded to the second substrate 22 at a bonding strength to the extent that they are not detached during processing. Thus, the bonding temperature may be low (e.g., about 1,000° C. for about 2 hours). A low-temperature bonding is desirable from the viewpoint of reducing metal contamination from a heat-treatment apparatus.

In the second example of the method for producing a solid-state image pickup device, part of the damaged layer 15 is left on the surface of the silicon layer 13. To leave the damaged layer 15 like this, a structure of the positional relationship between the silicon oxide layer 12 and the damaged layer 15 shown in FIG. 2B, 2D, or 2I is used.

The damaged layer 15 left in the surface of the silicon layer 13 serves as a getter sink effective against process contamination in the subsequent steps (including an assembling step).

In some device structures, a case where the damaged layer 15 is not left in the surface of the silicon layer 13 is desirable (for example, as in the third example, a case where cracking can occur by ion implantation for forming the damaged layer 15 or a case where the long-term reliability of device properties are changed). Thus, whether the damaged layer 15 is left (the first and second examples of the method for producing a solid-state image pickup device) or not (the second example of the method for producing a solid-state image pickup device) may be appropriately determined.

In the case where the silicon substrate 11 (second substrate 22) is subjected to grinding and selective etching so as to have a smaller thickness, when the damaged layer 15 is present over the entire thickness of the silicon oxide layer 12, sufficient selectivity is not obtained during selective etching, in some cases. It is thus desirable to appropriately select the positional relationship between the damaged layer 15 and the silicon oxide layer 12 from FIGS. 2A to 5F. For example, a structure satisfying the positional relationship between the silicon oxide layer 12 and the damaged layer 15 described in FIG. 2E, 2F, 2I, 5C, or 5D is used. In this case, when selective etching is performed from the side of the silicon substrate 11 (second substrate 22), sufficient selectivity should be obtained because only the interface between silicon (Si) and silicon oxide ($SiO_2$) is present.

Furthermore, after the step of removing the silicon oxide layer 12, the silicon layer 13 is removed by grinding or etching to expose the epitaxially grown silicon layer 16. Thereby, all the photoelectric conversion units 61 may be formed in the epitaxially grown silicon layer 16.

Moreover, the gettering layer 14 is not limited to those described above. For example, a carbon-doped silicon substrate, an argon-doped silicon substrate, a substrate having a structure of intrinsic gettering (IG), may be used.

5. Fifth Embodiment

Example of Structure of Image Pickup Apparatus

An exemplary image pickup apparatus according to a fifth embodiment of the present invention will be described with reference to FIG. 30 which is a block diagram. Examples of the image pickup apparatus include video cameras, digital still cameras, and cameras of mobile phones.

Figure 30:
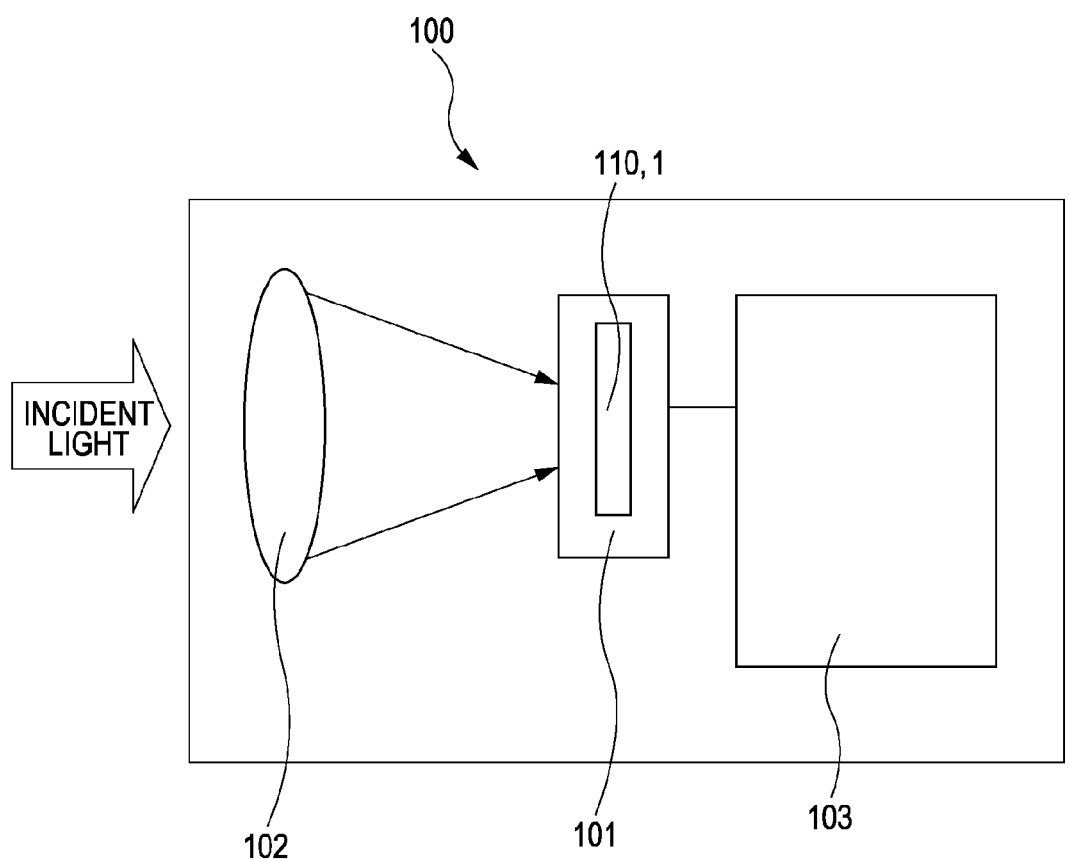
FIG. 30 is a block diagram illustrating an exemplary structure of an image pickup apparatus according to a fifth embodiment of the present invention.
Figure 31A:
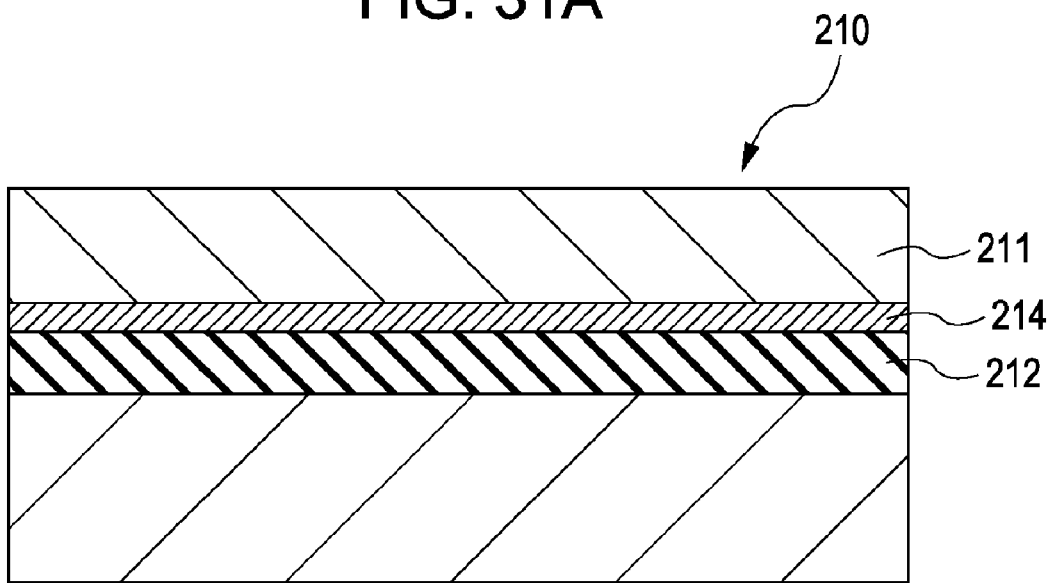
FIGS. 31A and 31B are schematic cross-sectional views showing exemplary structures in the related art.
Figure 31B:
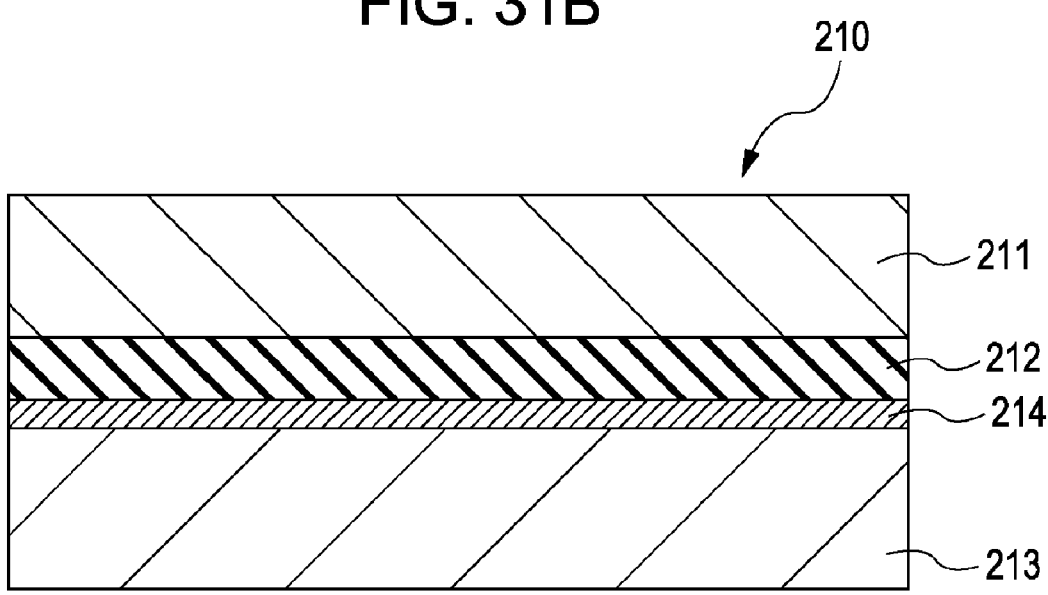

As shown in FIG. 30, an image pickup apparatus 100 includes a solid-state image pickup device 110 in an image pickup unit 101. A light collector configured to form an image is provided on an incident light side of the image pickup unit 101. A driving circuit configured to drive the image pickup unit 101 and a signal processing unit 103 including a signal processing circuit are connected to the image pickup unit 101, the signal processing circuit being configured to process a signal that has been subjected to photoelectric conversion with the solid-state image pickup device to form an image. An image signal obtained by the signal processing unit can be stored in an image storage unit (not shown). In the image pickup apparatus 100, as the solid-state image pickup device, the solid-state image pickup device 1 according to an embodiment of the present invention can be used.

In the image pickup apparatus 100, the solid-state image pickup device 1 according to an embodiment of the present invention is used. Since the solid-state image pickup device 1 capable of reducing a luminous dot is used, a high-quality image can be advantageously recorded.

The image pickup apparatus 100 is not limited to the structure described above but may have any structure as long as the image pickup apparatus includes a solid-state image pickup device.

The image pickup apparatus 100 may be in the form of a chip or a module which has the image-pickup function and in which an image pickup unit and a signal processing unit or an optical system are packaged.

The term "image pickup" includes not only image capturing in usual shooting with a camera but also fingerprint detection in a broad sense.

The present application contains subject matter related to that disclosed in Japanese Priority Patent Application JP 2008-263559 filed in the Japan Patent Office on Oct. 10, 2008 and Japanese Priority Patent Application JP 2009-062397 filed in the Japan Patent Office on Mar. 16, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A SOI substrate comprising:
    a silicon substrate;
    a silicon oxide layer arranged on the silicon substrate;
    a silicon layer arranged on the silicon oxide layer;
    a gettering layer arranged in the silicon substrate; and
    a damaged layer formed of an impurity-doped region in the silicon oxide layer so that a metal contaminant in the silicon layer can pass to the silicon substrate through the damaged layer in the silicon oxide layer.

2. The SOI substrate according to claim 1, wherein the damaged layer is arranged in at least part of the silicon oxide layer in the in-plane direction and through the entirety of the silicon oxide layer in the thickness direction.

3. A SOI substrate comprising:
    a silicon substrate;
    a silicon oxide layer arranged on the silicon substrate;
    a silicon layer arranged on the silicon oxide layer;
    a gettering layer arranged in the silicon substrate; and
    a damaged layer formed of an impurity-doped region in the silicon oxide layer,
    wherein the damaged layer is arranged through the entirety of the silicon oxide layer in the in-plane direction and in at least part of the silicon oxide layer in the thickness direction, and
    the damaged layer is arranged over the entire surface of the silicon substrate and in a portion of the silicon substrate in the thickness direction, the portion being adjacent to the silicon oxide layer.

4. The SOI substrate according to any one of claims 1 to 3, wherein the damaged layer has the gettering ability of trapping an impurity metal in the silicon layer.

5. The SOI substrate according to any one of claims 1 to 3, wherein the gettering layer is formed of a region into which one element selected from carbon, oxygen, argon, silicon, helium, phosphorus, arsenic, antimony, and boron is implanted.

6. The SOI substrate according to any one of claims 1 to 3, wherein the damaged layer is formed of a region into which one element selected from carbon, silicon, germanium, tin, helium, neon, argon, krypton, xenon, boron, aluminum, gallium, indium, nitrogen, phosphorus, arsenic, antimony, hydrogen, and oxygen, a compound including one of the elements, or a cluster including one of the elements is implanted.

7. A method for producing a SOI substrate, comprising the steps of:
    forming a silicon oxide layer on a surface of a first substrate composed of silicon;
    ion-implanting hydrogen or a rare-gas element into the first substrate to form a split layer;
    implanting an impurity into the silicon oxide layer to form a damaged layer of an impurity-doped region;
    preparing a second substrate including a gettering layer arranged inside the second substrate;
    bonding the second substrate to a surface of the silicon oxide layer adjacent to the damaged layer;
    separating the first substrate at the split layer; and
    polishing a surface of the silicon layer of a portion of the first substrate left on the second substrate.

8. A method for producing a SOI substrate, comprising the steps of:
    forming a first silicon oxide layer on a first substrate composed of silicon;
    ion-implanting hydrogen or a rare-earth element into the first substrate to form a split layer;
    forming a second silicon oxide layer on a surface of a second substrate;
    forming a gettering layer inside the second substrate;
    implanting an impurity into the second silicon oxide layer or the second silicon oxide layer and a portion of the second substrate adjacent to the second silicon oxide layer to form a damaged layer of an impurity-doped region;
    bonding a surface of the second silicon oxide layer adjacent to the damaged layer to a surface of the first silicon oxide layer;
    separating the first substrate at the split layer;
    removing the exposed first silicon oxide layer and the exposed second silicon oxide layer; and
    polishing a surface of the silicon layer of the first substrate left on the second substrate.

9. A solid-state image pickup device comprising:
    a silicon layer including a photoelectric conversion unit, a pixel transistor, and a peripheral circuit;
    a color filter layer arranged on a portion of the silicon layer located in a path of light incident on the photoelectric conversion unit;
    a condenser lens arranged on the color filter layer and configured to guide incident light to the photoelectric conversion unit;
    a wiring layer including a plurality of sublayers of wirings and an interlayer insulating film configured to cover the wirings, the wiring layer being arranged on a surface of the silicon layer opposite the surface adjacent to an incident light side;
    a support substrate arranged on the wiring layer;
    a damaged layer formed of an impurity-doped region arranged on a portion of a surface of the silicon layer located on an incident light side and outside the path of light incident on the photoelectric conversion unit; and
    an opening configured to reach the wirings in the wiring layer.

10. A method for producing a solid-state image pickup device, comprising the steps of:
    preparing a SOI substrate including
        a silicon substrate,
        a silicon oxide layer arranged on the silicon substrate,
        a silicon layer arranged on the silicon oxide layer,
        a gettering layer arranged in the silicon substrate, and
        a damaged layer formed of an impurity-doped region arranged in the silicon oxide layer,
    forming a photoelectric conversion unit, a pixel transistor, and a peripheral circuit in the silicon layer;
    forming a wiring layer on the silicon layer;
    laminating the wiring layer and a support substrate;
    removing the silicon substrate and the silicon oxide layer to expose a surface of the silicon layer;
    forming a color filter layer on a portion of the silicon layer located in a path of light incident on the photoelectric conversion unit; and forming a condenser lens on the color filter, the condenser lens being configured to guide incident light to the photoelectric conversion unit.

11. The method according to claim 10,
wherein the damaged layer formed of the impurity-doped region in the SOI substrate extends to a portion of the silicon layer adjacent to the silicon oxide layer, and
the removing step of the silicon substrate and the silicon oxide layer to expose the surface of the silicon layer is performed in such a manner that the impurity-doped region is partially left on the surface of the silicon layer.

12. An image pickup apparatus comprising:
a light collector configured to collect incident light;
an image pickup unit including a solid-state image pickup device configured to receive light collected through the light collector and photoelectrically convert the light into a signal; and
a signal processing unit configured to process the signal, wherein the solid-state image pickup device includes
a silicon layer having a photoelectric conversion unit, a pixel transistor, and a peripheral circuit,
a color filter layer arranged on a portion of the silicon layer located in a path of light incident on the photoelectric conversion unit,
a condenser lens arranged on the color filter layer and configured to guide incident light to the photoelectric conversion unit,
a wiring layer arranged on a surface of the silicon layer opposite the surface adjacent to an incident light side,
a support substrate arranged on the wiring layer,
a damaged layer formed of an impurity-doped region arranged on a portion of the surface of the silicon layer located on an incident light side and outside the path of light incident on the photoelectric conversion unit, and
an opening configured to reach the wirings in the wiring layer and be used for connection of electrodes.

* * * * *